United States Patent [19]
Ueda et al.

[11] Patent Number: 5,397,937
[45] Date of Patent: Mar. 14, 1995

[54] SEMICONDUCTOR INTEGRATED CIRCUIT

[75] Inventors: Kimio Ueda; Hiroaki Suzuki, both of Itami, Japan

[73] Assignee: Mitsubishi Denki Kabushiki Kaisha, Tokyo, Japan

[21] Appl. No.: 70,249

[22] Filed: Jun. 2, 1993

[30] Foreign Application Priority Data

Jun. 29, 1992 [JP] Japan .................. 4-170701

[51] Int. Cl.$^6$ ............................. H03K 19/02
[52] U.S. Cl. .................. 326/110; 326/84; 327/433
[58] Field of Search ............ 307/446, 570, 475

[56] References Cited

U.S. PATENT DOCUMENTS

| | | | |
|---|---|---|---|
| 5,055,716 | 10/1991 | El Gamel | 307/446 |
| 5,107,142 | 4/1992 | Bhamidipay | 307/446 |
| 5,155,387 | 10/1992 | Fletcher | 307/446 |
| 5,243,237 | 9/1993 | Khieu | 307/446 |

OTHER PUBLICATIONS

IEEE Journal of Solid-State Circuits, vol. 25, No. 3, Jun. 1990, pp. 770–777, Hotta, et al., "A 70-MHz 32-b Microprocessor with 1.0-$\mu$m BiCMOS Macrocell Library".

Primary Examiner—Edward P. Westin
Assistant Examiner—Andrew Sanders
Attorney, Agent, or Firm—Oblon, Spivak, McClelland, Maier & Neustadt

[57] ABSTRACT

There is disclosed a semiconductor integrated circuit comprising pass transistor circuits (PT3, PT4) for producing logically complementary signals. The output of the pass transistor circuit (PT3) is connected to the base electrode of an NPN bipolar transistor (BN1), and the output of the pass transistor circuit (PT4) is connected to the gate electrode of an NMOS transistor (MN9). PMOS transistors (MP15, MP16) are connected between the outputs of the pass transistor circuits (PT3, PT4) and a first potential (VDD). The gate electrodes of the PMOS transistors (MP15, MP16) are connected to the outputs of the pass transistor circuits (PT3, PT4). The bipolar transistor (BN1) having a large driving force charges and discharges a load capacity (CL1) connected to an output terminal in response to the output signal of the pass transistor circuit (PT3). This provides for a logic circuit which operates at high speeds in the semiconductor integrated circuit.

57 Claims, 31 Drawing Sheets

SEMICONDUCTOR INTEGRATED CIRCUIT

BACKGROUND OF THE INVENTION

1. Field of the Invention

The present invention relates to a semiconductor integrated circuit using BiCMOS techniques for fabricating a MOS transistor and a bipolar transistor on the same chip and, more particularly, to a semiconductor logic circuit suitable for high-speed operation.

2. Description of the Background Art

FIG. 31 shows a typical selector circuit of prior art as described in Neil H. E. Weste, Kamran Eshraghian, "Principles of CMOS VLSI Design", see page 202. In FIG. 31, MP1 to MP6 designate PMOS transistors; MN1 to MN6 designate NMOS transistors; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The transistors MP1 and MN1 form a first inverter circuit INV1, and the transistors MP2 and MN2 form a second inverter circuit INV2. The first and second inverter circuits INV1 and INV2 serve as a buffer circuit for a signal inputted to the input terminal VI1. Similarly, the transistors MP3 and MN3 form a third inverter circuit INV3, and the transistors MP4 and MN4 form a fourth inverter circuit INV4. The third and fourth inverter circuits INV3 and INV4 serve as a buffer circuit for a signal inputted to the input terminal VI2. The PMOS transistors MP5, MP6 and the NMOS transistors MN5, MN6 form a pass transistor circuit PT1.

Operations of the selector circuit of FIG. 31 will be described below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistor that has a threshold voltage of −0.5 V turns on when the voltage of the gate electrode thereof is lower than that of the source electrode thereof by 0.5 V or more. The NMOS transistor that has a threshold voltage of 0.5 V turns on when the voltage of the gate electrode thereof is higher than that of the source electrode thereof by 0.5 V or more. When a low level signal is applied to the third input terminal VI3, the NMOS transistor MN5 turns off, and the PMOS transistor MP5 turns off since a high level signal is applied to the fourth input terminal VI4 whereas the PMOS transistor MP6 and the NMOS transistor MN6 turn on. At that time, if a high level signal is applied to the input terminal VI2, the PMOS transistor MP3 turns off and the NMOS transistor MN3 turns on, so that the inverter circuit INV3 outputs a low level signal. Since the input of the inverter circuit INV4 is at the low level, the NMOS transistor MN4 turns off and the PMOS transistor MP4 turns on, so that the load capacity CL1 of the output terminal VOUT1 is charged up to the power supply voltage VDD (5.0 V) through the PMOS transistor MP6 and the NMOS transistor MN6. Thus the output terminal VOUT1 is at the high level. If a low level signal is applied to the input terminal VI2, the PMOS transistor MP3 turns on and the NMOS transistor MN3 turns off, so that the inverter circuit INV3 outputs a high level signal. Since the input of the inverter circuit INV4 is at the high level, the NMOS transistor MN4 turns on and the PMOS transistor MP4 turns off, so that the load capacity CL1 of the output terminal VOUT1 is discharged to the GND voltage (0 V) through the PMOS transistor MP6 and the NMOS transistor MN6. Thus the output terminal VOUT1 is at the low level.

When a high level signal is applied to the third input terminal VI3, the NMOS transistor MN5 turns on, and the PMOS transistor MP5 turns on since a low level signal is applied to the fourth input terminal VI4 whereas the PMOS transistor MP6 and the NMOS transistor MN6 turn off. At that time, if a high level signal is applied to the input terminal VI1, the PMOS transistor MP1 turns off and the NMOS transistor MN1 turns on, so that the inverter circuit INV1 outputs a low level signal. Since the input of the inverter circuit INV2 is at the low level, the NMOS transistor MN2 turns off and the PMOS transistor MP2 turns on, so that the load capacity CL1 of the output terminal VOUT1 is charged up to the power supply voltage VDD (5.0 V) through the PMOS transistor MP5 and the NMOS transistor MN5. Thus the output terminal VOUT1 is at the high level. If a low level signal is applied to the input terminal VI1, the PMOS transistor MP1 turns on and the NMOS transistor MN1 turns off, so that the inverter circuit INV1 outputs a high level signal. Since the input of the inverter circuit INV2 is at the high level, the NMOS transistor MN2 turns on and the PMOS transistor MP2 turns off, so that the load capacity CL1 of the output terminal VOUT1 is discharged to the GND voltage (0 V) through the PMOS transistor MP5 and the NMOS transistor MN5. Thus the output terminal VOUT1 is at the low level.

The circuit of FIG. 31 is a two-input selector circuit responsive to the signal applied to the third input terminal VI3 for selectively outputting either the signal applied to the input terminal VI1 or the signal applied to the input terminal VI2. Transistors responsive to the signal applied to the gate electrode for transmitting or cutting off the signal inputted to the source (or drain) electrode such as the PMOS transistors MP5, MP6 and the NMOS transistors MN5, MN6 are referred to as pass transistors.

In the conventional semiconductor integrated circuit having the aforesaid arrangement, the inverter circuit INV2 or INV4 charges and discharges the load capacity CL1 through the pass transistor circuit PT1 to determine the logical level of the output terminal VOUT1. The on-resistance of the inverter circuit INV2 or INV4 and the on-resistance of the pass transistors MP5, MP6, MN5, MP6 forming the pass transistor circuit PT1 are connected in series between the first power supply VDD or the second power supply GND and the output terminal VOUT1. This causes a large resistance of the charging and discharging path of the load capacity CL1 and, as a result, it takes long to determine the logical level of the output terminal VOUT1.

SUMMARY OF THE INVENTION

According to the present invention, a semiconductor integrated circuit comprises: at least one pass transistor circuit including a plurality of input terminals receiving different input signals, at least one control terminal receiving a control signal, and a plurality of insulated gate transistors each having a first electrode, a second electrode and a control electrode, the first electrodes of the plurality of insulated gate transistors being connected to the corresponding input terminals, the control electrodes of the plurality of insulated gate transistors being connected to the corresponding control terminal, the pass transistor circuit being responsive to the control signal applied to the control terminal for selectively outputting one of the input signals given from the plurality of input terminals; and at least one drive circuit including an output terminal for outputting an output signal in response to the output of the pass transistor circuit, and at least one bipolar transistor having a control electrode connected directly to all the second electrodes of the plurality of insulated gate transistors, a first electrode connected to a predetermined potential, and a second electrode connected to the output terminal.

The pass transistor circuit selectively outputs one of the plurality of input signals given from the plurality of input terminals in response to the control signal, and the control electrode of the bipolar transistor of the drive circuit directly receives the selected signal. The bipolar transistor is responsive to the inputted signal for turning on to allow current to flow from the first electrode connected to the predetermined potential through the second electrode so that the output terminal is set to the predetermined potential within a short time period.

Large driving force of the bipolar transistor enables the output terminal to enter the predetermined potential within a short time period in response to an input signal selected by the control signal from the plurality of input signals inputted to the input terminals of the pass transistor circuit. A logic circuit which operates at high speeds is achieved.

Preferably, the drive circuit further comprises an NMOS transistor having a drain electrode connected to the output terminal, a source electrode connected to a second potential lower than the predetermined potential, and a gate electrode receiving the logically inverted signal of a signal outputted from the second electrodes of the insulated gate transistors, and the bipolar transistor of the drive circuit includes an NPN bipolar transistor having a collector electrode connected to the predetermined potential, a base electrode connected directly to the second electrodes of the insulated gate transistors, and an emitter electrode connected to the output terminal.

The NMOS transistor of the drive circuit, which has the control electrode receiving the logically inverted signal of the signal outputted from the second electrodes of the insulated gate transistors, carries out the inverted on/off operation of the NPN bipolar transistor. Thus, when the NPN bipolar transistor turns on in response to the inputted signal, the NMOS transistor turns off. This allows current to flow from the first electrode of the NPN bipolar transistor connected to the predetermined potential through the second electrode so that the output terminal is set to the predetermined potential within a short time period. When the NPN bipolar transistor turns off, the NMOS transistor turns on, so that the output terminal enters the second potential.

Large driving force of the bipolar transistor enables the output terminal to enter the predetermined potential or the second potential within a short time period in response to the input signals applied to the input terminals of the pass transistor circuit. A logic circuit which operates at high speeds is achieved.

Preferably, the predetermined potential includes a first potential and a second potential lower than the first potential; the at least one bipolar transistor includes a plurality of bipolar transistors; and the plurality of bipolar transistors include at least one NPN bipolar transistor having a collector electrode connected to the first potential, a base electrode connected to the second electrodes of the plurality of insulated gate transistors, and an emitter electrode connected to the output terminal, and at least one PNP bipolar transistor having a collector electrode connected to the second potential, a base electrode connected to the second electrodes of the plurality of insulated gate transistors, and an emitter electrode connected to the output terminal.

In the drive circuit, the NPN bipolar transistor, on turning on in response to the signal outputted from the second electrodes of the insulated gate transistors of the pass transistor circuit, sets the output terminal to the first potential within a short time period. Similarly, the PNP bipolar transistor, on turning on in response to the signal outputted from the second electrodes of the insulated gate transistors of the pass transistor circuit, sets the output terminal to the second potential within a short time period.

Large driving force of the bipolar transistor enables the output terminal to enter the first or second potential within a short time period in response to the input signals applied to the input terminals of the pass transistor circuit. A logic circuit which operates at high speeds is achieved.

Preferably, the drive circuit further comprises: an inverter having an input connected to the second electrodes of the insulated gate transistors; and another bipolar transistor of the same conductivity type as the bipolar transistor having a control electrode connected to an output of the inverter, a first electrode connected to the output terminal, and a second electrode connected to a second potential different from the predetermined potential.

In the drive circuit, the bipolar transistor, on turning on in response to the signal outputted from the second electrodes of the insulated gate transistors of the pass transistor circuit, sets the output terminal to the predetermined potential within a short time period. Similarly, another bipolar transistor, on turning on in response to the signal outputted from the second electrodes of the insulated gate transistors of the pass transistor circuit, sets the output terminal to the second potential within a short time period.

Large driving force of the bipolar transistors enables the output terminal to enter the predetermined potential or the second potential within a short time period in response to the input signals applied to the input terminals of the pass transistor circuit. A logic circuit which operates at high speeds is achieved.

Preferably, the semiconductor integrated circuit further comprises a second drive circuit including a second output terminal, and a bipolar transistor having a control electrode receiving a signal logically different from the output signal of the pass transistor circuit, a first electrode connected to the predetermined potential, and a second electrode connected to the second output terminal, the second drive circuit being responsive to the inputted signal for outputting an output signal logically different from the output signal of the drive circuit.

The second drive circuit receives the signal at a level logically different from that of the output signal of the pass transistor circuit, e.g., a low level signal if the output of the pass transistor circuit is at the high level in the binary logic and vice versa, to output the output signal at a level logically different from that of the drive circuit in response to the logical level of the inputted signal.

Large driving force of the bipolar transistor enables the plurality of output terminals of the plurality of drive circuits to enter the predetermined potential within a short time period in response to the input signals applied to the input terminals of the pass transistor circuit. A logic circuit which operates at high speeds is achieved.

Preferably, the drive circuit further comprises: a second insulated gate transistor having a first electrode connected to the predetermined potential and a second electrode connected to the control electrode of the bipolar transistor, the second insulated gate transistor turning on as the bipolar transistor turns on to set the control electrode of the bipolar transistor to the predetermined potential.

The bipolar transistor of the drive circuit turns on in response to the signal outputted from the second electrodes of the insulated gate transistors of the pass transistor circuit to set the output terminal to the predetermined potential. In some cases, the predetermined potential is not achieved due to the influence of the insulated gate transistors of the pass transistor circuit. The insulated gate transistor of the drive circuit eliminates the influence, so that the output terminal is set to the predetermined potential.

The semiconductor integrated circuit of the present invention prevents the influence of the threshold voltage generated by the insulated gate transistors of the pass transistor circuit. Large driving force of the bipolar transistor enables the output terminal to enter the predetermined potential within a short time period in response to the input signals applied to the input terminals of the pass transistor circuit. A logic circuit which operates at high speeds is achieved.

Preferably, the drive circuit further comprises: a second insulated gate transistor having a first electrode connected to a second potential different from the predetermined potential and a second electrode connected to the control electrode of the bipolar transistor, the second insulated gate transistor turning on as the bipolar transistor turns off to set the control electrode of the bipolar transistor to the second potential.

In the drive circuit, as the bipolar transistor turns off in response to the signal outputted from the second electrodes of the insulated gate transistors of the pass transistor circuit, the output terminal may be set to the second potential different from the predetermined potential. In some cases, the second potential is not achieved due to the influence of the insulated gate transistors of the pass transistor circuit. The insulated gate transistor of the drive circuit eliminates the influence, so that the output terminal is set to the second potential.

The semiconductor integrated circuit of the present invention prevents the influence of the threshold voltage generated by the insulated gate transistors of the pass transistor circuit. Large driving force of the bipolar transistor enables the output terminal to enter the predetermined potential within a short time period in response to the input signals applied to the input terminals of the pass transistor circuit. A logic circuit which operates at high speeds is achieved.

Preferably, the drive circuit further comprises: a second insulated gate transistor having a first electrode connected to the control electrode of the bipolar transistor, a control electrode connected to the predetermined potential, and a second electrode connected to the second electrode of the bipolar transistor.

The insulated gate transistor of the drive circuit turns on when the bipolar transistor turns on. The control and second electrodes of the bipolar transistor may be set to the same potential. This enables the potential at the output terminal to approximate to the predetermined potential.

The semiconductor integrated circuit of the present invention eliminates the influence of the base-emitter voltage of the bipolar transistor. Large driving force of the bipolar transistor enables the output terminal to enter the predetermined potential within a short time period in response to the input signals applied to the input terminals of the pass transistor circuit. A logic circuit which operates at high speeds is achieved.

Preferably, the drive circuit further comprises: voltage drop means having a first end connected to the control electrode of the bipolar transistor and a second end connected to the second electrode of the bipolar transistor.

The voltage drop means of the drive circuit enables the control and second electrodes of the bipolar transistor to enter the same potential when the bipolar transistor turns on. The influence of the base-emitter voltage of the bipolar transistor is alleviated, and the potential at the output terminal is enabled to approximate to the predetermined potential.

The semiconductor integrated circuit of the present invention eliminates the influence of the base-emitter voltage of the bipolar transistor. Large driving force of the bipolar transistor enables the output terminal to enter the predetermined potential within a short time period in response to the input signals applied to the input terminals of the pass transistor circuit. A logic circuit which operates at high speeds is achieved.

An object of the present invention is to provide a logic circuit which is capable of high-speed charging and discharging a load capacity connected to an output terminal to operate at high speeds in a semiconductor integrated circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
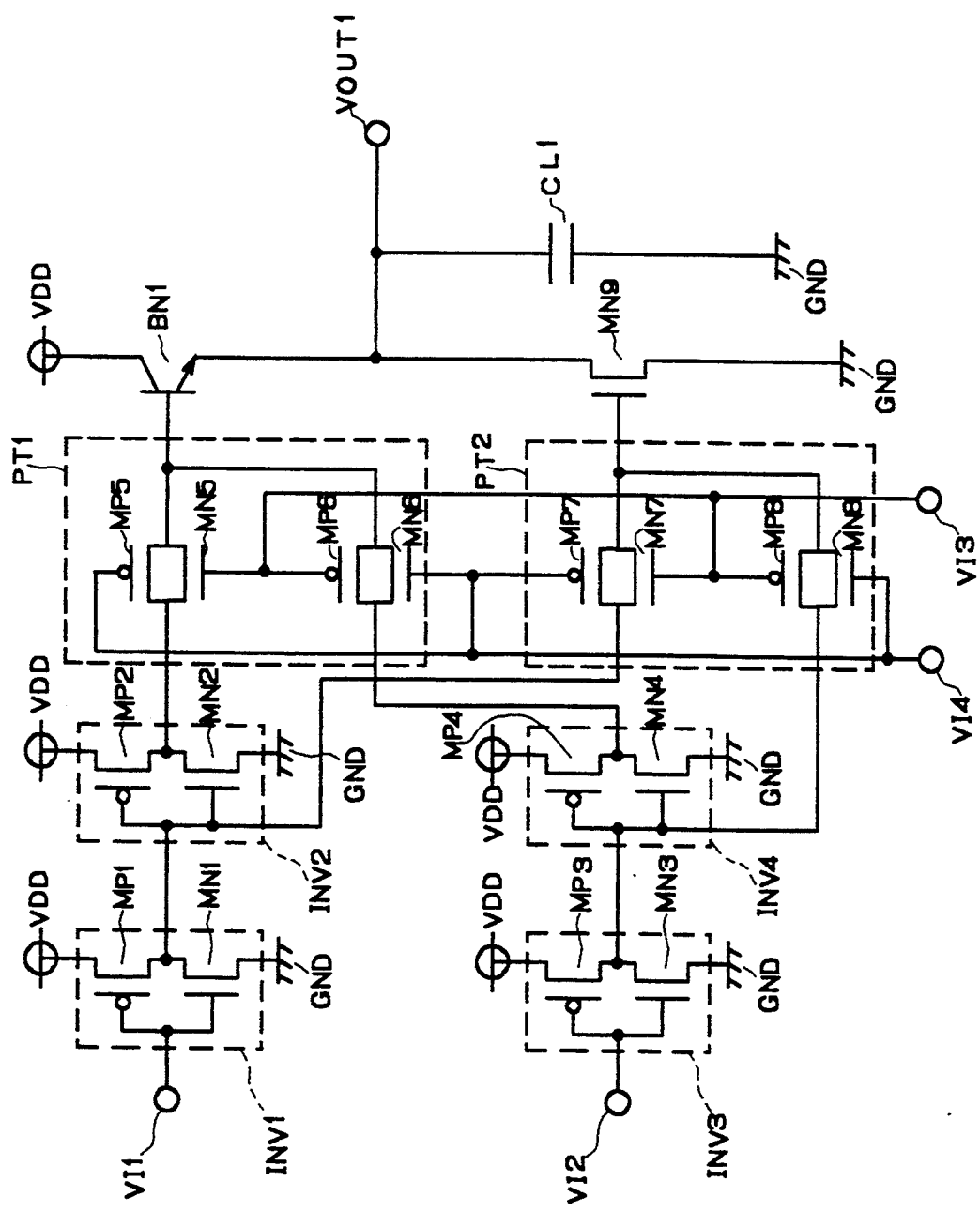
FIG. 1 is a circuit diagram of a two-input selector circuit according to a first preferred embodiment of the present invention.

Referring to FIG. 1, a semiconductor integrated circuit according to a first preferred embodiment of the present invention will be described hereinafter. FIG. 1 is a circuit diagram of a two-input selector circuit of the first preferred embodiment according to the present invention. In FIG. 1, MP1 to MP8 designate PMOS transistors; MN1 to MN9 designate NMOS transistors; BN1 designates a first NPN bipolar transistor; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The PMOS transistors MP5, MP6 and the NMOS transistors MN5, MN6 form a pass transistor circuit PT1, and the PMOS transistors MP7, MP8 and the NMOS transistors MN7, MN8 form a pass transistor circuit PT2. The NPN bipolar transistor BN1 and the NMOS transistor MN9 form a drive circuit. The drain or source of the NMOS transistors MN5, MN6 and the PMOS transistors MP5, MP6 of the pass transistor circuit PT1 is connected to the base electrode of the NPN bipolar transistor BN1 of the drive circuit.

Operations of the two-input selector circuit of FIG. 1 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 to MP8 that have a threshold voltage of −0.5 V turn on when the voltage of the gate electrode thereof is lower than that of the source electrode thereof by 0.5 V or more. The NMOS transistors MN1 to MN9 that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more.

When a low level signal is applied to the third input terminal VI3, the NMOS transistors MN5 and MN7 turn off, and the PMOS transistors MP5 and MP7 turn off since a high level signal is applied to the fourth input terminal VI4 whereas the PMOS transistors MP6, MP8 and the NMOS transistors MN6, MN8 turn on.

At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 enters the low level through the PMOS transistor MP8 and the NMOS transistor MN8. Since the input of the inverter circuit INV4 is at the low level, the NMOS transistor MN4 turns off and the PMOS transistor MP4 turns on, so that the base electrode of the NPN bipolar transistor BN1 enters the high level through the PMOS transistor MP6 and the NMOS transistor MN6. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 4.2 V that is lower than the power supply voltage VDD (5.0 V) by the amount of the base-emitter voltage (0.8 V or less) of the bipolar transistor. Thus the output terminal VOUT1 is at the high level.

If a low level signal is applied to the input terminal VI2, the PMOS transistor MP3 turns on and the NMOS transistor MN3 turns off, so that the inverter circuit INV3 outputs a high level signal. Then, the gate electrode of the NMOS transistor MN9 enters the high level through the PMOS transistor MP8 and the NMOS transistor MN8. Since the input of the inverter circuit INV4 is at the high level, the PMOS transistor MP4 turns off and the NMOS transistor MN4 turns on, so that the base electrode of the NPN bipolar transistor BN1 enters the low level through the PMOS transistor MP6 and the NMOS transistor MN6. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

When a high level signal is applied to the third input terminal VI3, the PMOS transistors MP6, MP8 turn off, and the NMOS transistors MN6, MN8 turn off since a low level signal is applied to the fourth input terminal VI4 whereas the NMOS transistors MN5, MN7 and the PMOS transistors MP5, MP7 turn on.

At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the PMOS transistor MP7 and the NMOS transistor MN7. Since the input of the inverter circuit INV2 is at the low level, the NMOS transistor MN2 turns off and the PMOS transistor MP2 turns on, so that the base electrode of the NPN bipolar transistor BN1 enters the high level through the PMOS transistor MP5 and the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 4.2 V that is lower than the power supply voltage VDD (5.0 V) by the amount of the base-emitter voltage (0.8 V or less) of the bipolar transistor. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 enters the high level through the PMOS transistor MP7 and the NMOS transistor MN7. Since the input of the inverter circuit INV2 is at the high level, the PMOS transistor MP2 turns off and the NMOS transistor MN2 turns on, so that the base electrode of the NPN bipolar transistor BN1 enters the low level through the PMOS transistor MP5 and the NMOS transistor MN5. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 1 is a two-input selector circuit responsive to the control signal applied to the third input terminal VI3 for selectively outputting either the signal applied to the input terminal VI1 or the signal applied to the input terminal VI2. The circuit of FIG. 1 is adapted such that the base electrode of the NPN bipolar transistor BN1 and the gate electrode of the NMOS transistor MN9, i.e., the output of the pass transistor circuit PT1 and the output of the pass transistor circuit PT2, output complementary signals constantly. It is only the NPN bipolar transistor BN1 and the NMOS transistor MN9 that are driven by the inverter circuits INV1 to INV4 through the pass transistor circuit PT1 or PT2 to charge and discharge the load capacity CL1 of the output terminal VOUT1.

Figure 2:
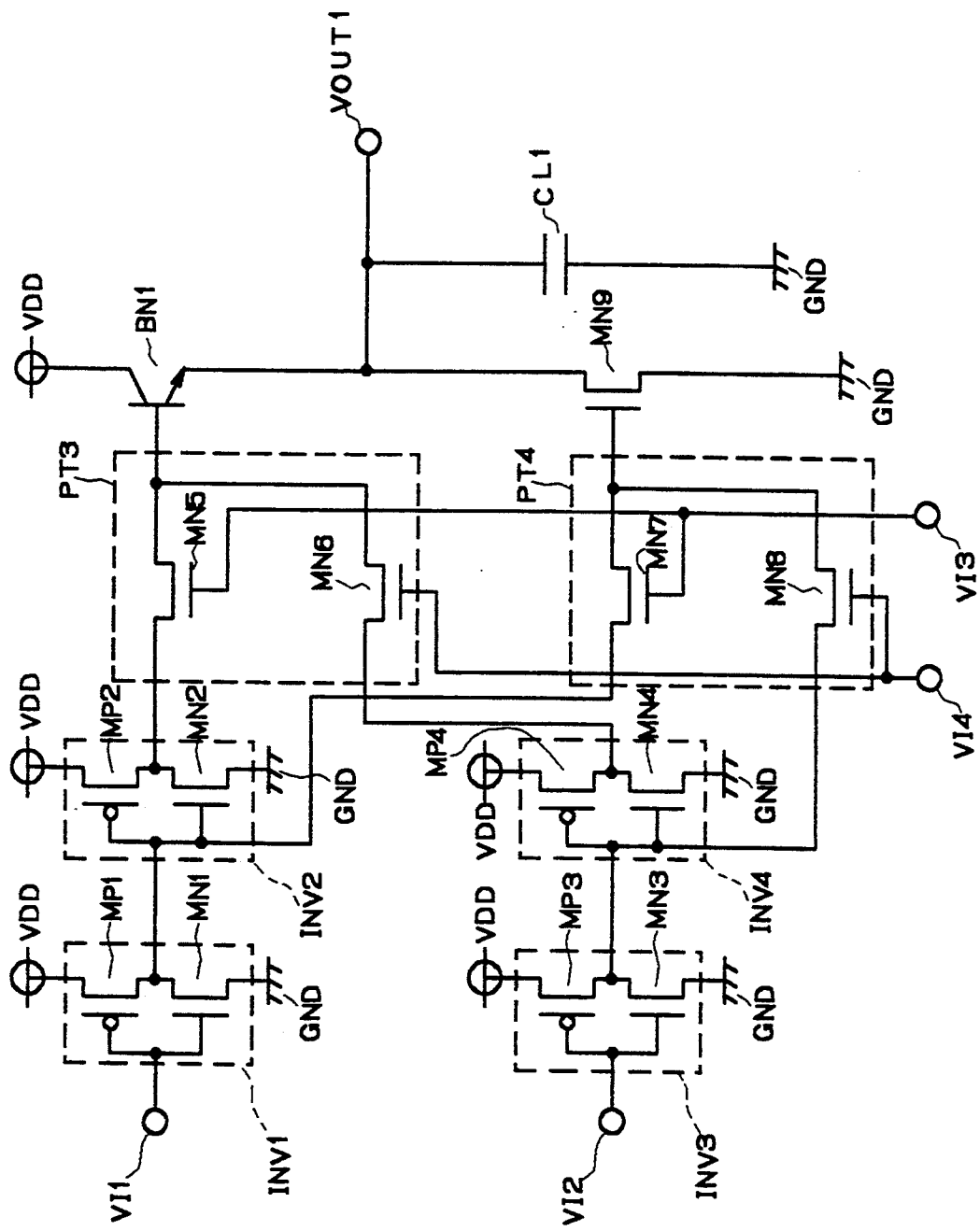
FIG. 2 is a circuit diagram of the two-input selector circuit according to a second preferred embodiment of the present invention.

Referring to FIG. 2, the semiconductor integrated circuit according to a second preferred embodiment of the present invention will be described hereinafter. FIG. 2 is a circuit diagram of the two-input selector circuit of the second preferred embodiment according to the present invention. In FIG. 2, MP1 to MP4 designate PMOS transistors; MN1 to MN9 designate NMOS transistors; BN1 designates a first NPN bipolar transistor; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The NMOS transistors MN5 and MN6 form a pass transistor circuit PT3, and the NMOS transistors MN7 and MN8 form a pass transistor circuit PT4. The NPN bipolar transistor BN1 and the NMOS transistor MN9 form a drive circuit. The drain or source of the NMOS transistors MN5, MN6 of the pass transistor circuit PT3 is connected to the base electrode of the NPN bipolar transistor BN1 of the drive circuit.

Operations of the two-input selector circuit of FIG. 2 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 to MP4 that have a threshold voltage of −0.5 V turn on when the voltage of the gate electrode thereof is lower than that of the source electrode thereof by 0.5 V or more. The NMOS transistors MN1 to MN9 that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 enters the low level through the NMOS transistor MN8. Since the input of the inverter circuit INV4 is at the low level, the PMOS transistor MP4 turns on and the NMOS transistor MN4 turns off, so that the base electrode of the NPN bipolar transistor BN1 has a voltage of 4.5 V that is lower than the power supply voltage VDD (5.0 V) by the amount of the threshold voltage (0.5 V) of the NMOS transistor MN6 or enters the high level through the NMOS transistor MN6. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. If a low level signal is applied to the input terminal VI2, the PMOS transistor MP3 turns on and the NMOS transistor MN3 turns off, so that the inverter circuit INV3 outputs a high level signal. Then, the gate electrode of the NMOS transistor MN9 has a voltage of 4.5 V that is lower than the power supply voltage VDD (5.0 V) by the amount of the threshold voltage (0.5 V) of the NMOS transistor MN8 or enters the high level through the NMOS transistor MN8. Since the input of the inverter circuit INV4 is at, the high level, the PMOS transistor MP4 turns off and the NMOS transistor MN4 turns on, so that the base electrode of the NPN bipolar transistor BN1 enters the low level through the NMOS transistor MN6. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

When a high level signal is applied to the third input terminal VI3, the NMOS transistors MN5, MN7 turn on, and the NMOS transistors MN6, MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 has a voltage of 4.5 V that is lower than the power supply voltage VDD (5.0 V) by the amount of the threshold voltage of the NMOS transistor MN5 or enters the high level through the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 has a voltage of 4.5 V that is lower than the power supply voltage VDD (5.0 V) by the amount of the threshold voltage (0.5 V) of the NMOS transistor MN7 or enters the high level through the NMOS transistor MN7. Since the input of the inverter circuit INV2 is at the high level, the PMOS transistor MP2 turns off and the NMOS transistor MN2 turns on, so that the base electrode of the NPN bipolar transistor BN1 enters the low level through the NMOS transistor MN5. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 2 is a two-input selector circuit responsive to the signal applied to the third input terminal VI3 for selectively outputting either the signal applied to the input terminal VI1 or the signal applied to the input terminal VI2. The logic circuit of the second preferred embodiment is achieved by forming the pass transistor circuits with only the NMOS transistors in the logic circuit of the first preferred embodiment. The circuit of FIG. 2 is adapted such that the base electrode of the NPN bipolar transistor BN1 and the gate electrode of the NMOS transistor MN9, i.e., the output of the pass transistor circuit PT3 and the output of the pass transistor circuit PT4, output complementary signals constantly in the same fashion as in the first preferred embodiment. It is only the NPN bipolar transistor BN1 and the NMOS transistor MN9 that are driven by the inverter circuits INV1 to INV4 through the pass transistor circuit PT3 or PT4 to charge and discharge the load capacity CL1 of the output terminal VOUT1. It should be noted that the pass transistor circuits PT3 and PT4 include only the NMOS transistors MN5 to MN8, unlike the pass transistor circuits PT1 and PT2. Thus the high level signal having a voltage of 4.5 V that is lower than the power supply voltage VDD by the amount of the threshold voltage of the NMOS transistors MN5 to MN8 is applied to the base electrode of the NPN bipolar transistor BN1 and to the gate electrode of the NMOS transistor MN9. Since the base voltage starts decreasing from 4.5 V in turn-off operation of the NPN bipolar transistor BN1, the turn-off time of the NPN bipolar transistor BN1 is shortened as compared with the first preferred embodiment, whereby the two-input selector circuit is permitted to operate at higher speeds.

Figure 3:
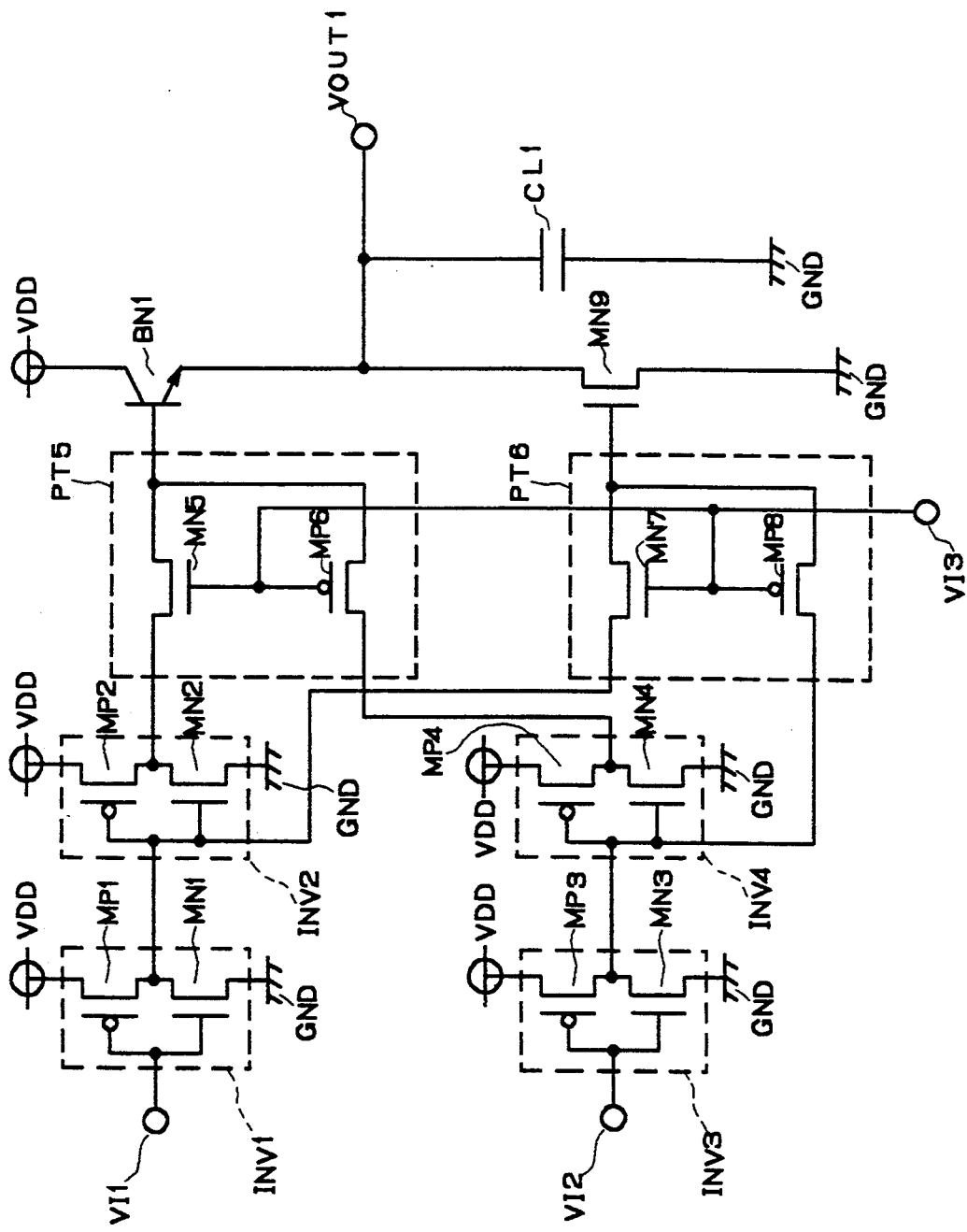
FIG. 3 is a circuit diagram of the two-input selector circuit according to a third preferred embodiment of the present invention.

Referring to FIG. 3, the semiconductor integrated circuit according to a third preferred embodiment of the present invention will be described hereinafter. FIG. 3 is a circuit diagram of the two-input selector circuit of the third preferred embodiment according to the present invention. In FIG. 3, MP1 to MP8 designate PMOS transistors; MN1 to MN9 designate NMOS transistors; BN1 designates a first NPN bipolar transistor; VI1 designates a first input terminal; VI2 designates a second input terminal; VI3 designates a third input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The PMOS transistor MP6 and the NMOS transistor MN5 form a pass transistor circuit PT5, and the PMOS transistor MP8 and the NMOS transistor MN7 form a pass transistor circuit PT6. The NPN bipolar transistor BN1 and the NMOS transistor MN9 form a drive circuit. The drain or source of the NMOS transistor MN5 and the PMOS transistor MP6 of the pass transistor circuit PT5 is connected to the base electrode of the NPN bipolar transistor BN1 of the drive circuit.

Operations of the two-input selector circuit of FIG. 3 will be discussed below. A high level signal provides a voltage of 5.0 V, and a low level signal provides a voltage of 0 V. A threshold between the high and low logical levels is 2.5 V. The PMOS transistors MP1 to MP4, MP6, MP8 that have a threshold voltage of −0.5 V turn on when the voltage of the gate electrode thereof is lower than that of the source electrode thereof by 0.5 V or more. The NMOS transistors MN1 to MN4, MN5, MN7 that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more.

When a low level signal is applied to the third input terminal VI3, the NMOS transistors MN5 and MN7 turn off and the PMOS transistors MP6 and MP8 turn on. At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 has a voltage of 0.5 V that is higher than the voltage of 0 V by the amount of the threshold voltage (0.5 V) of the PMOS transistor MP8 through the PMOS transistor MP8. Since the input of the inverter circuit INV4 is at the low level, the PMOS transistor MP4 turns on and the NMOS transistor MN4 turns off, so that the base electrode of the NPN bipolar transistor BN1 enters the high level through the PMOS transistor MP6. The NMOS transistor MN9 whose gate electrode has a voltage of 0.5 V turns off, and the NPN bipolar transistor BN1 whose base electrode is at the high level turns on. The load capacity CL1 of the output terminal VOUT1 is charged at high speeds up to 4.2 V that is lower than the potential at the base electrode by the amount of the base-emitter voltage (0.8 V or less) thereof. Thus the output terminal VOUT1 is at the high level.

If a low level signal is applied to the input terminal VI2, the PMOS transistor MP3 turns on and the NMOS transistor MN3 turns off, so that the inverter circuit IV3 outputs a high lev cl signal. Then, the gate electrode of the NMOS transistor MN9 enters the high level through the NMOS transistor MN8. Since the input of the inverter circuit INV4 is at the high level, the PMOS transistor MP4 turns off and the NMOS transistor MN4 turns on, so that the base electrode of the NPN bipolar transistor BN1 has a voltage of 0.5 V through the NMOS transistor MN6. The NMOS transistor MN9 whose gate electrode is at the high level turns on, and the NPN bipolar transistor BN1 whose base electrode has the 0.5 voltage turns off. The load capacity CL1 of the output terminal VOUT1 is discharged to 0 V at high speeds. Thus the output terminal VOUT1 is at the low level.

When a high level signal is applied to the third input terminal VI3, the NMOS transistors MN5 and MN7 turn on and the PMOS transistors MP6 and MP8 turn off. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 has a voltage of 4.5 V that is lower than the power supply voltage VDD (5.0 V) by the amount of the threshold voltage (0.5 V) of the NMOS transistor MN5 or enters the high level through the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 has a voltage of 4.5 V that is lower than the power supply voltage (5.0 V) by the amount of the threshold voltage (0.5 V) of the NMOS transistor MN8 or enters the high level through the NMOS transistor MN7. Since the input of the inverter circuit INV2 is at the high level, the PMOS transistor MP2 turns off and the NMOS transistor MN2 turns on, so that the base electrode of the NPN bipolar transistor BN1 enters the low level through the NMOS transistor MN5. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 3 is a two-input selector circuit responsive to the signal applied to the third input terminal VI3 for selectively outputting either the signal applied to the input terminal VI1 or the signal applied to the input terminal VI2. The logic circuit of the third preferred embodiment is achieved by forming the pass transistor circuits with NMOS and PMOS transistors in the logic circuit of the first preferred embodiment. The circuit of FIG. 3 is adapted such that the base electrode of the NPN bipolar transistor BN1 and the gate electrode of the NMOS transistor MN9, i.e., the output of the pass transistor circuit PT5 and the output of the pass transistor circuit PT6, output complementary signals constantly in the same fashion as in the first preferred embodiment. It is only the NPN bipolar transistor BN1 and the NMOS transistor MN9 that are driven by the inverter circuits INV2 to INV4 through the pass transistor circuit PT5 or PT6 to charge and discharge the load capacity CL1 of the output terminal VOUT1.

Figure 4:
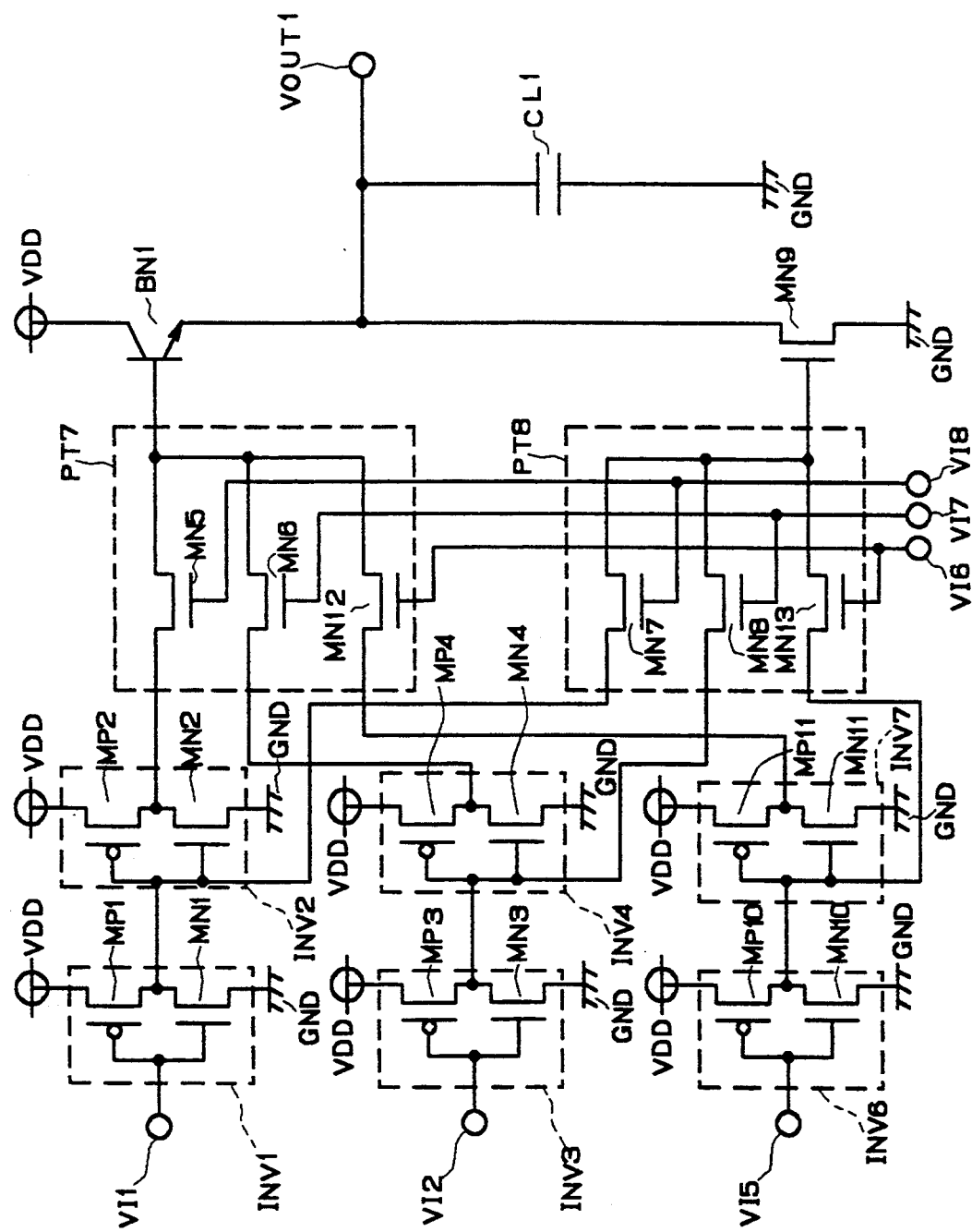
FIG. 4 is a circuit diagram of a three-input selector circuit according to a fourth preferred embodiment of the present invention.

Referring to FIG. 4, the semiconductor integrated circuit according to a fourth preferred embodiment of the present invention will be described hereinafter. FIG. 4 is a circuit diagram of a three-input selector circuit of the fourth preferred embodiment according to the present invention. FIG. 4 shows an example of the expansive application of the two-input selector circuit of the second preferred embodiment to three inputs. The three-input selector circuit is achieved such that the high level signal is applied only to an input terminal VI8 for selection of the signal applied to an input terminal VI1, to an input terminal VI7 for selection of the signal applied to an input terminal VI2, and to an input terminal VI6 for selection of the signal applied to an input terminal VI5. In FIG. 4, MP1 to MP4, MP10, MP11 designate PMOS transistors; MN1 to MN13 designate NMOS transistors; BN1 designates a first NPN bipolar transistor; VI1 designates a first input terminal; VI2 designates a second input terminal; VI5 designates a third input terminal; VI6 designates a fourth input terminal; VI7 designates a fifth input terminal; VI8 designates a sixth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. Similarly, the PMOS transistor MP10 and the NMOS transistor MN10 form a fifth inverter circuit INV6, and the PMOS transistor MP11 and the NMOS transistor MN11 form a sixth inverter circuit INV7. The fifth and sixth inverter circuits INV6 and INV7 serve as a buffer circuit for a signal inputted to the input terminal VI5. The NMOS transistors MN5, MN6, MN12 form a pass transistor circuit PT7, and the NMOS transistors MN7, MN8, MN13 form a pass transistor circuit PT8. The drain or source of the NMOS transistors MN5, MN6, MN12 of the pass transistor circuit PT7 is connected to the base electrode of the NPN bipolar transistor BN1 of the drive circuit.

Figure 5:
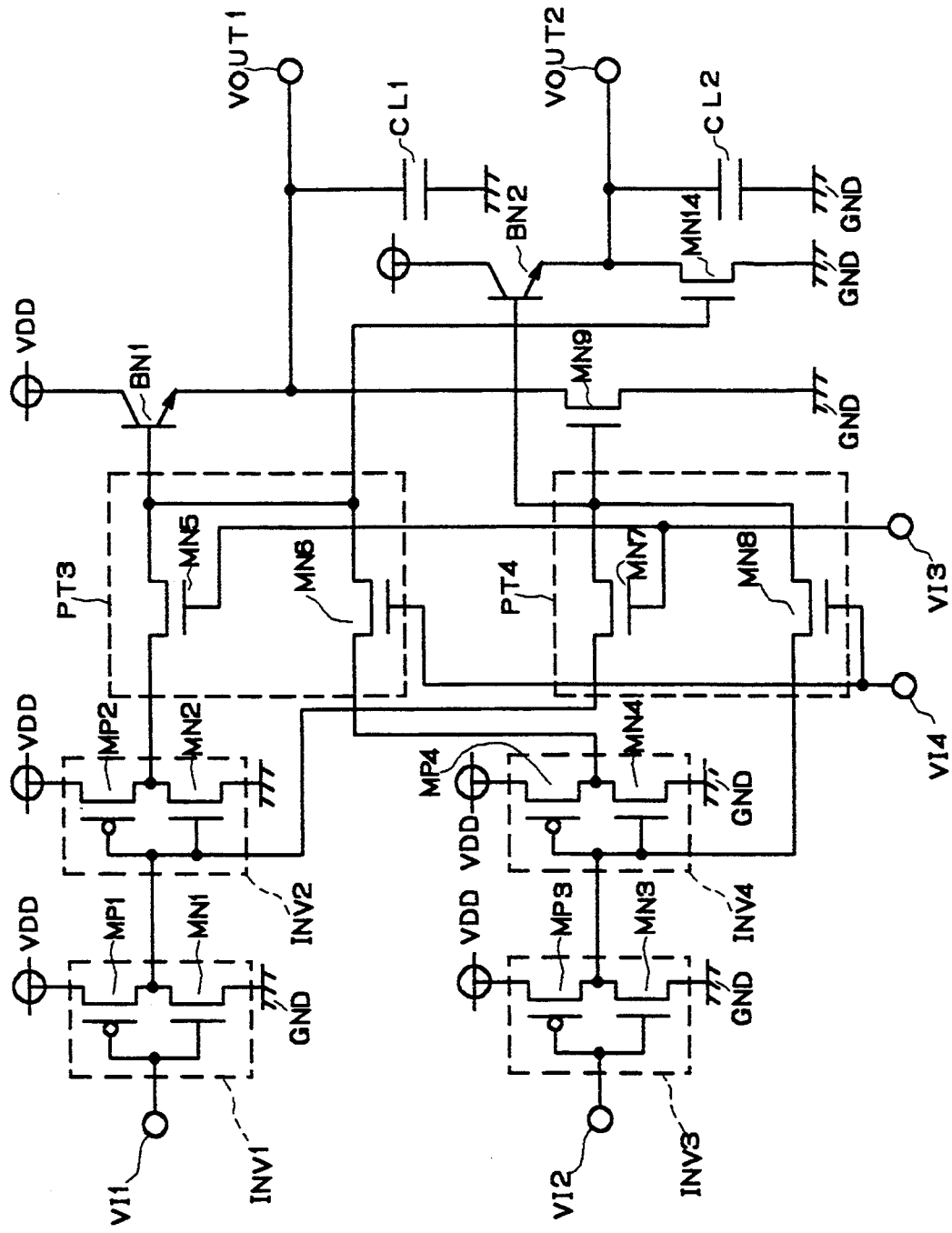
FIG. 5 is a circuit diagram of the two-input selector circuit according to a fifth p,referred embodiment of the present invention.

Referring to FIG. 5, the semiconductor integrated circuit according to a fifth preferred embodiment of the present invention will be described hereinafter. FIG. 5 is a circuit diagram of the two-input selector circuit of the fifth preferred embodiment according to the present invention. In FIG. 5, MP1 to MP4 designate PMOS transistors; MN1 to MN9, MN14 designate NMOS transistors; BN1 designates a first NPN bipolar transistor; BN2 designates a second NPN bipolar transistor; VI1 designates a first input terminal; VI2 designates a second input terminal; VI3 designates a third input terminal; VI4 designates a fourth input terminal; VOUT1 designates a first output terminal; VOUT2 designates a second-output terminal; VDD designates a first power supply of 5.0 V; GND designates a second power supply of 0 V; CL1 designates a first load capacity; and CL2 designates a second load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The NMOS transistors MN5 and MN6 form a pass transistor circuit PT3, and the NMOS transistors MN7 and MN8 form a pass transistor circuit PT4. The NPN bipolar transistor BN1 and the NMOS transistor MN9 form a first drive circuit, and the NPN bipolar transistor BN2 and the NMOS transistor MN14 form a second drive circuit. The drain or source electrode of the NMOS transistors MN5, MN6 of the pass transistor circuit PT3 is connected to the base electrode of the NPN bipolar transistor BN1 of the first drive circuit. The drain or source electrode of the NMOS transistors MN7, MN8 of the pass transistor circuit PT4 is connected to the base electrode of the NPN bipolar transistor BN2 of the second drive circuit.

Operations of the two-input selector circuit of FIG. 5 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 to MP4 that have a threshold voltage of −0.5 V turn on when the voltage of the gate electrode thereof is lower than that of the source electrode thereof by 0.5 V or more. The NMOS transistors MN1 to MN9, MN14 that have a threshold voltage of 0.5 V turn on when the voltage of the gate electrode thereof is higher than that of the source electrode thereof by 0.5 V or more. The NPN bipolar transistors BN1 and BN2 turn on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 and the base electrode of the NPN bipolar transistor BN2 enter the low level through the NMOS transistor MN8. Since the input of the inverter circuit INV4 is at the low level, the PMOS transistor MP4 turns on and the NMOS transistor MN4 turns off, so that the base electrode of the NPN bipolar transistor BN1 and the gate electrode of the NMOS transistor MN14 have a voltage of 4.5 V that is lower than the power supply voltage VDD (5.0 V) by the amount of the threshold voltage (0.5 V) of the NMOS transistor MN6 or enter the high level through the NMOS transistor MN6. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. The NMOS transistor MN14 whose gate electrode is at the high level turns on, and the NPN bipolar transistor BN2 whose base electrode is at the low level turns off. The load capacity CL2 of the output terminal VOUT2 is discharged to 0 V at high speeds. Thus the output terminal VOUT2 is at the low level.

If a low level signal is applied to the input terminal VI2, the PMOS transistor MP3 turns on and the NMOS transistor MN3 turns off, so that the inverter circuit INV3 outputs a high level signal. Then, the gate electrode of the NMOS transistor MN9 and the base electrode of the NPN bipolar transistor BN2 have a voltage of 4.5 V that is lower than the power supply voltage (5.0 V) by the amount of the threshold voltage (0.5 V) of the NMOS transistor MN8 or enter the high level through the NMOS transistor MN8. Since the input of the inverter, circuit INV4 is at the high level, the PMOS transistor MP4 turns off and the NMOS transistor MN4 turns on, so that the base electrode of the NPN bipolar transistor BN1 and the gate electrode of the NMOS transistor MN14 enter the low level through the NMOS transistor MN6. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level. The NMOS transistor MN14 whose gate electrode is at the low level turns off, and the NPN bipolar transistor BN2 whose base electrode is at the high level turns on. The load capacity CL2 of the output terminal VOUT2 is charged at high speeds up to 3.7 V that is lower than the potential at the base electrode of the bipolar transistor BN2 by the amount of the base-emitter voltage (0.8 V or less) thereof. Thus the output terminal VOUT2 is at the high level.

When a high level signal is applied to the third input terminal VI3, the NMOS transistors MN5 and MN7 turn on, and the NMOS transistors MN6 and MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 and the base electrode of the NPN bipolar transistor BN2 enter the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 and the gate electrode of the NMOS transistor MN14 have a voltage of 4.5 V that is lower than the power supply voltage VDD (5.0 V) by the amount of the threshold voltage (0.5 V) of the NMOS transistor MN5 or enter the high level through the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. The NMOS transistor MN14 whose gate electrode is at the high level turns on, and the NPN bipolar transistor BN2 whose base electrode is at the low level turns off. The load capacity CL2 of the output terminal VOUT2 is discharged to 0 V at high speeds. Thus the output terminal VOUT2 is at the low level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 and the base electrode of the NPN bipolar transistor BN2 have a voltage of 4.5 V that is lower than the power supply voltage (5.0 V) by the amount of the threshold voltage (0.5 V) of the NMOS transistor MN7 or enter the high level through the NMOS transistor MN7. Since the input of the inverter circuit INV2 is at the high level, the PMOS transistor MP2 turns off and the NMOS transistor MN2 turns on, so that the base electrode of the NPN bipolar transistor BN1 and the gate electrode of the NMOS transistor MN14 enter the low level through the NMOS transistor MN5. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level. The NMOS transistor MN14 whose gate electrode is at the low level turns off, and the NPN bipolar transistor BN2 whose base electrode is at the high level turns on. The load capacity CL2 of the output terminal VOUT2 is charged at high speeds up to 3.7 V that is lower than the potential at the base electrode of the bipolar transistor BN2 by the amount of the base-emitter voltage (0.8 V or less) thereof. Thus the output terminal VOUT2 is at the high level.

The circuit of FIG. 5 is a two-input selector circuit responsive to the signal applied to the third input terminal VI3 for selectively outputting either the signal applied to the input terminal VI1 or the signal applied to the input terminal VI2. The two-input selector circuit of the fifth preferred embodiment is adapted such that complementary signals are outputted in the logic circuit of the second preferred embodiment. Two complementary outputs of the two-input selector circuit may be achieved by simple arrangement wherein one drive circuit is added to the arrangement of the second preferred embodiment since the pass transistor circuits PT3 and PT4 output complementary signals in the second preferred embodiment.

Figure 6:
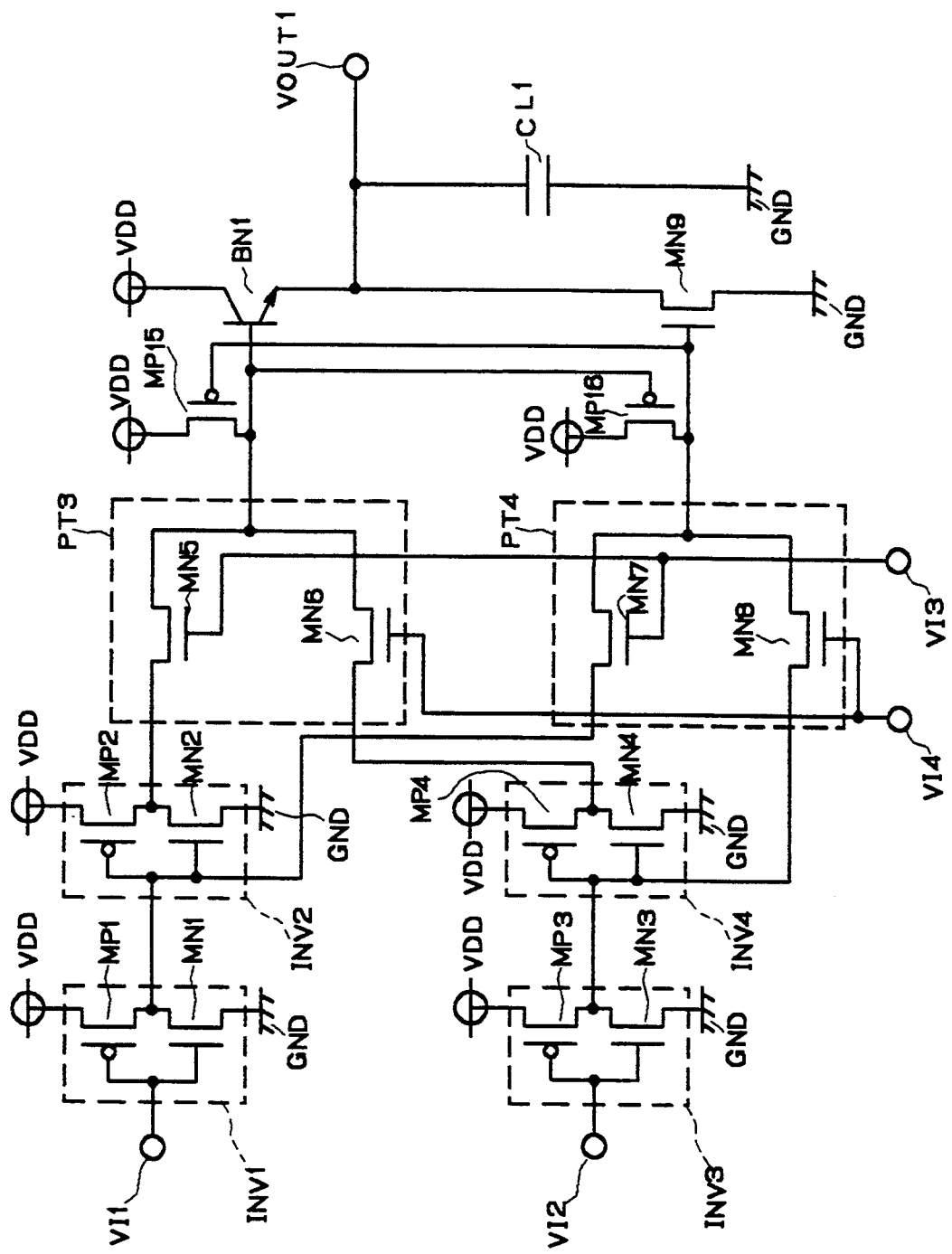
FIG. 6 is a circuit diagram of the two-input selector circuit according to a sixth preferred embodiment of the present invention.

Referring to FIG. 6, the semiconductor integrated circuit according to a sixth preferred embodiment of the present invention will be described hereinafter. FIG. 6 is a circuit diagram of the two-input selector circuit of the sixth preferred embodiment according to the present invention. In FIG. 6, MP1 to MP4, MP15, MP16 designate PMOS transistors; MN1 to MN9 designate NMOS transistors; BN1 designates a first NPN bipolar transistor; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The NMOS transistors MN5 and MN6 form a pass transistor circuit PT3, and the NMOS transistors MN7 and MN8 form a pass transistor circuit PT4. The NPN bipolar transistor BN1 and the NMOS transistor MN9 form a first drive circuit. The drain or source electrode of the NMOS transistors MN5, MN6 of the pass transistor circuit PT3 is connected to the base electrode of the NPN bipolar transistor BN1 of the first drive circuit.

Operations of the two-input selector circuit of FIG. 6 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors that have a threshold voltage of −0.5 V turn on when the voltage of the gate electrode thereof is lower than that of the source electrode thereof by 0.5 V or more. The NMOS transistors that have a threshold voltage of 0.5 V turn on when the voltage of the gate electrode thereof is higher than that of the source electrode thereof by 0.5 V or more. The NPN bipolar transistor turns on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 enters the low level through the NMOS transistor MN8. Since the input of the inverter circuit INV4 is at the low level, the PMOS transistor MP4 turns on and the NMOS transistor MN4 turns off, so that the base electrode of the NPN bipolar transistor BN1 has the power supply voltage VDD (5.0 V) or enters the high level through the NMOS transistor MN6 and the PMOS transistor MP15. Then the PMOS transistor MP16 turns off. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 4.2 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI2, the PMOS transistor MP3 turns on and the NMOS transistor MN3 turns off, so that the inverter circuit INV3 outputs a high level signal. Then, the gate electrode of the NMOS transistor MN9 has the power supply voltage (5.0 V) or enters the high level through the NMOS transistor MN8 and the PMOS transistor MP16. Then the PMOS transistor MP15 turns off. Since the input of the inverter circuit INV4 is at the high level, the PMOS transistor MP4 turns off and the NMOS transistor MN4 turns on, so that the base electrode of the NPN bipolar transistor BN1 enters the low level through the NMOS transistor MN6. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

When a high level signal is applied to the third input terminal VI3, the NMOS transistors MN5 and MN7 turn on, and the NMOS transistors MN6 and MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 has the power supply voltage VDD (5.0 V) or enters the high level through the NMOS transistor MN5 and the PMOS transistor MP15. Then the PMOS transistor MP16 turns off. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 4.2 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 has the power supply voltage (5.0 V) or enters the high level through the NMOS transistor MN7 and the PMOS transistor MP16. Then the PMOS transistor MP15 turns off. Since the input of the inverter circuit INV2 is at the high level, the PMOS transistor MP2 turns off and the NMOS transistor MN2 turns on, so that the base electrode of the NPN bipolar transistor BN1 enters the low level through the NMOS transistor MN4. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 6 is a two-input selector circuit responsive to the signal applied to the third input terminal VI3 for selectively outputting either the signal applied to the input terminal VI1 or the signal applied to the input terminal VI2. With the pass transistor circuits including only the NMOS transistors, the high level (5.0 V) signal becomes the signal having the voltage of 4.5 V that is lower than the voltage of 5.0 V by the amount of the threshold voltage (0.5 V) of the NMOS transistors, and the 4.5 V signal is transmitted. The two-input selector circuit of the sixth preferred embodiment, however, is adapted to apply the full amount of the power supply voltage by connecting the PMOS transistors MP15 and MP16 between the output terminals of the pass transistor circuits and the power supply. The PMOS transistors MP15 and MP16 also function to drive at high speeds the NPN bipolar transistor BN1 and the NMOS transistor MN9 connected to the output terminals of the pass transistor circuits PT3 and PT4.

Figure 7:
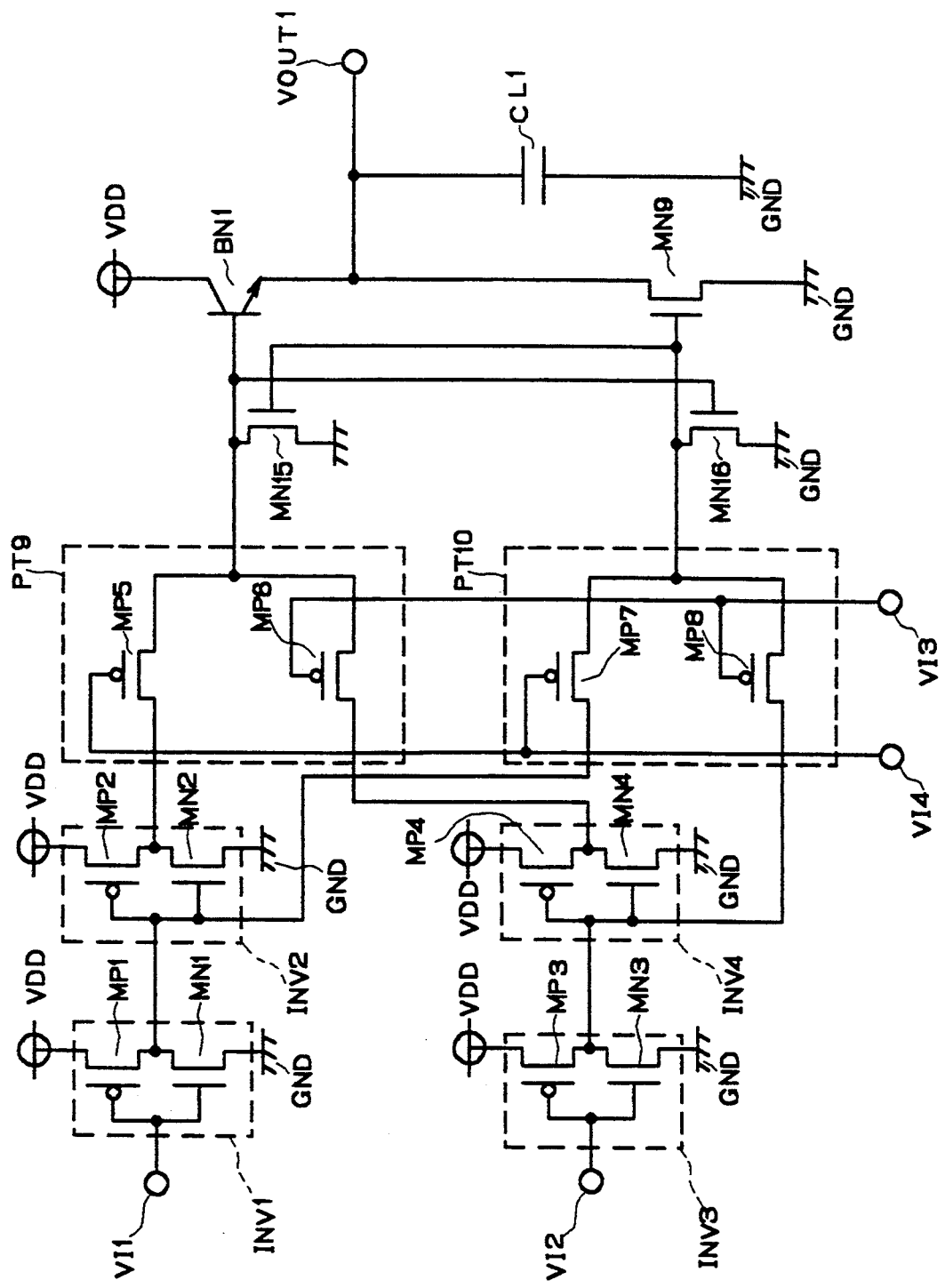
FIG. 7 is a circuit diagram of the two-input selector circuit according to a seventh preferred embodiment of the present invention.

Referring to FIG. 7, the semiconductor integrated circuit according to a seventh preferred embodiment of the present invention will be described hereinafter. FIG. 7 is a circuit diagram of the two-input selector circuit of the seventh preferred embodiment according to the present invention. FIG. 7 shows an example of the arrangement wherein the pass transistors include only PMOS transistors. In FIG. 7, MP1 to MP8 designate PMOS transistors; MN1 to MN4, MN9, MN15, MN16 designate NMOS transistors; BN1 designates a first NPN bipolar transistor; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistors MP5 and MP6 form a pass transistor circuit PT9, and the PMOS transistors MP7 and MP8 form a pass transistor circuit PT10. The NPN bipolar transistor BN1 and the NMOS transistor MN9 form a drive circuit. The drain or source electrode of the PMOS transistors MP5, MP6 of the pass transistor circuit PT9 is connected to the base electrode of the NPN bipolar transistor BN1 of the drive circuit.

The low level (0 V) signal becomes the signal having a voltage of 0.5 V that is higher than the voltage of 0 V by the amount of the threshold voltage (0.5 V) of the PMOS transistors MP5 to MP8, and the 0.5 V signal is transmitted. The two-input selector circuit of FIG. 7, however, is adapted to apply the full amount of the power supply voltage by connecting the NMOS transistors MN15 and MN16 between the output terminals of the pass transistor circuits PT9, PT10 and the power supply. The NMOS transistors MN15 and MN16 also function to drive at high speeds the NPN bipolar transistor BN1 and the NMOS transistor MN9 connected to the output terminals of the pass transistor circuits PT9 and PT10.

Figure 8:
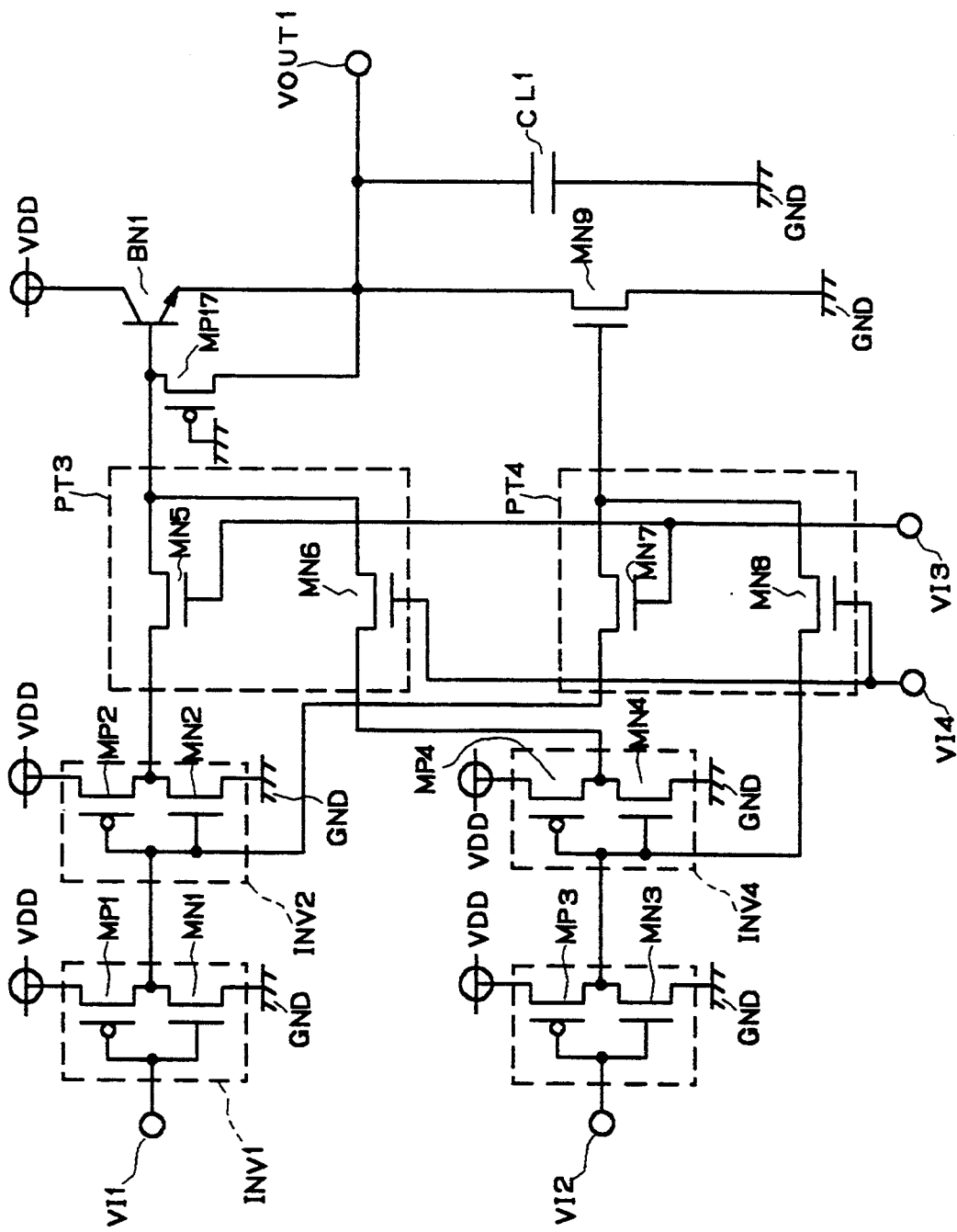
FIG. 8 is a circuit diagram of the two-input selector circuit according to an eighth preferred embodiment of the present invention.

Referring to FIG. 8, the semiconductor integrated circuit according to an eighth preferred embodiment of the present invention will be described hereinafter. FIG. 8 is a circuit diagram of the two-input selector circuit of the eighth preferred embodiment according to the present invention. In FIG. 8, MP17 designates a PMOS transistor. Elements of FIG. 8 identical with or corresponding to those of FIG. 2 are designated by the same reference characters. The PMOS transistor MP17 has a grounded gate electrode, a source electrode connected to the base electrode of the NPN bipolar transistor BN1, and a drain electrode connected to the emitter electrode of the NPN bipolar transistor BN1.

Operations of the two-input selector circuit of FIG. 8 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors that have a threshold voltage of $-0.5$ V turn on when the voltage of the gate electrode thereof is lower than that of the source electrode thereof by 0.5 V or more. The NMOS transistors that have a threshold voltage of 0.5 V turn on when the voltage of the gate electrode thereof is higher than that of the source electrode thereof by 0.5 V or more. The NPN bipolar transistor turns on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI2, the PMOS transistor MP3 turns off and the NMOS transistor MN3 turns on, so that the inverter circuit INV3 outputs a low level signal. Then, the gate electrode of the NMOS transistor MN9 enters the low level through the NMOS transistor MN8. Since the input of the inverter circuit INV4 is at the low level, the PMOS transistor MP4 turns on and the NMOS transistor MN4 turns off, so that the base electrode of the NPN bipolar transistor BN1 has a voltage of 4.5 V that is lower than the power supply voltage VDD (5.0 V) by the amount of the threshold voltage of the NMOS transistor MN6 or enters the high level through the NMOS transistor MN6. The NMOS transistor MN9 whose gate electrode is at the low level turns off, and the NPN bipolar transistor BN1 whose base electrode is at the high level turns on. The load capacity CL1 of the output terminal VOUT1 is charged up to 4.5 V at high speeds. At that time, the PMOS transistor MP17 is on and functions to charge the potential at the emitter electrode of the NPN bipolar transistor BN1 up to the potential at the base electrode thereof. Thus the output terminal VOUT1 is at the high level.

If a low level signal is applied to the input terminal VI2, the PMOS transistor MP3 turns on and the NMOS transistor MN3 turns off, so that the inverter circuit INV3 outputs a high level signal. Then, the gate electrode of the NMOS transistor MN9 has a voltage of 4.5 V that is lower than the power supply voltage (5.0 V) by the amount of the threshold voltage of the NMOS transistor MN8 or enters the high level through the NMOS transistor MN8. Since the input of the inverter circuit INV4 is at the high level, the PMOS transistor MP4 turns off and the NMOS transistor MN4 turns on, so that the base electrode of the NPN bipolar transistor BN1 enters the low level through the NMOS transistor MN6. At that time, the PMOS transistor MP17 turns off. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

When a high level signal is applied to the third input terminal VI3, the NMOS transistors MN5 and MN7 turn on, and the NMOS transistors MN6 and MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 has a voltage of 4.5 V that is lower than the power supply voltage VDD (5.0 V) by the amount of the threshold voltage of the NMOS transistor MN5 or enters the high level through the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged up to 4.5 V at high speeds. At this time, the PMOS transistor MP17 is on and functions to charge the potential at the emitter electrode of the NPN bipolar transistor BN1 up to the potential at the base electrode thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 has a voltage of 4.5 V that is lower than the power supply voltage VDD (5.0 V) by the amount of the threshold voltage (0.5 V) of the NMOS transistor MN7 or enters the high level through the NMOS transistor MN7. Since the input of the inverter circuit INV2 is at the high level, the PMOS transistor MP2 turns off and the NMOS transistor MN2 turns on, so that the base electrode of the NPN bipolar transistor BN1 enters the low level through the NMOS transistor MN5. At this time, the PMOS transistor MP17 turns off. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 8 is a two-input selector circuit responsive to the signal applied to the third input terminal VI3 for selectively outputting either the signal applied to the input terminal VI1 or the signal applied to the input terminal VI2. The voltage of the emitter electrode is fixed to a voltage lower than that of the base electrode by 0.8 V or less when the NPN bipolar transistor BN1 is on. In the eighth preferred embodiment, however, the PMOS transistor MP17 whose gate electrode is connected to the second power supply GND is connected to the base and emitter electrodes of the NPN bipolar transistor BN1 so as to equalize the voltages of the emitter and base electrodes.

Figure 9:
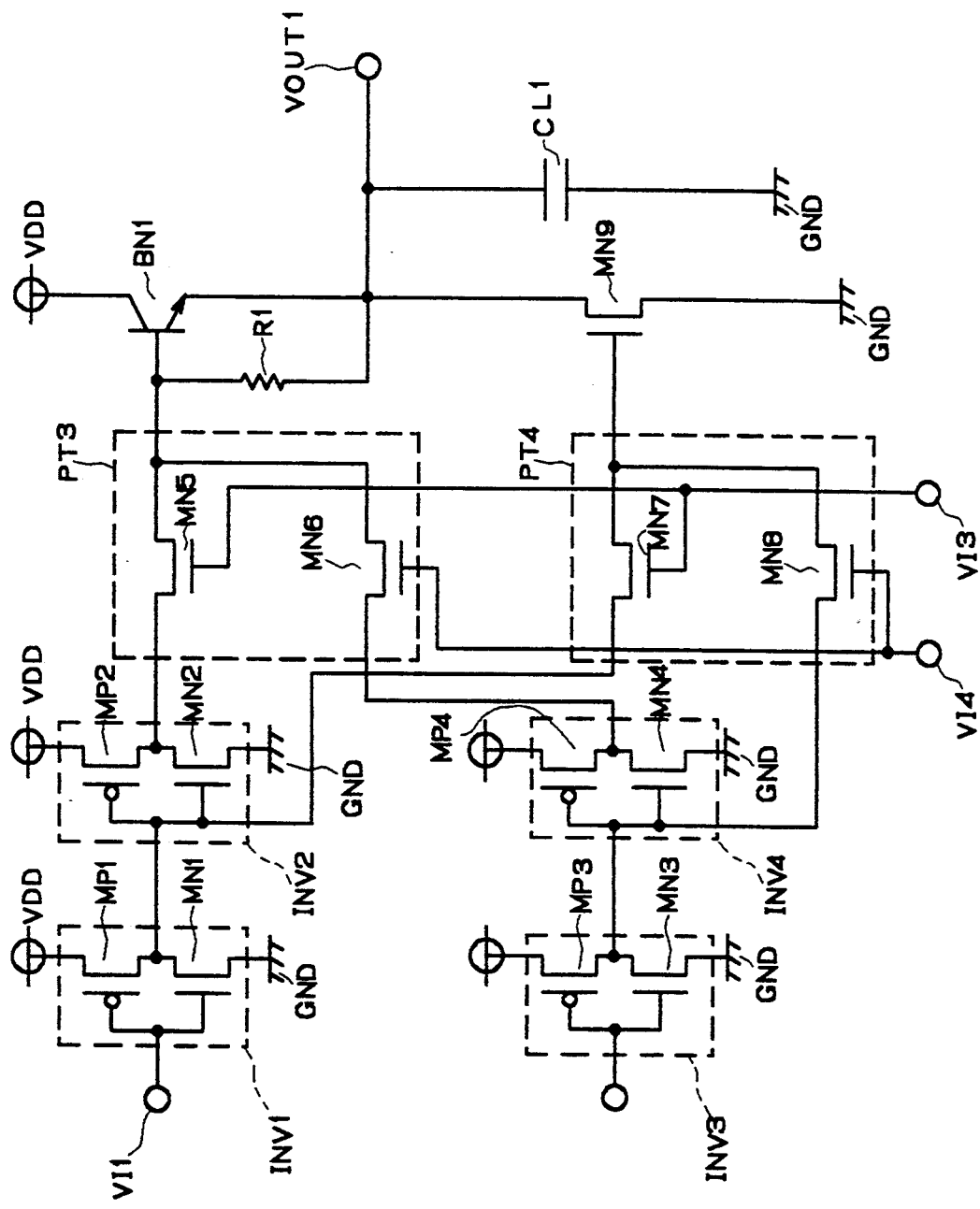
FIG. 9 is a circuit diagram of the two-input selector circuit according to a ninth preferred embodiment of the present invention.

Referring to FIG. 9, the semiconductor integrated circuit according to a ninth preferred embodiment of the present invention will be described hereinafter. FIG. 9 is a circuit diagram of the two-input selector circuit of the ninth preferred embodiment according to the present invention. In FIG. 9, R1 designates a resistor. Elements of FIG. 9 identical with or corresponding to those of FIG. 2 are designated by the same reference characters. The two-input selector circuit of the ninth preferred embodiment differs from that of the second preferred embodiment in that the resistor R1 is connected to the base and emitter electrodes of the NPN bipolar transistor BN1 so as to equalize the voltages of the emitter and base electrodes. The voltage of the output terminal VOUT1 is lower than that of the base electrode of the NPN bipolar transistor BN1 by the amount of the base-emitter voltage (0.8 V or less) in the two-input selector circuit of the second preferred embodiment. Connecting the resistor R1 to the base and emitter electrodes of the NPN bipolar transistor BN1 prevents the influence of the base-emitter voltage of the NPN bipolar transistor on the output voltage.

Figure 10:
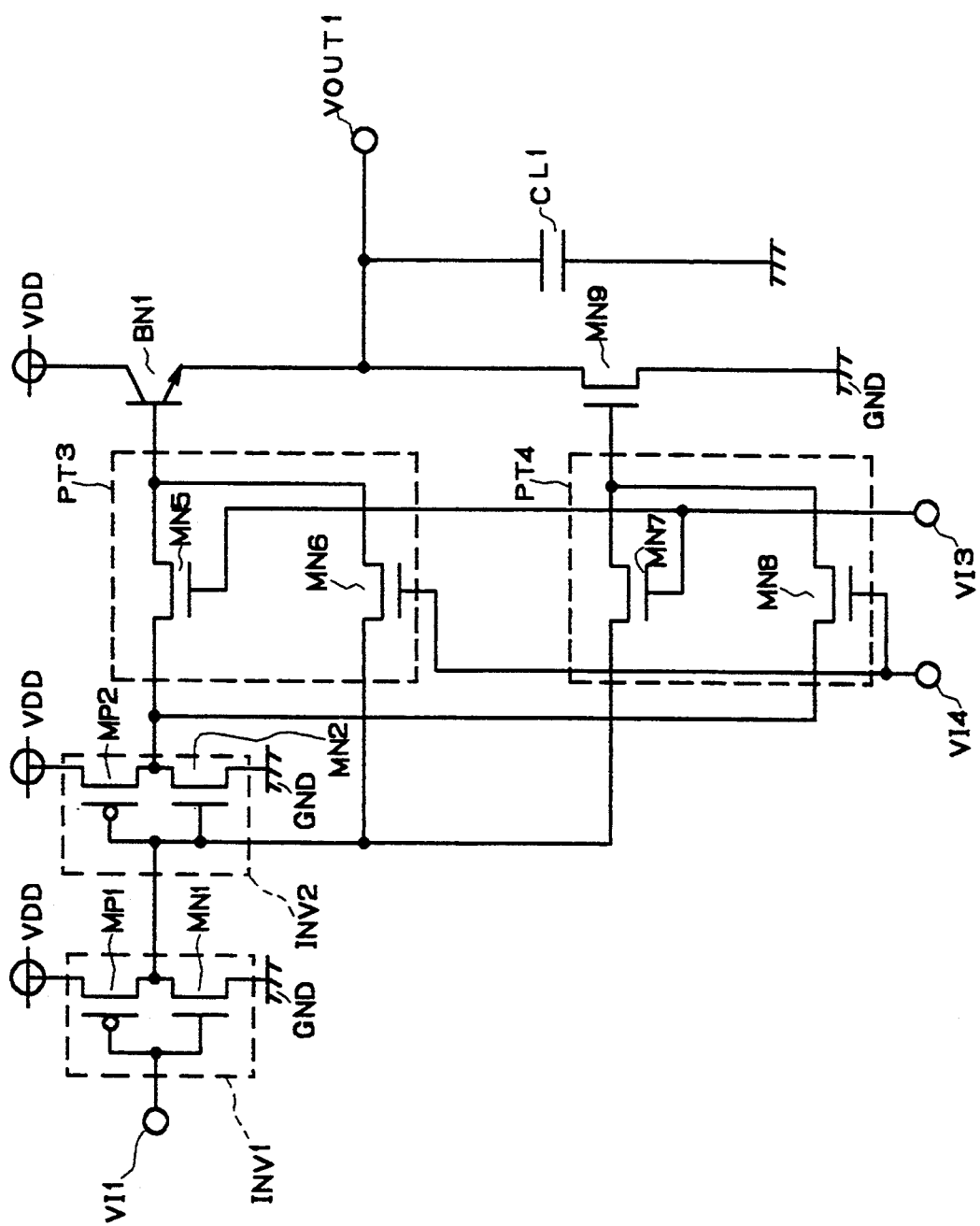
FIG. 10 is a circuit diagram of an exclusive-NOR circuit according to a tenth preferred embodiment of the present invention.

Referring to FIG. 10, the semiconductor integrated circuit according to a tenth preferred embodiment of the present invention will be described hereinafter. FIG. 10 is a circuit diagram of an exclusive-NOR circuit of the tenth preferred embodiment according to the present invention. In FIG. 10, MP1 and MP2 designate PMOS transistors; MN1 to MN9 designate NMOS transistors; BN1 designates a first NPN bipolar transistor; VI1 designates a first input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. The NMOS transistors MN5 and MN6 form a pass transistor circuit PT3, and the NMOS transistors MN7 and MN8 form a pass transistor circuit PT4. The NPN bipolar transistor BN1 and the NMOS transistor MN9 form a drive circuit. The drain or source of the NMOS transistors MN5, MN6 of the pass transistor circuit PT3 is connected to the base electrode of the NPN bipolar transistor BN1 of the drive circuit.

Operations of the exclusive-NOR circuit of FIG. 10 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 and MP2 that have a threshold voltage of −0.5 V turn on when the voltage of the gate electrode thereof is lower than that of the source electrode thereof by 0.5 V or more. The NMOS transistors MN1 to MN9 that have a threshold voltage of 0.5 V turn on when the voltage of the gate electrode thereof is higher than that of the source electrode thereof by 0.5 V or more. The NPN bipolar transistor turns on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the base electrode of the NPN bipolar transistor BN1 enters the low level through the NMOS transistor MN6. Since the input of the inverter circuit INV2 is at the low level, the PMOS transistor MP2 turns on and the NMOS transistor MN2 turns off, so that the gate electrode of the NMOS transistor MN9 has a voltage of 4.5 V that is lower than the power supply voltage VDD (5.0 V) by the amount of the threshold voltage (0.5 V) of the NMOS transistor MN8 or enters the high level through the NMOS transistor MN8. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

If a low level signal is applied to the input terminal VI1, the PMOS transistor MP1 turns on and the NMOS transistor MN1 turns off, so that the inverter circuit INV1 outputs a high level signal. Then, the base electrode of the NPN bipolar transistor BN1 has a voltage of 4.5 V that is lower than the power supply voltage VDD (5.0 V) by the amount of the threshold voltage (0.5 V) of the NMOS transistor MN6 or enters the high level through the NMOS transistor MN6. Since the input of the inverter circuit INV2 is at the high level, the PMOS transistor MP2 turns off and the NMOS transistor MN2 turns on, so that the gate electrode of the NMOS transistor MN9 enters the low level through the NMOS transistor MN8. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level.

When a high level signal is applied to the third input terminal VI3, the NMOS transistors MN5, MN7 turn on, and the NMOS transistors MN6, MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the gate electrode of the NMOS transistor MN9 enters the low level through the NMOS transistor MN7. Since the input of the inverter circuit INV2 is at the low level, the NMOS transistor MN2 turns off and the PMOS transistor MP2 turns on, so that the base electrode of the NPN bipolar transistor BN1 has a voltage of 4.5 V that is lower than the power supply voltage VDD (5.0 V) by the amount of the threshold voltage of the NMOS transistor MN5 or enters the high level through the NMOS transistor MN5. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Then, the gate electrode of the NMOS transistor MN9 has a voltage of 4.5 V that is lower than the power supply voltage VDD (5.0 V) by the amount of the threshold voltage (0.5 V) of the NMOS transistor MN7 or enters the high level through the NMOS transistor MN7. Since the input of the inverter circuit INV2 is at the high level, the PMOS transistor MP2 turns off and the NMOS transistor MN2 turns on, so that the base electrode of the NPN bipolar transistor BN1 enters the low level through the NMOS transistor MN5. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

In the exclusive-NOR circuit of FIG. 10, the pass transistor circuits PT3 and PT4 include only the NMOS transistors. The circuit of FIG. 10 is adapted such that the base electrode of the NPN bipolar transistor BN1 and the gate electrode of the NMOS transistor MN9, i.e., the output of the pass transistor circuit PT3 and the output of the pass transistor circuit PT4, output complementary signals constantly. It is only the NPN bipolar transistor BN1 and the NMOS transistor MN9 that are driven by the inverter circuits INV1 and INV2 through the pass transistor circuit PT3 or PT4 to charge and discharge the load capacity CL1 of the output terminal VOUT1. It should be noted that the pass transistor circuits PT3 and PT4 include only the NMOS transistors MN5 to MN8, unlike the pass transistor circuits PT1 and PT2. Thus the high level signal having a voltage of 4.5 V that is lower than the power supply voltage VDD by the amount of the threshold voltage of the NMOS transistors MN5 to MN8 is applied to the base electrode of the NPN bipolar transistor BN1 and to the gate electrode of the NMOS transistor MN9. Since the base voltage starts decreasing from 4.5 V in turn-off operation of the NPN bipolar transistor BN1, the turn-off time of the NPN bipolar transistor BN1 is shortened as compared with the first preferred embodiment, whereby the exclusive-NOR circuit is permitted to operate at higher speeds. The exclusive-NOR circuit of FIG. 10 according to the tenth preferred embodiment is achieved by applying the output of the inverter circuit INV1 to the NMOS transistor MN6 and applying the output of the inverter circuit INV2 to the NMOS transistor MN8 in the logic circuit of the second preferred embodiment. The output is at the high level only when the both signals applied to the input terminals VI1 and VI3 are at the high or low level, which is the feature of the exclusive-NOR circuit.

Figure 11:
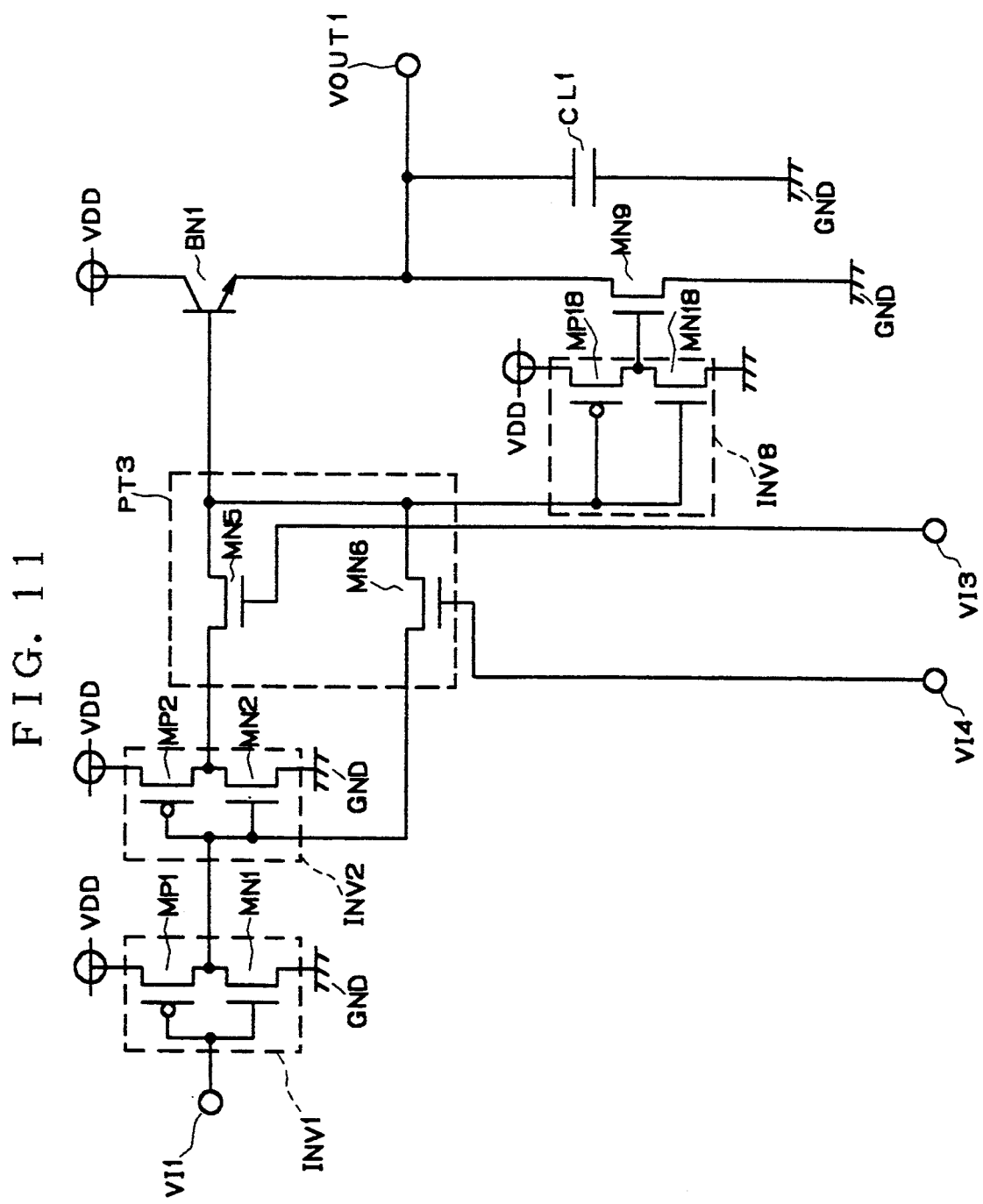
FIG. 11 is a circuit diagram of the exclusive-NOR circuit according to an eleventh preferred embodiment of the present invention.

Referring to FIG. 11, the semiconductor integrated circuit according to an eleventh preferred embodiment of the present invention will be described hereinafter. FIG. 11 is a circuit diagram of the exclusive-NOR circuit of the eleventh preferred embodiment according to the present invention. In FIG. 11, MP1, MP2 and MP18 designate PMOS transistors; MN1, MN5, MN6, MN9 and MN18 designate NMOS transistors; BN1 designates a first NPN bipolar transistor; VI1 designates a first input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. The NMOS transistors MN5 and MN6 form a pass transistor circuit PT3. The NPN bipolar transistor BN1 and the NMOS transistor MN9 form a drive circuit. The drain or source of the NMOS transistors MN5, MN6 of the pass transistor circuit PT3 is connected to the base electrode of the NPN bipolar transistor BN1 of the drive circuit.

Operations of the exclusive-NOR circuit of FIG. 11 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1, MP2 and MP18 that have a threshold voltage of −0.5 V turn on when the voltage of the gate electrode thereof is lower than that of the source electrode thereof by 0.5 V or more. The NMOS transistors MN1, MN5, MN6, MN9 and MN18 that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more.

When a low level signal is applied to the third input terminal VI3, the NMOS transistor MN5 turns off, and the NMOS transistor MN6 turns on since a high level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the base electrode of the NPN bipolar transistor BN1 enters the low level through the NMOS transistor MN6. Since the low level signal is also applied to the inverter circuit INV8, the PMOS transistor MP18 turns on and the NMOS transistor MN18 turns off, so that the gate electrode of the NMOS transistor MN9 enters the high level. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

If a low level signal is applied to the input terminal VI1, the PMOS transistor MP1 turns on and the NMOS transistor MN1 turns off, so that the inverter circuit INV1 outputs a high level signal. Then, the base electrode of the NPN bipolar transistor BN1 has a voltage of 4.5 V through the NMOS transistor MN6. Since the high level signal is also applied to the inverter circuit INV8, the PMOS transistor MP18 turns off and the NMOS transistor MN18 turns on, so that the gate electrode of the NMOS transistor MN9 enters the low level. The NMOS transistor MN9 whose gate electrode is at the low level turns off, and the NPN bipolar transistor BN1 whose base electrode has a voltage of 4.5 V turns on. The load capacity CL1 of the output terminal VOUT1 is charged up to 3.7 V at high speeds. Thus the output terminal VOUT1 is at the high level.

When a high level signal is applied to the third input terminal VI3, the NMOS transistor MN5 turns on, and the NMOS transistor MN6 turns off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Since the input of the inverter circuit INV2 is at the low level, the NMOS transistor MN2 turns off and the PMOS transistor MP2 turns on, so that the base electrode of the NPN bipolar transistor BN1 and the input terminal of the inverter circuit INV8 have a voltage of 4.5 V that is lower than the power supply voltage VDD (5.0 V) by the amount of the threshold voltage of the NMOS transistor MN5 through the NMOS transistor MN5. Since the input of the inverter circuit INV8 is at the high level, the NMOS transistor MN18 turns on and the PMOS transistor MP18 turns off, so that the gate electrode of the NMOS transistor MN9 enters the low level. The NMOS transistor MN9 whose gate electrode is at the low level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Since the input of the inverter circuit INV2 is at the high level, the NMOS transistor MN2 turns on and the PMOS transistor MP2 turns off, so that the base electrode of the NPN bipolar transistor BN1 and the input terminal of the inverter circuit INV8 enter the low level through the NMOS transistor MN5. Since the input of the inverter circuit INV8 is at the low level, the NMOS transistor MN18 turns off and the PMOS transistor MP18 turns on, so that the gate electrode of the NMOS transistor MN9 enters the high level. The NMOS transistor MN9 whose gate electrode is at the high level turns on, and the NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 11 is an exclusive-NOR circuit which outputs the high level signal only when both of the signals applied to the input terminals VI1 and VI3 are at the high or low level. The output of the pass transistor circuit PT3 is inputted to the inverter circuit INV8, and the output of the inverter circuit INV8 is used as the inverted signal of the pass transistor circuit PT3. It is only the NPN bipolar transistor BN1 and the NMOS transistor MN9 that charge and discharge the load capacity CL1 of the output terminal VOUT1.

Figure 12:
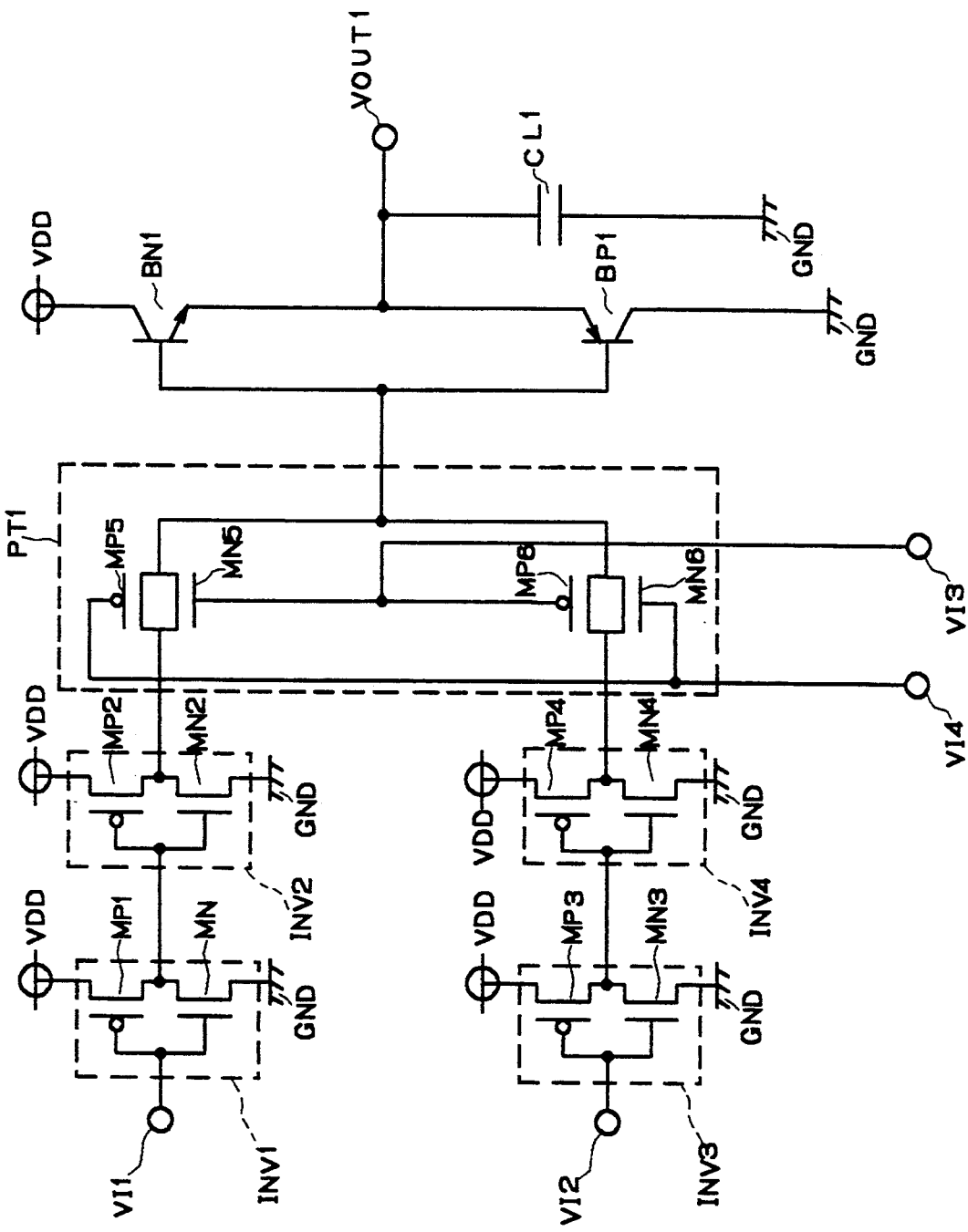
FIG. 12 is a circuit diagram of the two-input selector circuit according to a twelfth preferred embodiment of the present invention.

Referring to FIG. 12, the semiconductor integrated circuit according to a twelfth preferred embodiment of the present invention will be described hereinafter. FIG. 12 is a circuit diagram of the two-input selector circuit of the twelfth preferred embodiment according to the present invention. In FIG. 12, MP1 to MP6 designate PMOS transistors; MN1 to MN6 designate NMOS transistors; BN1 designates an NPN bipolar transistor; BP1 designates a PNP bipolar transistor; VI1 designates a first input terminal; VI2 designates a second input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2.

The PMOS transistors MP5, MP6 and the NMOS transistors MN5, MN6 form a pass transistor circuit PT1. The NPN bipolar transistor BN1 and the PNP bipolar transistor BP1 form a drive circuit. The drain or source of the NMOS transistors MN5, MN6 and the PMOS transistors MP5, MP6 of the pass transistor circuit PT1 is connected to the base electrode of the NPN bipolar transistor BN1 and the PNP bipolar transistor BP1 of the drive circuit.

Operations of the two-input selector circuit of FIG. 12 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 to MP6 that have a threshold voltage of $-0.5$ V turn on when the voltage of the gate electrode thereof is lower than that of the source electrode thereof by 0.5 V or more. The NMOS transistors MN1 to MN6 that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more. The PNP bipolar transistor BP1 turns on when the voltage of the base electrode thereof is lower than that of the emitter electrode by 0.8 V or more.

When a low level signal is applied to the third input terminal VI3, the NMOS transistor MN5 turns off and the PMOS transistor MP6 turns on. Since a high level signal is applied to the fourth input terminal VI4, the PMOS transistor MP5 turns off and the NMOS transistor MN6 turns on.

At that time, if a high level signal is applied to the input terminal VI2, the PMOS transistor MP3 turns off and the NMOS transistor MN3 turns on, so that the inverter circuit INV3 outputs a low level signal. Since the input of the inverter circuit INV4 is at the low level, the NMOS transistor MN4 turns off and the PMOS transistor MP4 turns on, so that the base electrodes of the NPN bipolar transistor BN1 and PNP bipolar transistor enter the high level through the PMOS transistor MP6 and the NMOS transistor MN6. The PNP bipolar transistor BP1 whose base electrode is at the high level turns off, and the NPN bipolar transistor BN1 whose base electrode is at the high level turns on. The load capacity CL1 of the output terminal VOUT1 is charged at high speeds up to 4.2 V that is lower than the power supply voltage VDD (5.0 V) by the amount of the base-emitter voltage (0.8 V or less) of the bipolar transistor. Thus the output terminal VOUT1 is at the high level.

If a low level signal is applied to the input terminal VI2, the PMOS transistor MP3 turns on and the NMOS transistor MN3 turns off, so that the inverter circuit INV3 outputs a high level signal. Since the input of the inverter circuit INV4 is at the high level, the PMOS transistor MP4 turns off and the NMOS transistor MN4 turns on, so that the base electrodes of the NPN bipolar transistor BN1 and PNP bipolar transistor BP1 enter the low level through the PMOS transistor MP6 and the NMOS transistor MN6. The PNP bipolar transistor BP1 whose base electrode is at the low level turns on, and the NPN bipolar transistor BN1 whose base electrode is at the low level turns off. The load capacity CL1 of the output terminal VOUT1 is discharged to 0.8 V at high speeds. Thus the output terminal VOUT1 is at the low level.

When a high level signal is applied to the third input terminal VI3, the NMOS transistor MN5 turns on and the PMOS transistor MP6 turns off. Since a low level signal is applied to the fourth input terminal VI4, the PMOS transistor MP5 turns on and the NMOS transistor MN6 turns off.

At that time, if a high level signal is applied to the input terminal VI1, the PMOS transistor MP1 turns off and the NMOS transistor MN1 turns on, so that the inverter circuit INV1 outputs a low level signal. Since the input of the inverter circuit INV2 is at the low level, the NMOS transistor MN2 turns off and the PMOS transistor MP2 turns on, so that the base electrodes of the NPN bipolar transistor BN1 and PNP bipolar transistor BP1 enter the high level through the PMOS transistor MP5 and the NMOS transistor MN5. The PNP bipolar transistor BP1 whose base electrode is at the high level turns off, and the NPN bipolar transistor BN1 whose base electrode is at the high level turns on. The load capacity CL1 of the output terminal VOUT1 is charged at high speeds up to 4.2 V that is lower than the power supply voltage VDD (5.0 V) by the amount of the base-emitter voltage (0.8 V or less) of the bipolar transistor. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Since the input of the inverter circuit INV2 is at the high level, the PMOS transistor MP2 turns off and the NMOS transistor MN2 turns on, so that the base electrodes of the NPN bipolar transistor BN1 and PNP bipolar transistor BP1 enter the low level through the PMOS transistor MP5 and the NMOS transistor MN5. The PNP bipolar transistor BP1 whose base electrode is at the low level turns on, and the NPN bipolar transistor whose base electrode is at the low level turns off. The load capacity CL1 of the output terminal VOUT1 is discharged to 0.8 V at high speeds. Thus the output terminal VOUT1 is at the low level.

The circuit of FIG. 12 is a two-input selector circuit responsive to the control signal applied to the third input terminal VI3 for selectively outputting either the signal applied to the input terminal VI1 or the signal applied to the input terminal VI2. The output of the pass transistor circuit PT1 is connected only to the base electrodes of the NPN bipolar transistor BN1 and PNP bipolar transistor BP1, eliminating the necessity of the circuit for outputting the complementary signals as in the first preferred embodiment. It is only the NPN bipolar transistor BN1 and the PNP bipolar transistor BP1 that are driven by the inverter circuits INV1 to INV4 through the pass transistor PT1 to charge and discharge the load capacity CL1 of the output terminal VOUT1.

Figure 13:
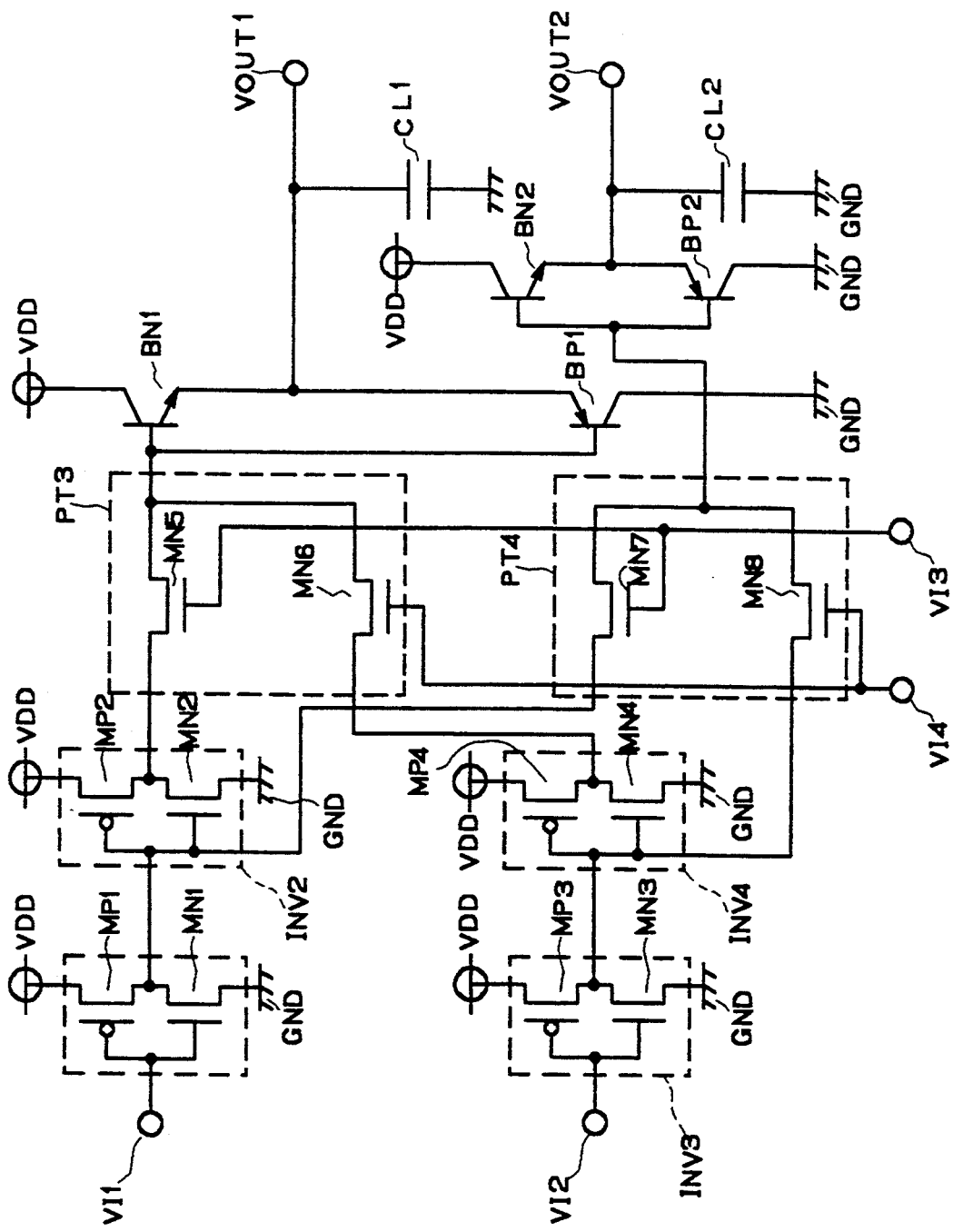
FIG. 13 is a circuit diagram of the two-input selector circuit according to a thirteenth preferred embodiment of the present invention.

Referring to FIG. 13, the semiconductor integrated circuit according to a thirteenth preferred embodiment of the present invention will be described hereinafter. FIG. 13 is a circuit diagram of the two-input selector circuit of the thirteenth preferred embodiment according to the present invention. In FIG. 13, MP1 to MP4 designate PMOS transistors; MN1 to MN8 designate NMOS transistors; BN1 designates a first NPN bipolar transistor; BN2 designates a second NPN bipolar transistor; BP1 designates a first PNP bipolar transistor; BP2 designates a second PNP bipolar transistor; VI1 designates a first input terminal; VI2 designates a second input terminal; VI3 designates a third input terminal; VI4 designates a fourth input terminal; VOUT1 designates a first output terminal; VOUT2 designates a second output terminal; VDD designates a first power supply of 5.0 V; GND designates a second power supply of 0 V; CL1 designates a first load capacity; and CL2 designates a second load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. Similarly, the PMOS transistor MP3 and the NMOS transistor MN3 form a third inverter circuit INV3, and the PMOS transistor MP4 and the NMOS transistor MN4 form a fourth inverter circuit INV4. The third and fourth inverter circuits INV3 and INV4 serve as a buffer circuit for a signal inputted to the input terminal VI2. The NMOS transistors MN5 and MN6 form a pass transistor circuit PT3, and the NMOS transistors MN7 and MN8 form a pass transistor circuit PT4. The NPN bipolar transistor BN1 and the PNP bipolar transistor BP1 form a first drive circuit, and the NPN bipolar transistor BN2 and the PNP bipolar transistor BP2 form a second drive circuit. The drain or source electrode of the NMOS transistors MN5, MN6 of the pass transistor circuit PT3 is connected to the base electrode of the NPN bipolar transistor BN1 and the PNP bipolar transistor BP1 of the first drive circuit. The drain or source electrode of the NMOS transistors MN7, MN8 of the pass transistor circuit PT4 is connected to the base electrode of the NPN bipolar transistor BN2 and the PNP bipolar transistor BP2 of the second drive circuit.

Operations of the two-input selector circuit of FIG. 13 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1 to MP4 that have a threshold voltage of −0.5 V turn on when the voltage of the gate electrode thereof is lower than that of the source electrode thereof by 0.5 V or more. The NMOS transistors MN1 to MN8 that have a threshold voltage of 0.5 V turn on when the voltage of the gate electrode thereof is higher than that of the source electrode thereof by 0.5 V or more. The NPN bipolar transistors BN1 and BN2 turn on when the voltage of the base electrode thereof is higher than that of the emitter electrode by 0.8 V or more.

When a low level signal is applied to the third input terminal VI3, the NMOS transistors MN5 and MN7 turn off, and the NMOS transistors MN6 and MN8 turn on since a high level signal is applied to the fourth input terminal VI4. At that time, if a high level signal is applied to the input terminal VI2, the PMOS transistor MP3 turns off and the NMOS transistor MN3 turns on, so that the inverter circuit INV3 outputs a low level signal. Then, the base electrodes of the NPN bipolar transistor BN2 and PNP bipolar transistor BP2 enter the low level through the NMOS transistor MN8. Since the input of the inverter circuit INV4 is at the low level, the PMOS transistor MP4 turns on and the NMOS transistor MN4 turns off, so that the base electrodes of the NPN bipolar transistor BN1 and PNP bipolar transistor BP1 have a voltage of 4.5 V that is lower than the power supply voltage VDD (5.0 V) by the amount of the threshold voltage (0.5 V) of the NMOS transistor MN6 or enter the high level through the NMOS transistor MN6. The PNP bipolar transistor BP1 whose base electrode is at the high level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. The PNP bipolar transistor BP2 whose base electrode is at the low level turns on, and the NPN bipolar transistor BN2 whose base electrode is at the low level turns off. The load capacity CL2 of the output terminal VOUT2 is discharged to 1.3 V at high speeds. Thus the output terminal VOUT2 is at the low level.

If a low level signal is applied to the input terminal VI2, the PMOS transistor MP3 turns on and the NMOS transistor MN3 turns off, so that the inverter circuit IV3 outputs a high level signal. Then, the base electrodes of the NPN bipolar transistor BN2 and PNP bipolar transistor BP2 have a voltage of 4.5 V that is lower than the power supply voltage (5.0 V) by the amount of the threshold voltage (0.5 V) of the NMOS transistor MN8 or enter the high level through the NMOS transistor MN8. Since the input of the inverter circuit INV4 is at the high level, the PMOS transistor MP4 turns off and the NMOS transistor MN4 turns on, so that the base electrodes of the NPN bipolar transistor BN1 and PNP bipolar transistor BP1 enter the low level through the NMOS transistor MN6. The PNP bipolar transistor BP1 whose base electrode is at the low level turns on, and the NPN bipolar transistor BN1 whose base electrode is at the low level turns off. The load capacity CL1 of the output terminal VOUT1 is discharged to 1.3 V at high speeds. Thus the output terminal VOUT1 is at the low level. The PNP bipolar transistor BP2 whose base electrode is at the high level turns off, and the NPN bipolar transistor BN2 whose base electrode is at the high level turns on. The load capacity CL2 of the output terminal VOUT2 is charged at high speeds up to 3.7 V that is lower than the potential at the base electrode of the bipolar transistor BN2 by the amount of the base-emitter voltage (0.8 V or less) thereof. Thus the output terminal VOUT2 is at the high level.

When a high level signal is applied to the third input terminal VI3, the NMOS transistors MN5 and MN7 turn on, and the NMOS transistors MN6 and MN8 turn off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the base electrodes of the NPN bipolar transistor BN2 and PNP bipolar transistor BP2 enter the low level through the NMOS transistor MN7. Since the input of the inverter circuit INV2 is at the low level, the NMOS transistor MN2 turns off and the PMOS transistor MP2 turns on, so that the base electrodes of the NPN bipolar transistor BN1 and PNP bipolar transistor BP1 have a voltage of 4.5 V that is lower than the power supply voltage VDD (5.0 V) by the amount of the threshold voltage (0.5 V) of the NMOS transistor MN5 or enter the high level through the NMOS transistor MN5. The PNP bipolar transistor BP1 whose base electrode is at the high level turns off, and the NPN bipolar transistor BN1 whose base electrode is at the high level turns on. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level. The PNP bipolar transistor BP2 whose base electrode is at the low level turns on, and the NPN bipolar transistor BN2 whose base electrode is at the low level turns off. The load capacity CL2 of the output terminal VOUT2 is discharged to 1.3 V at high speeds. Thus the output terminal VOUT2 is at the low level.

If a low level signal is applied to the input terminal VI1, the PMOS transistor MP1 turns on and the NMOS transistor MN1 turns off, so that the inverter circuit INV1 outputs a high level signal. Then, the base electrodes of the NPN bipolar transistor BN2 and PNP bipolar transistor BP2 have a voltage of 4.5 V that is lower than the power supply voltage (5.0 V) by the amount of the threshold voltage (0.5 V) of the NMOS transistor MN7 or enter the high level through the NMOS transistor MN7. Since the input of the inverter circuit INV2 is at the high level, the PMOS transistor MP2 turns off and the NMOS transistor MN2 turns on, so that the base electrodes of the NPN bipolar transistor BN1 and PNP bipolar transistor BP1 enter the low level through the NMOS transistor MN5. The PNP bipolar transistor BP1 whose base electrode is at the low level turns on, and the NPN bipolar transistor BN1 whose base electrode is at the low level turns off. The load capacity CL1 of the output terminal VOUT1 is discharged to 1.3 V at high speeds. Thus the output terminal VOUT1 is at the low level. The PNP bipolar transistor BP2 whose base electrode is at the high level turns off, and the NPN bipolar transistor BN2 whose base electrode is at the high level turns on. The load capacity CL2 of the output terminal VOUT2 is charged at high speeds up to 3.7 V that is lower than the potential at the base electrode of the bipolar transistor BN2 by the amount of the base-emitter voltage (0.8 V or less) thereof. Thus the output terminal VOUT2 is at the high level.

The circuit of FIG. 13 is a two-input selector circuit responsive to the signal applied to the third input terminal VI3 for selectively outputting either the signal applied to the input terminal VI1 or the signal applied to the input terminal VI2. The two-input selector circuit of the thirteenth preferred embodiment is achieved such that complementary signals are outputted in the logic circuit of the twelfth preferred embodiment.

Figure 14:
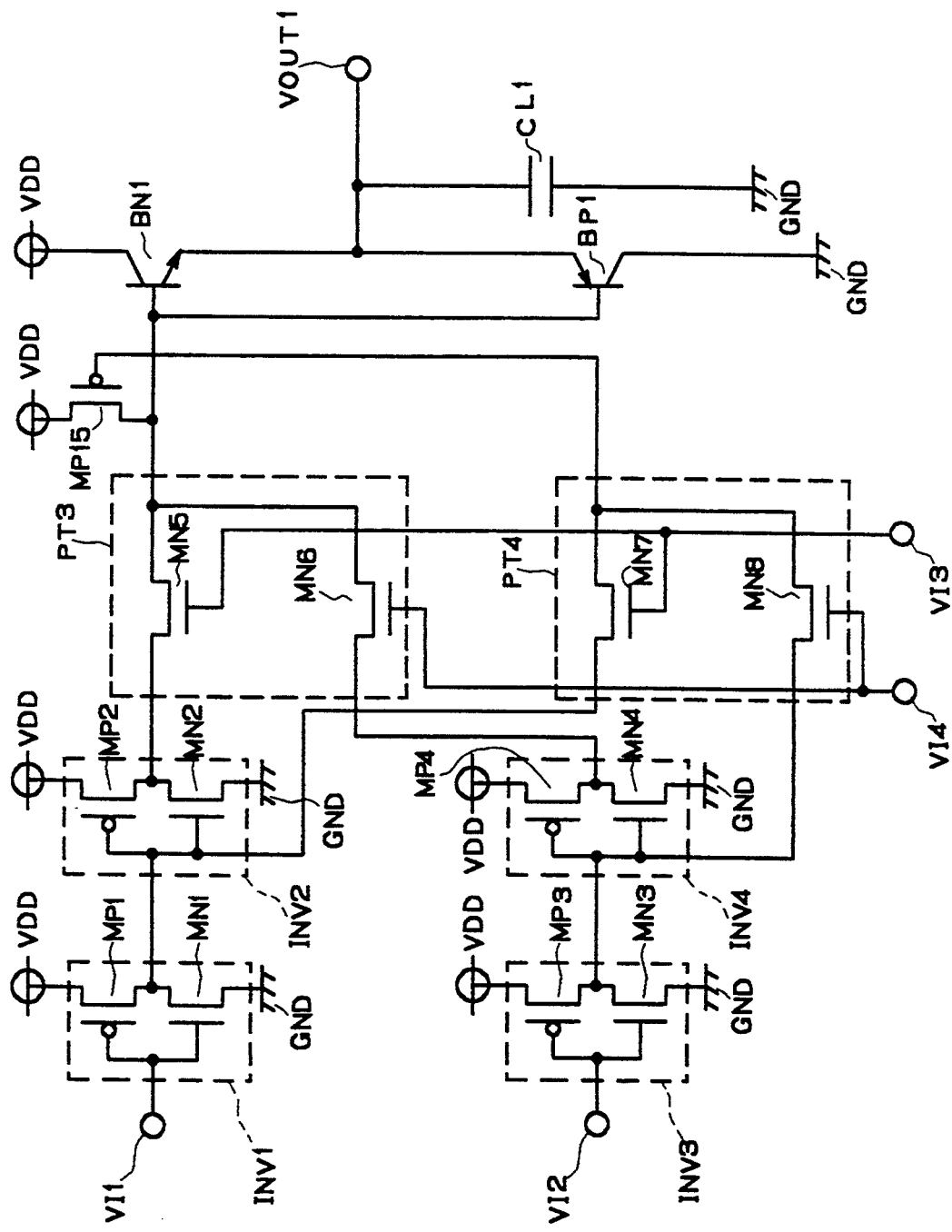
FIG. 14 is a circuit diagram of the two-input selector circuit according to a fourteenth preferred embodiment of the present invention.

Referring to FIG. 14, the semiconductor integrated circuit according to a fourteenth preferred embodiment of the present invention will be described hereinafter. FIG. 14 is a circuit diagram of the two-input selector circuit of the fourteenth preferred embodiment according to the present invention. In FIG. 14, MN7 and MN8 designate NMOS transistors forming a pass transistor circuit PT4; and MP15 designates a PMOS transistor having a gate electrode connected to the drain electrode of the NMOS transistors MN7 and MN8 which is the output of the pass transistor circuit PT4. Elements of FIG. 14 identical with or corresponding to those of FIG. 12 are designated by the same reference characters. The two-input selector circuit of the fourteenth preferred embodiment differs from that of the twelfth preferred embodiment in that the circuit of the fourteenth preferred embodiment comprises the pass transistor circuit PT4 and the PMOS transistor MP15. The pass transistor circuit PT4 outputs the logically inverted signal of the output signal of the pass transistor circuit PT3, and the inverted signal is applied to the gate electrode of the PMOS transistor MP15. Thus, when the NPN bipolar transistor BN1 whose base electrode is at the high level turns on, the PMOS transistor MP15 also turns on. This alleviates the influence of the threshold voltage of the NMOS transistors MN5, MN6, so that the base electrode of the NPN bipolar transistor BN1 has the power supply voltage VDD. The load capacity CL1 is charged at higher speeds. The high level output voltage is increased.

Figure 15:
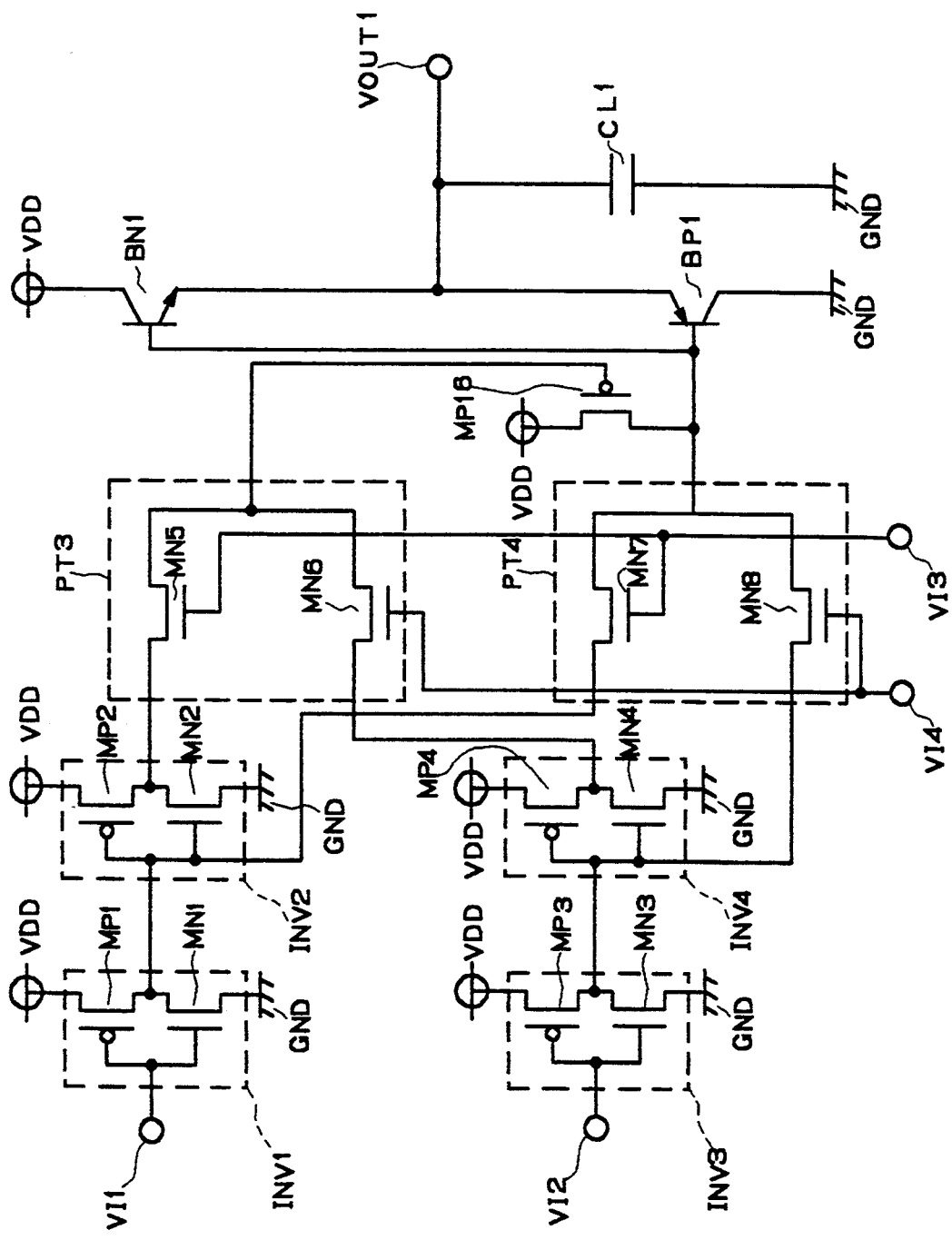
FIG. 15 is a circuit diagram of the two-input selector circuit according to a fifteenth preferred embodiment of the present invention.

Referring to FIG. 15, the semiconductor integrated circuit according to a fifteenth preferred embodiment of the present invention will be described hereinafter. FIG. 15 is a circuit diagram of the two-input selector circuit of the fifteenth preferred embodiment according to the present invention. In FIG. 15, MN7 and MN8 designate NMOS transistors forming a pass transistor circuit PT4; and MP16 designates a PMOS transistor having a gate electrode connected to the drain electrode of the NMOS transistors MN5 and MN6 which is the output of a pass transistor circuit PT3. Elements of FIG. 15 identical with or corresponding to those of FIG. 14 are designated by the same reference characters. The two-input selector circuit of the fifteenth preferred embodiment differs from that of the fourteenth preferred embodiment in that the gate electrode of the PMOS transistor MP16 is connected to the output of the pass transistor circuit PT3 in the circuit of the fifteenth preferred embodiment.

Figure 16:
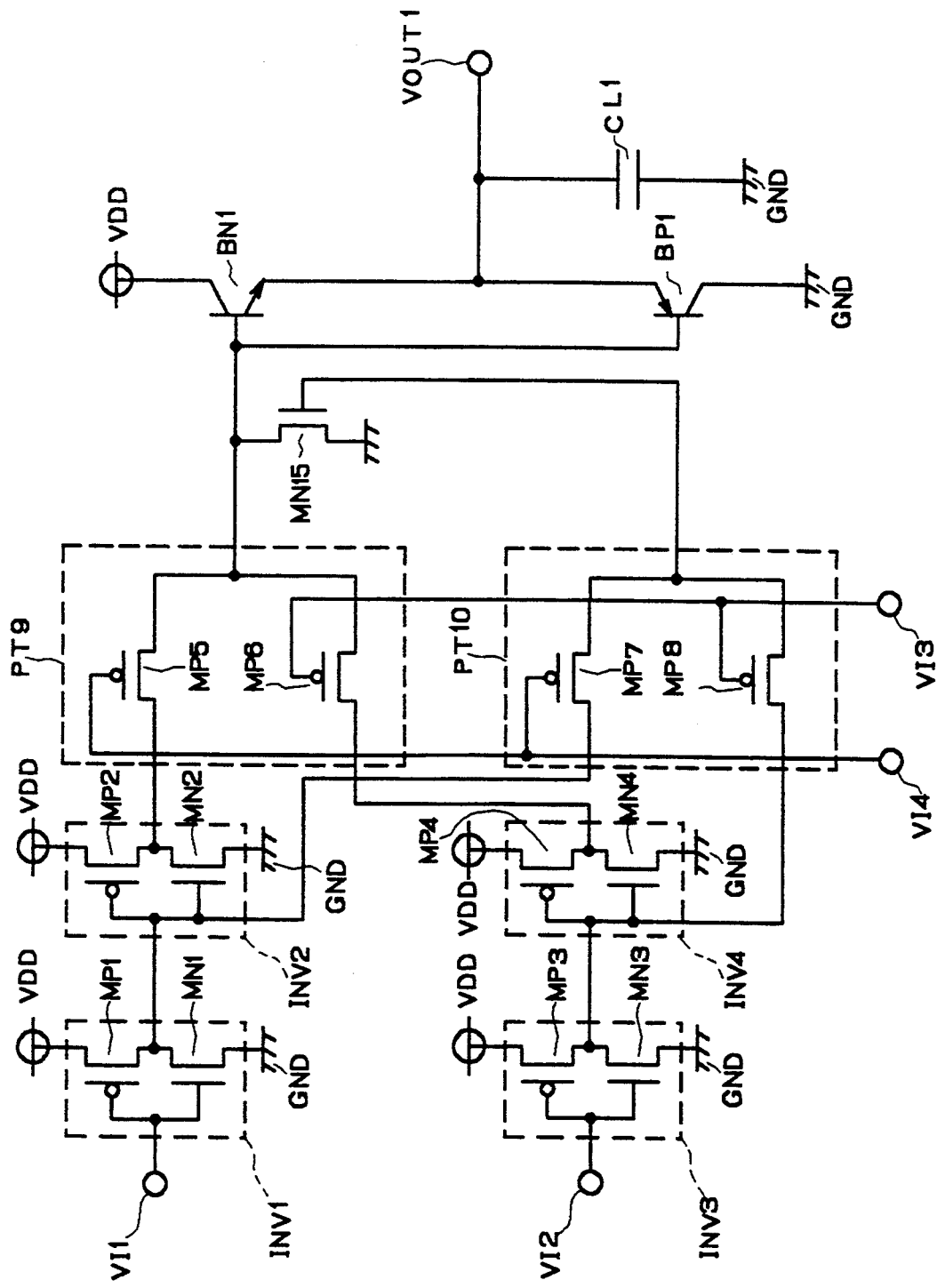
FIG. 16 is a circuit diagram of the two-input selector circuit according to a sixteenth preferred embodiment of the present invention.

Referring to FIG. 16, the semiconductor integrated circuit according to a sixteenth preferred embodiment of the present invention will be described hereinafter. FIG. 16 is a circuit diagram of the two-input selector circuit of the sixteenth preferred embodiment according to the present invention. In FIG. 16, MP5 and MP6 designate PMOS transistors forming a pass transistor circuit PT9; MP7 and MP8 designate PMOS transistors forming a pass transistor circuit PT10; and MN15 designates an NMOS transistor having a gate electrode connected to the drain electrode of the PMOS transistors MP7 and MP8 which is the output of the pass transistor circuit PT10. Elements of FIG. 16 identical with or corresponding to those of FIG. 12 are designated by the same reference characters. The two-input selector circuit of the sixteenth preferred embodiment differs from that of the twelfth preferred embodiment in that the circuit of the sixteenth preferred embodiment comprises the pass transistor circuits PT9, PT10 and the PMOS transistor MP15. The pass transistor circuit PT10 outputs the logically inverted signal of the output signal of the pass transistor circuit PT9, and the inverted signal is applied to the gate electrode of the NMOS transistor MN15. Thus, when the PNP bipolar transistor BP1 whose base electrode is at the low level turns on, the NMOS transistor MN15 also turns on. This alleviates the influence of the threshold voltage of the PMOS transistors MP5, MP6, so that the base electrode of the PNP bipolar transistor BP1 has a voltage of 0 V. The load capacity CL1 is discharged at higher speeds. The low level output voltage is decreased.

Figure 17:
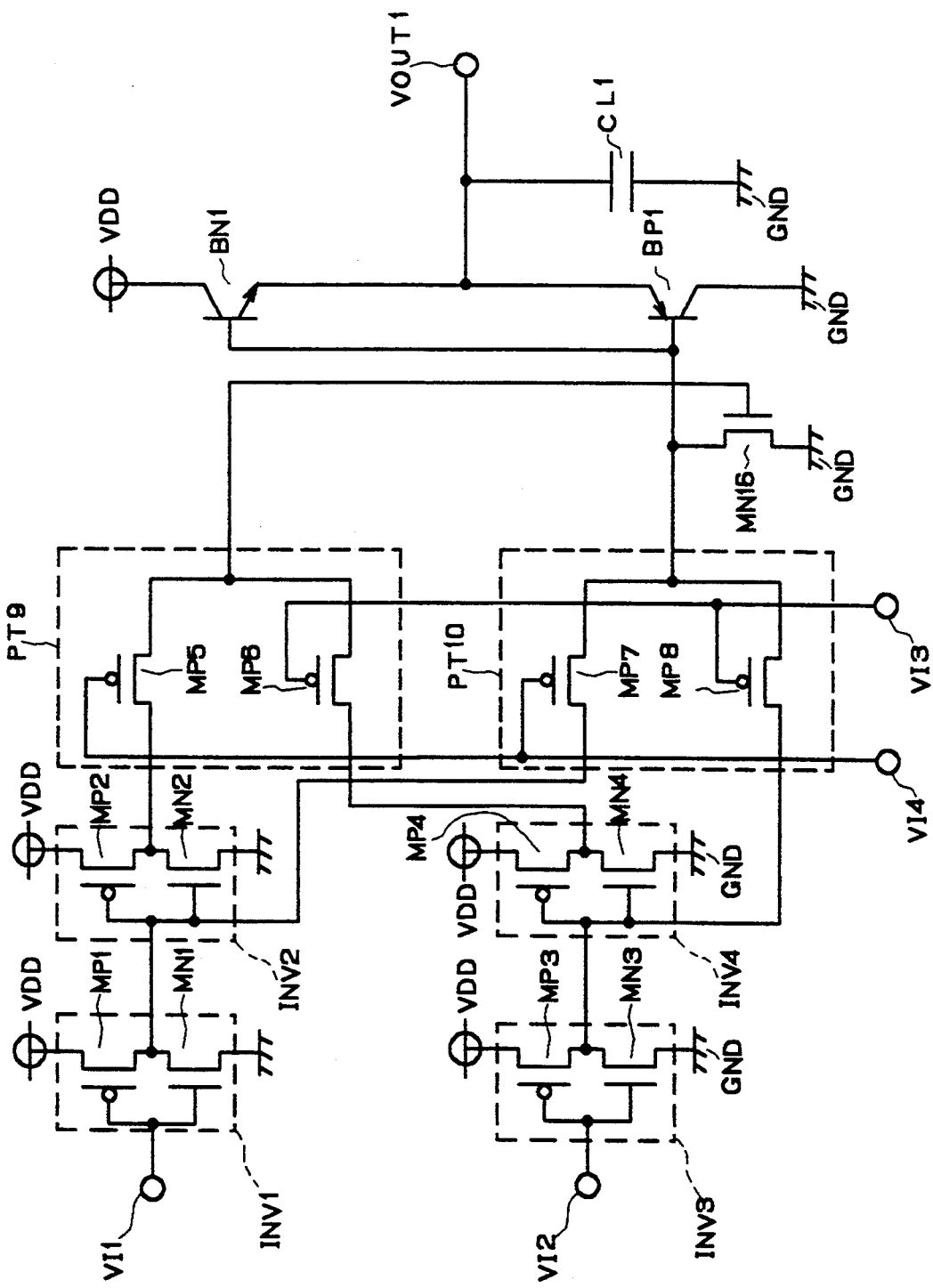
FIG. 17 is a circuit diagram of the two-input selector circuit according to a seventeenth preferred embodiment of the present invention.

Referring to FIG. 17, the semiconductor integrated circuit according to a seventeenth preferred embodiment of the present invention will be described hereinafter. FIG. 17 is a circuit diagram of the two-input selector circuit of the seventeenth preferred embodiment according to the present invention. In FIG. 17, MP5 and MP6 designate PMOS transistors forming a pass transistor circuit PT9; MP7 and MP8 designate PMOS transistors forming a pass transistor circuit PT10; and MN16 designates an NMOS transistor having a gate electrode connected to the drain electrode of the PMOS transistors MP5 and MP6 which is the output of the pass transistor circuit PT9. Elements of FIG. 17 identical with or corresponding to those of FIG. 16 are designated by the same reference characters. The two-input selector circuit of the seventeenth preferred embodiment differs from that of the sixteenth preferred embodiment in that the gate electrode of the NMOS transistor MN16 is connected to the output of the pass transistor circuit PT9 in the circuit of the seventeenth preferred embodiment.

Figure 18:
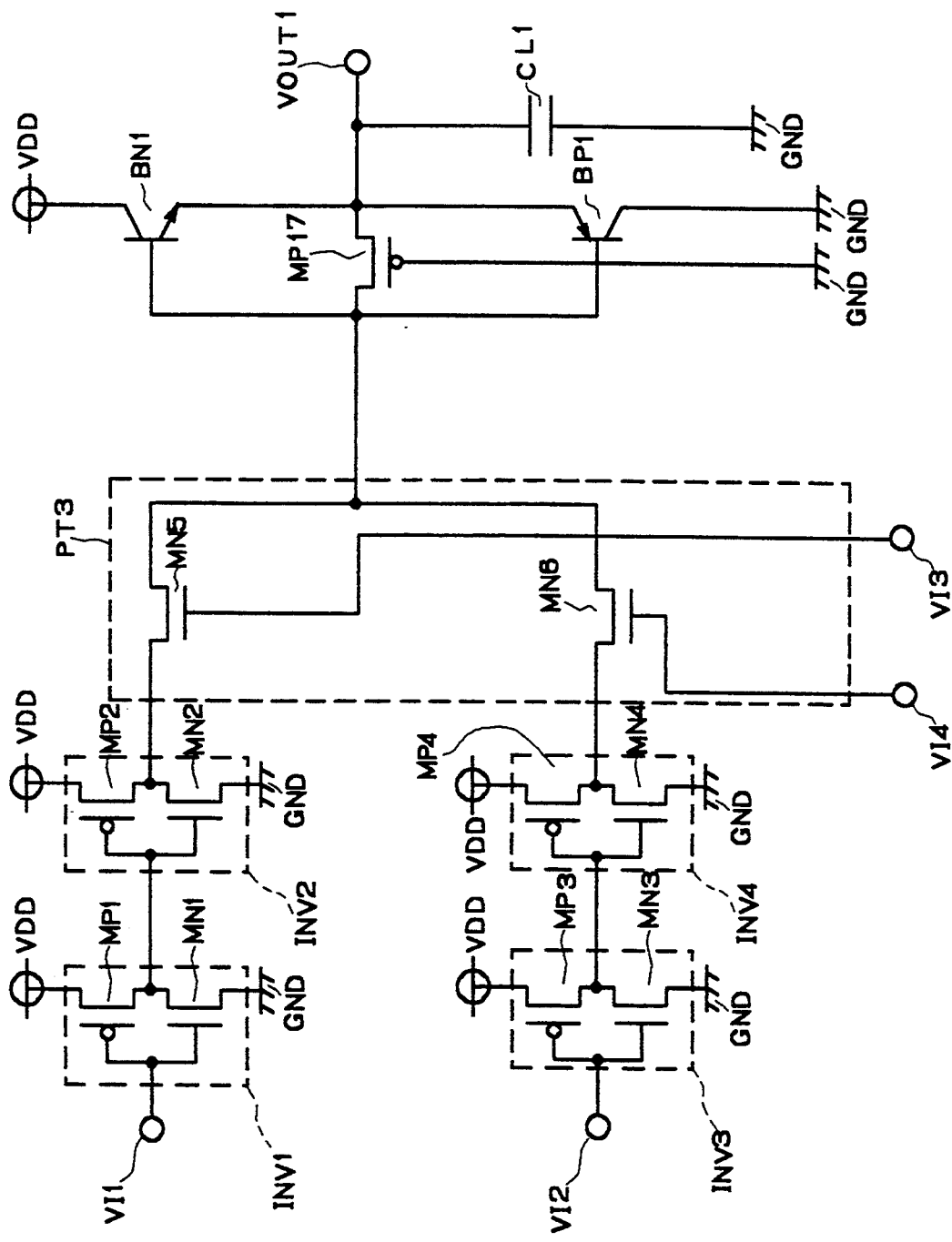
FIG. 18 is a circuit diagram of the two-input selector circuit according to an eighteenth preferred embodiment of the present invention.

Referring to FIG. 18, the semiconductor integrated circuit according to an eighteenth preferred embodiment of the present invention will be described hereinafter. FIG. 18 is a circuit diagram of the two-input selector circuit of the eighteenth preferred embodiment according to the present invention. In FIG. 18, MP17 designates a PMOS transistor having source and drain electrodes connected to the base and emitter electrodes of an NPN bipolar transistor BN1. Elements of FIG. 18 identical with or corresponding to those of FIG. 12 are designated by the same reference characters. The two-input selector circuit of the eighteenth preferred embodiment differs from that of the twelfth preferred embodiment in that the circuit of the eighteenth preferred embodiment comprises the PMOS transistor MP17. When the NPN bipolar transistor BN1 whose base electrode is at the high level turns on, the PMOS transistor MP17 also turns on to function to charge the potential at the emitter electrode of the NPN bipolar transistor BN1 up to the potential at the base electrode. Other operations of the two-input selector circuit are identical with those of the twelfth preferred embodiment.

Figure 19:
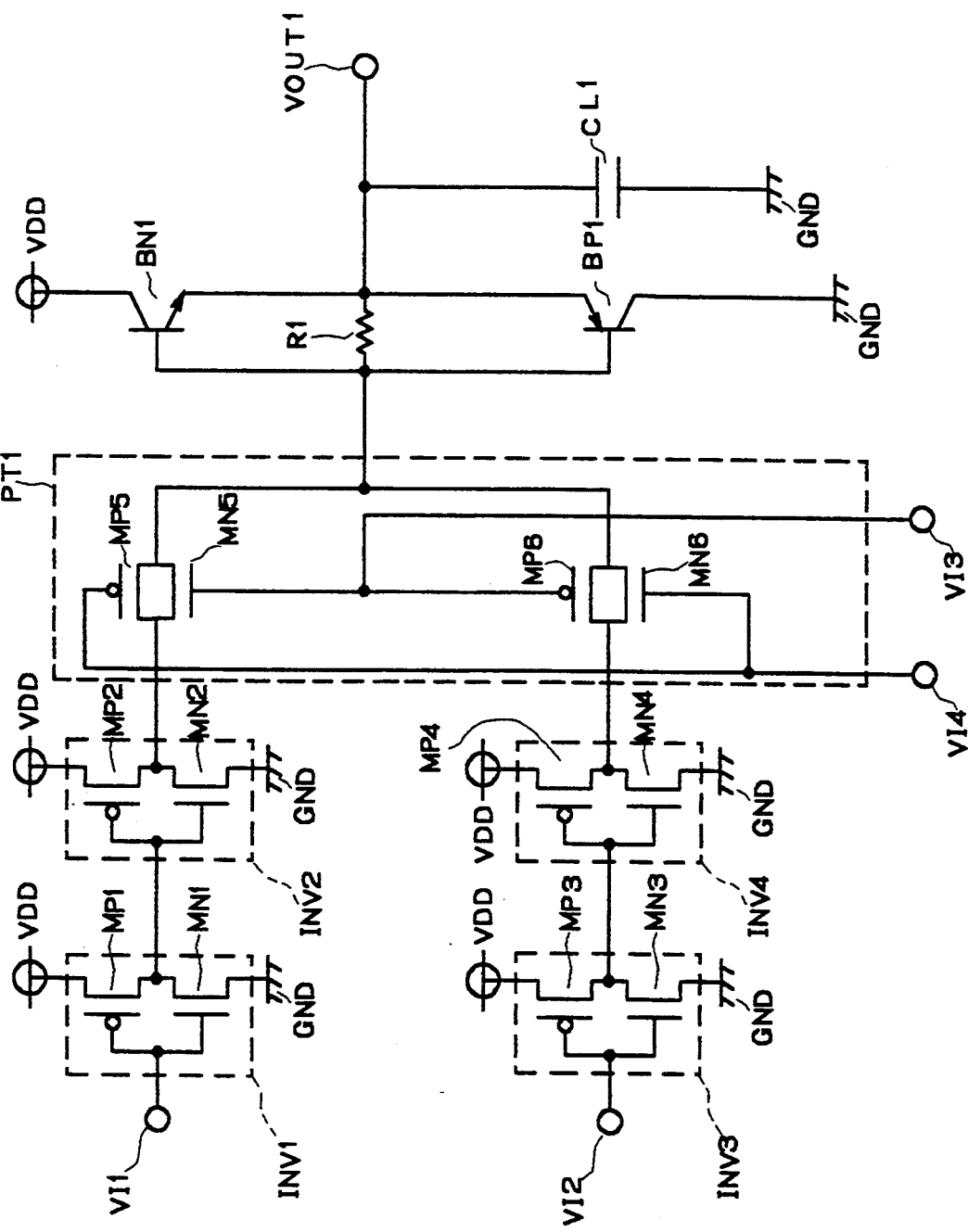
FIG. 19 is a circuit diagram of the two-input selector circuit according to a nineteenth preferred embodiment of the present invention.

Referring to FIG. 19, the semiconductor integrated circuit according to a nineteenth preferred embodiment of the present invention will be described hereinafter. FIG. 19 is a circuit diagram of the two-input selector circuit of the nineteenth preferred embodiment according to the present invention. In FIG. 19, R1 designates a resistor having first and second ends connected to the base and emitter electrodes of an NPN bipolar transistor BN1. Elements of FIG. 19 identical with or corresponding to those of FIG. 12 are designated by the same reference characters. The two-input selector circuit of the nineteenth preferred embodiment differs from that of the twelfth preferred embodiment in that the circuit of the nineteenth preferred embodiment comprises the resistor R1. When the NPN bipolar transistor BN1 whose base electrode is at the high level turns on, the resistor R1 functions to charge the potential at the emitter electrode of the NPN bipolar transistor BN1 up to the potential at the base electrode. When the PNP bipolar transistor BP1 whose base electrode is at the low level turns on, the resistor R1 functions to discharge the potential at the emitter electrode of the PNP bipolar transistor BP1 to the potential at the base electrode. Other operations of the two-input selector circuit are identical with those of the twelfth preferred embodiment.

Figure 20:
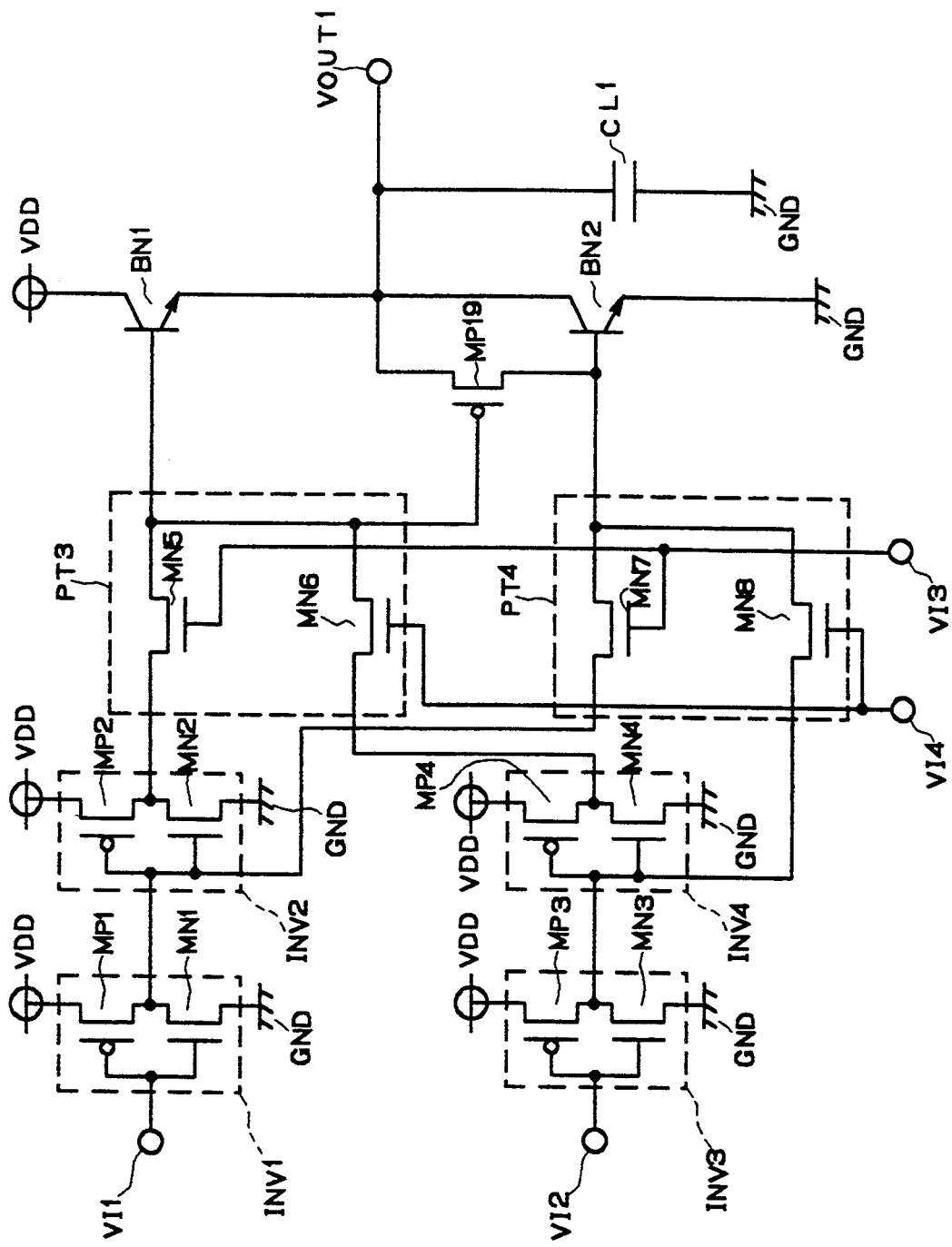
FIG. 20 is a circuit diagram of the two-input selector circuit according to a twentieth preferred embodiment of the present invention.

Referring to FIG. 20, the semiconductor integrated circuit according to a twentieth preferred embodiment of the present invention will be described hereinafter. FIG. 20 is a circuit diagram of the two-input selector circuit of the twentieth preferred embodiment according to the present invention. In FIG. 20, MP19 designates a PMOS transistor; and BN2 designates an NPN bipolar transistor forming a drive circuit with an NPN bipolar transistor BN1. Elements of FIG. 20 identical with or corresponding to those of FIG. 2 are designated by the same reference characters. The two-input selector circuit of the twentieth preferred embodiment differs from that of the second preferred embodiment in that the drive circuit includes the bipolar transistors of the same conductivity type in the circuit of the twentieth preferred embodiment. The PMOS transistor MP19 has a gate electrode receiving the output of a pass transistor circuit PT3, and source and drain electrodes connected to the collector and base electrodes of an NPN bipolar transistor BN2. The PMOS transistor MP19 turns on when the NPN bipolar transistor BN2 turns on, to alleviate the saturation of the NPN bipolar transistor BN2. Other operations of the two-input selector circuit are identical with those of the second preferred embodiment.

Figure 21:
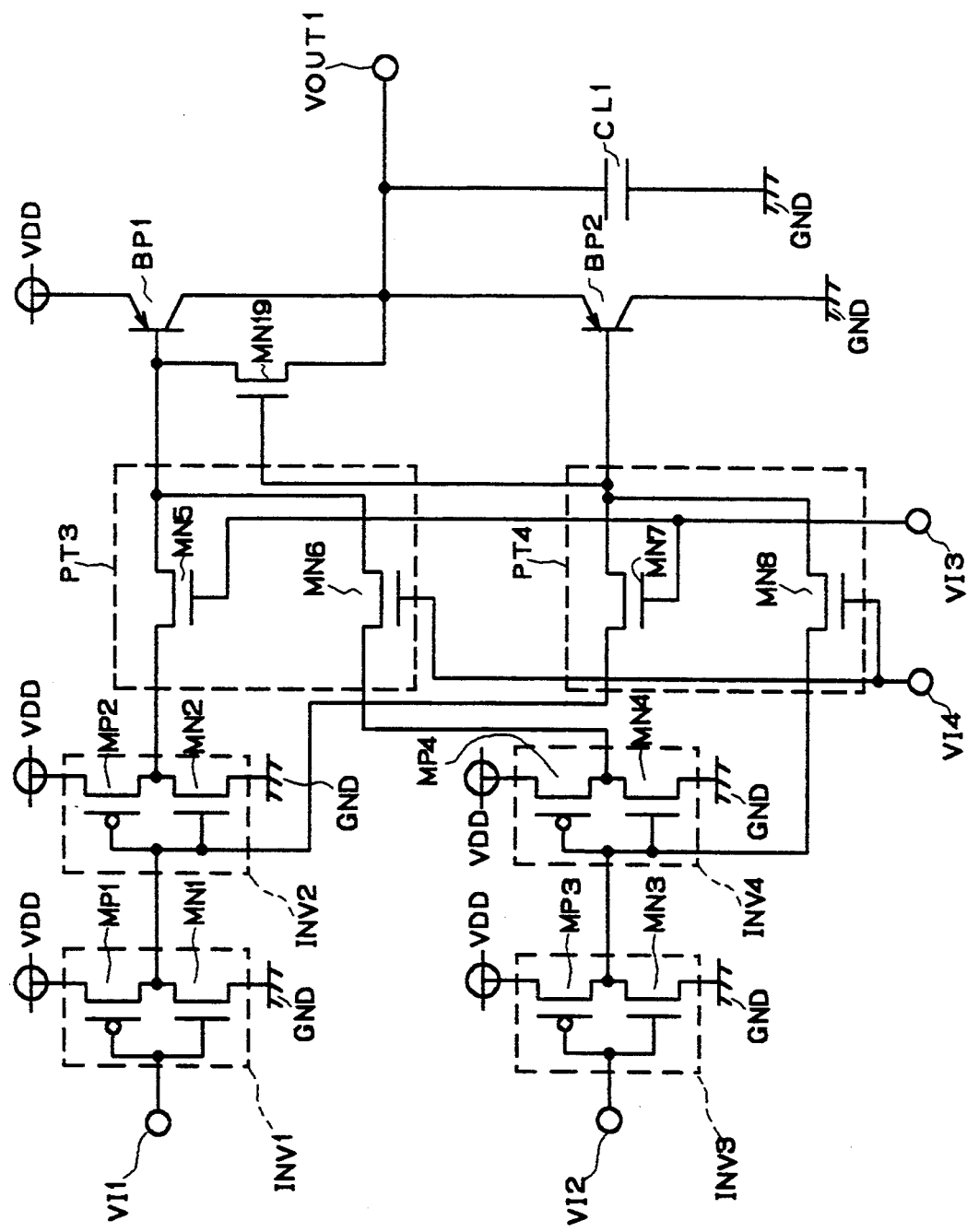
FIG. 21 is a circuit diagram of the two-input selector circuit according to a twenty-first preferred embodiment of the present invention.

Referring to FIG. 21, the semiconductor integrated circuit according to a twenty-first preferred embodiment of the present invention will be described hereinafter. FIG. 21 is a circuit diagram of the two-input selector circuit of the twenty-first preferred embodiment according to the present invention. In FIG. 21, MN19 designates an NMOS transistor; and BP1, BP2 designate PNP bipolar transistors forming a drive circuit. Elements of FIG. 21 identical with or corresponding to those of FIG. 2 are designated by the same reference characters. The two-input selector circuit of the twenty-first preferred embodiment differs from that of the second preferred embodiment in that the drive circuit includes the bipolar transistors of the same conductivity type in the circuit of the twenty-first preferred embodiment. The NMOS transistor MN19 has a gate electrode receiving the output of a pass transistor circuit PT4, and source and drain electrodes connected to the collector and base electrodes of the PNP bipolar transistor BP1. The NMOS transistor MN19 turns on when the PNP bipolar transistor BP1 turns on, to alleviate the saturation of the PNP bipolar transistor BP1. Other operations of the two-input selector circuit are identical with those of the second preferred embodiment.

Figure 22:
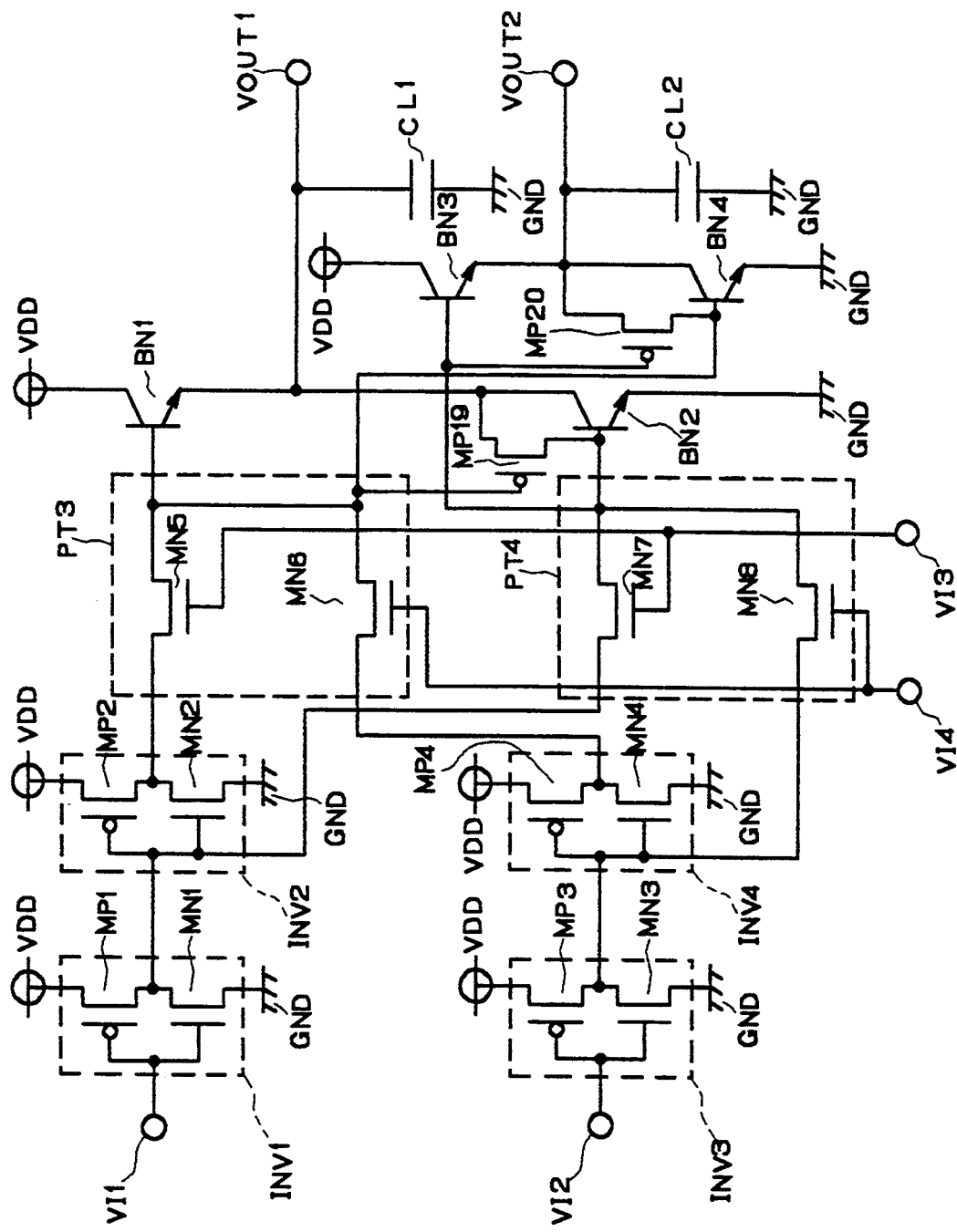
FIG. 22 is a circuit diagram of the two-input selector circuit according to a twenty-second preferred embodiment of the present invention.

Referring to FIG. 22, the semiconductor integrated circuit according to a twenty-second preferred embodiment of the present invention will be described hereinafter. FIG. 22 is a circuit diagram of the two-input selector circuit of the twenty-second preferred embodiment according to the present invention. In FIG. 22, MP19 and MP20 designate PMOS transistors; BN2 designates an NPN bipolar transistor forming a first drive circuit with an NPN bipolar transistor BN1; and BN4 designates an NPN bipolar transistor forming a second drive circuit with an NPN bipolar transistor BN3. Elements of FIG. 22 identical with or corresponding to those of FIG. 5 are designated by the same reference characters. The two-input selector circuit of the twenty-second preferred embodiment differs from that of the fifth preferred embodiment in that the drive circuit includes the bipolar transistors of the same conductivity type in the circuit of the twenty-second preferred embodiment. The PMOS transistors MP19 and MP20 have a gate electrode receiving the output of the pass transistor circuits PT3 and PT4, and source and drain electrodes connected to the collector and base electrodes of the NPN bipolar transistors BN2 and BN4. The PMOS transistors MP19 and MP20 turn on when the NPN bipolar transistors BN2 and BN4 turns on, respectively, to alleviate the saturation of the NPN bipolar transistors BN2 and BN4. Other operations of the two-input selector circuit are identical with those of the fifth preferred embodiment.

Figure 23:
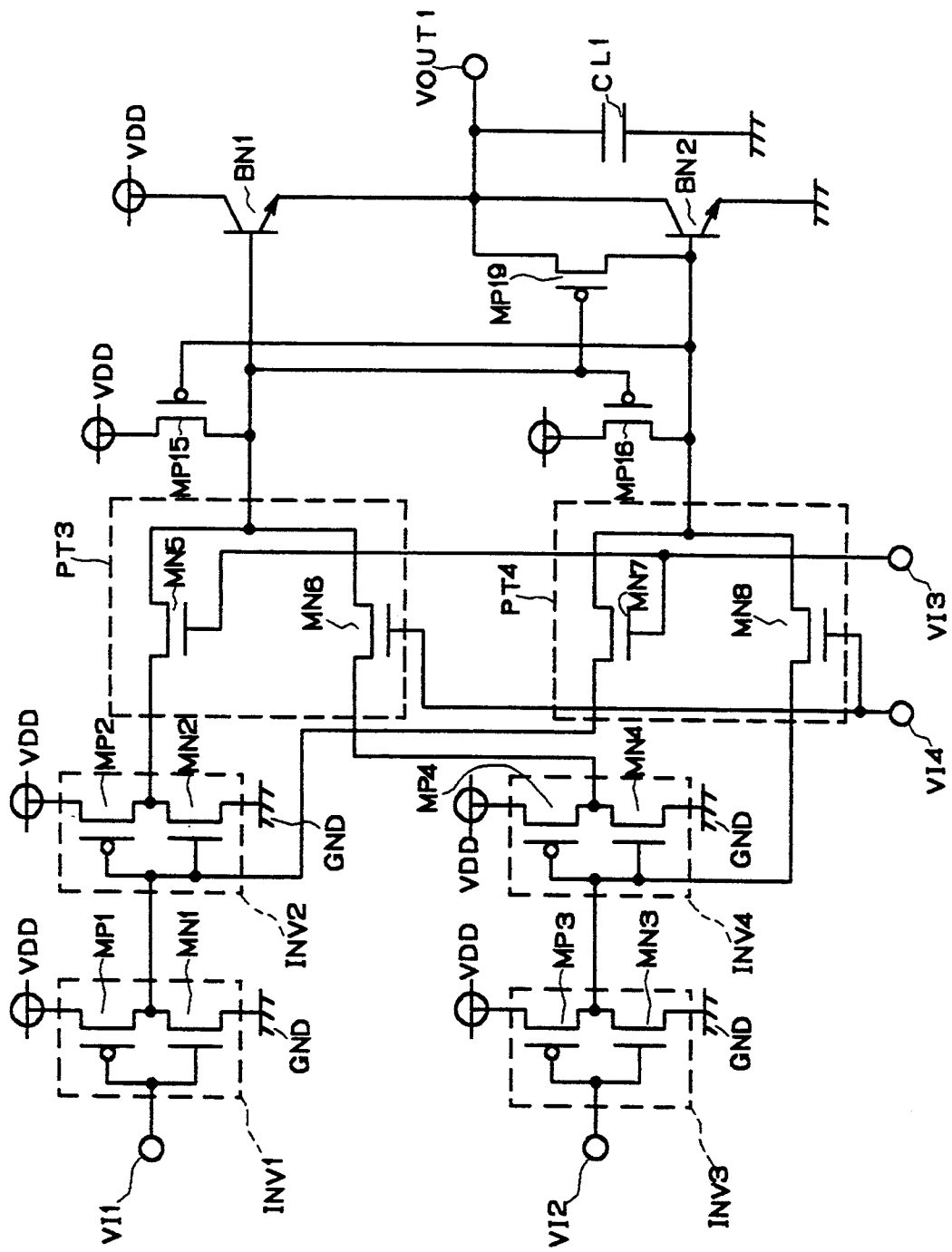
FIG. 23 is a circuit diagram of the two-input selector circuit according to a twenty-third preferred embodiment of the present invention.

Referring to FIG. 23, the semiconductor integrated circuit according to a twenty-third preferred embodiment of the present invention will be described hereinafter. FIG. 23 is a circuit diagram of the two-input selector circuit of the twenty-third preferred embodiment according to the present invention. In FIG. 23, MP19 designates a PMOS transistor; and BN2 designates an NPN bipolar transistor forming a drive circuit with an NPN bipolar transistor BN1. Elements of FIG. 23 identical with or corresponding to those of FIG. 6 are designated by the same reference characters. The two-input selector circuit of the twenty-third preferred embodiment differs from that of the sixth preferred embodiment in that the drive circuit includes the bipolar transistors of the same conductivity type in the circuit of the twenty-third preferred embodiment. The PMOS transistor MP19 has a gate electrode receiving the output of the pass transistor circuit PT3, and source and drain electrodes connected to the collector and base electrodes of the NPN bipolar transistor BN2. The PMOS transistor MP19 turns on when the NPN bipolar transistor BN2 turns on, to alleviate the saturation of the NPN bipolar transistor BN2. Other operations of the two-input selector circuit are identical with those of the sixth preferred embodiment.

Figure 24:
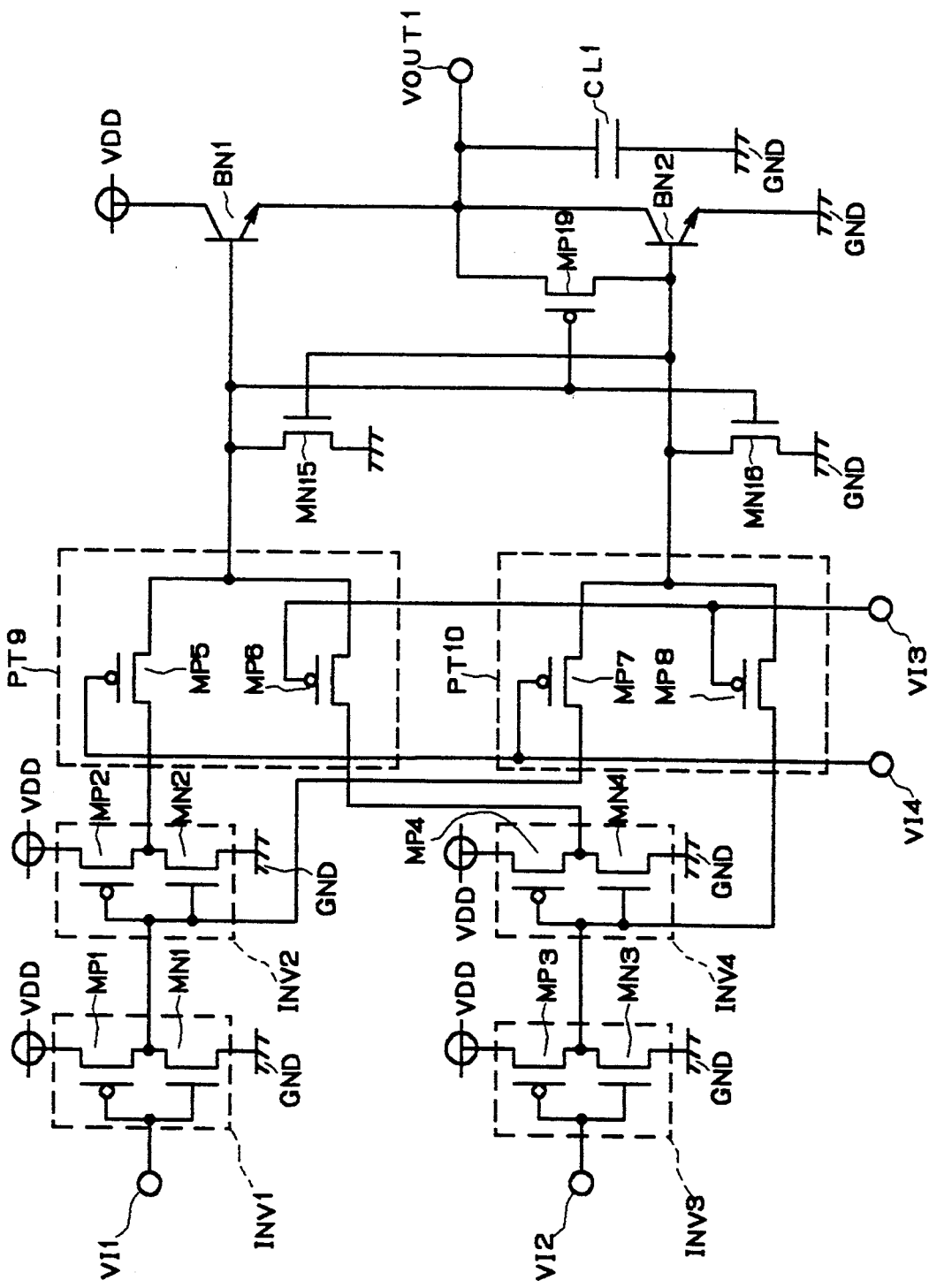
FIG. 24 is a circuit diagram of the two-input selector circuit according to a twenty-fourth preferred embodiment of the present invention.

Referring to FIG. 24, the semiconductor integrated circuit according to a twenty-fourth preferred embodiment of the present invention will be described hereinafter. FIG. 24 is a circuit diagram of the two-input selector circuit of the twenty-fourth preferred embodiment according to the present invention. In FIG. 24, MP19 designates a PMOS transistor; and BN2 designates an NPN bipolar transistor forming a drive circuit with an NPN bipolar transistor BN1. Elements of FIG. 24 identical with or corresponding to those of FIG. 7 are designated by the same reference characters. The two-input selector circuit of the twenty-fourth preferred embodiment differs from that of the seventh preferred embodiment in that the drive circuit includes the bipolar transistors of the same conductivity type in the circuit of the twenty-fourth preferred embodiment. The PMOS transistor MP19 has a gate electrode receiving the output of the pass transistor circuit PT9, and source and drain electrodes connected to the collector and base electrodes of the NPN bipolar transistor BN2. The PMOS transistor MP19 turns on when the NPN bipolar transistor BN2 turns on, to alleviate the saturation of the NPN bipolar transistor BN2. Other operations of the two-input selector circuit are identical with those of the seventh preferred embodiment.

Figure 25:
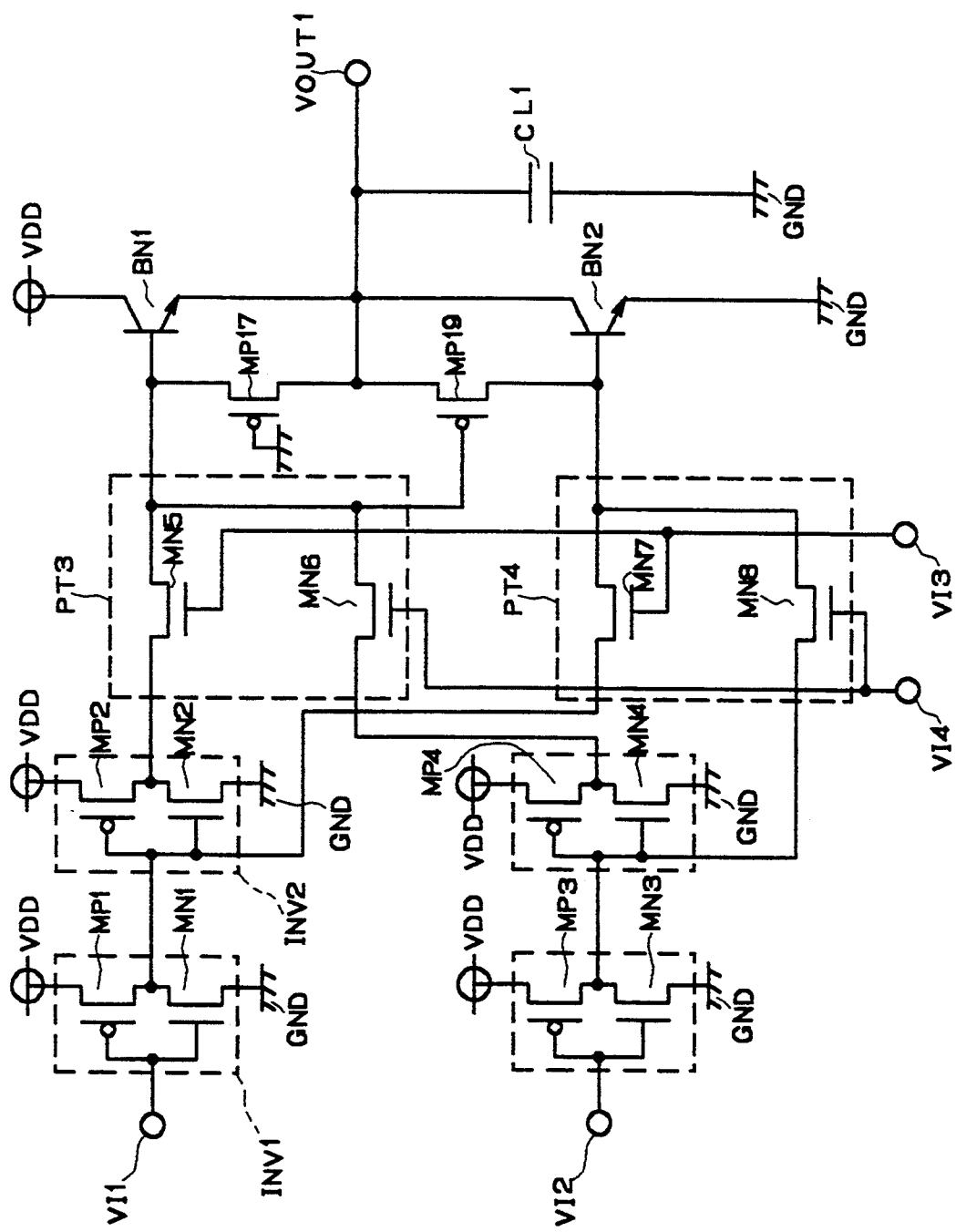
FIG. 25 is a circuit diagram of the two-input selector circuit according to a twenty-fifth preferred embodiment of the present invention.

Referring to FIG. 25, the semiconductor integrated circuit according to a twenty-fifth preferred embodiment of the present invention will be described hereinafter. FIG. 25 is a circuit diagram of the two-input selector circuit of the twenty-fifth preferred embodiment according to the present invention. In FIG. 25, MP19 designates a PMOS transistor; and BN2 designates an NPN bipolar transistor forming a drive circuit with an NPN bipolar transistor BN1. Elements of FIG. 25 identical with or corresponding to those of FIG. 8 are designated by the same reference characters. The two-input selector circuit of the twenty-fifth preferred embodiment differs from that of the eighth preferred embodiment in that the drive circuit includes the bipolar transistors of the same conductivity type in the circuit of the twenty-fifth preferred embodiment. The PMOS transistor MP19 has a gate electrode receiving the output of the pass transistor circuit PT3, and source and drain electrodes connected to the collector and base electrodes of the NPN bipolar transistor BN2. The PMOS transistor MP19 turns on when the NPN bipolar transistor BN2 turns on, to alleviate the saturation of the NPN bipolar transistor BN2. Other operations of the two-input selector circuit are identical with those of the eighth preferred embodiment.

Figure 26:
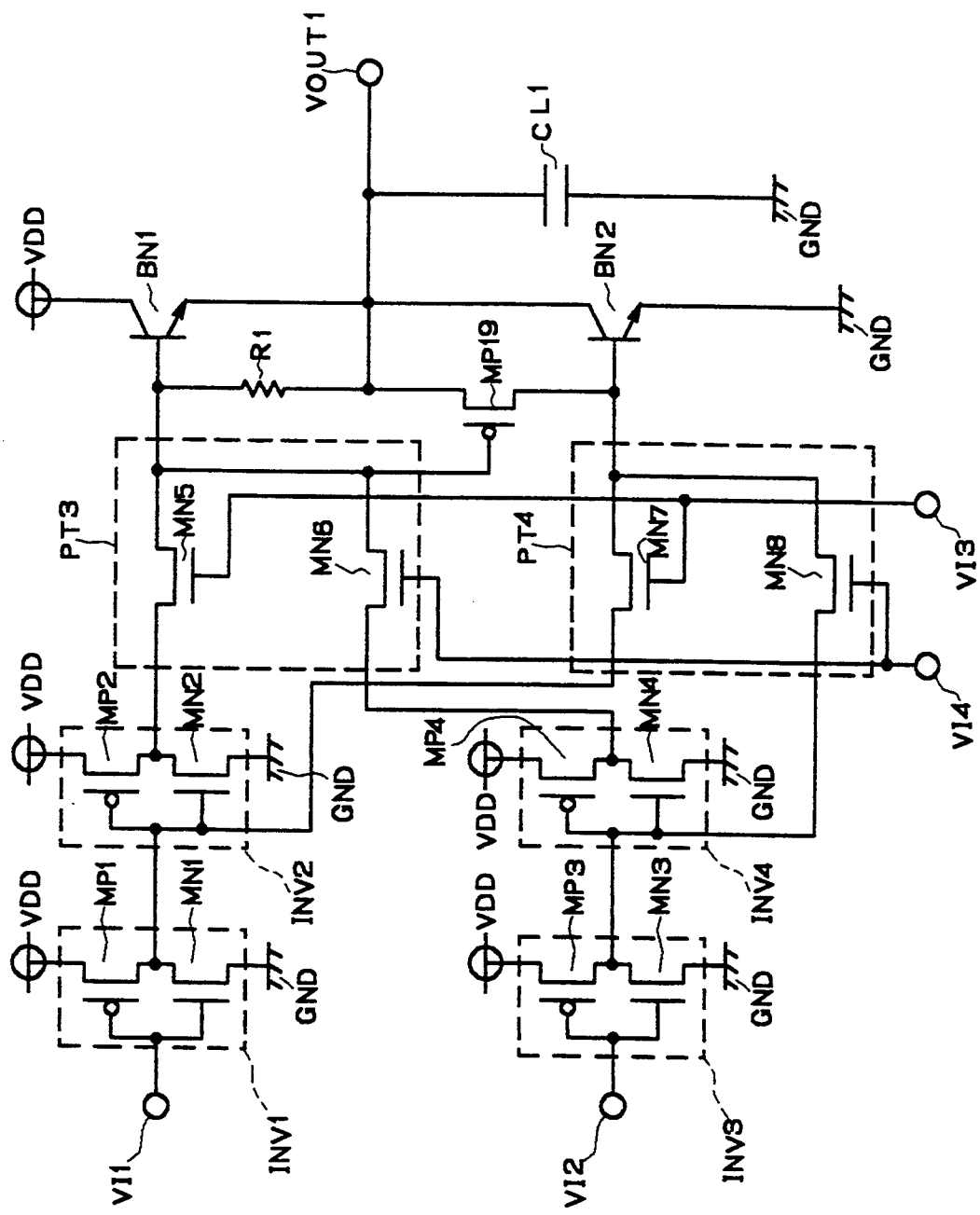
FIG. 26 is a circuit diagram of the two-input selector circuit according to a twenty-sixth preferred embodiment of the present invention.

Referring to FIG. 26, the semiconductor integrated circuit according to a twenty-sixth preferred embodiment of the present invention will be described hereinafter. FIG. 26 is a circuit diagram of the two-input selector circuit of the twenty-sixth preferred embodiment according to the present invention. In FIG. 26, MP19 designates a PMOS transistor; and BN2 designates an NPN bipolar transistor forming a drive circuit with an NPN bipolar transistor BN1. Elements of FIG. 26 identical with or corresponding to those of FIG. 9 are designated by the same reference characters. The two-input selector circuit of the twenty-sixth preferred embodiment differs from that of the ninth preferred embodiment in that the drive circuit includes the bipolar transistors of the same conductivity type in the circuit of the twenty-sixth preferred embodiment. The PMOS transistor MP19 has a gate electrode receiving the output of the pass transistor circuit PT3, and source and drain electrodes connected to the collector and base electrodes of the NPN bipolar transistor BN2. The PMOS transistor MP19 turns on when the NPN bipolar transistor BN2 turns on, to alleviate the saturation of the NPN bipolar transistor BN2. Other operations of the two-input selector circuit are identical with those of the ninth preferred embodiment.

Figure 27:
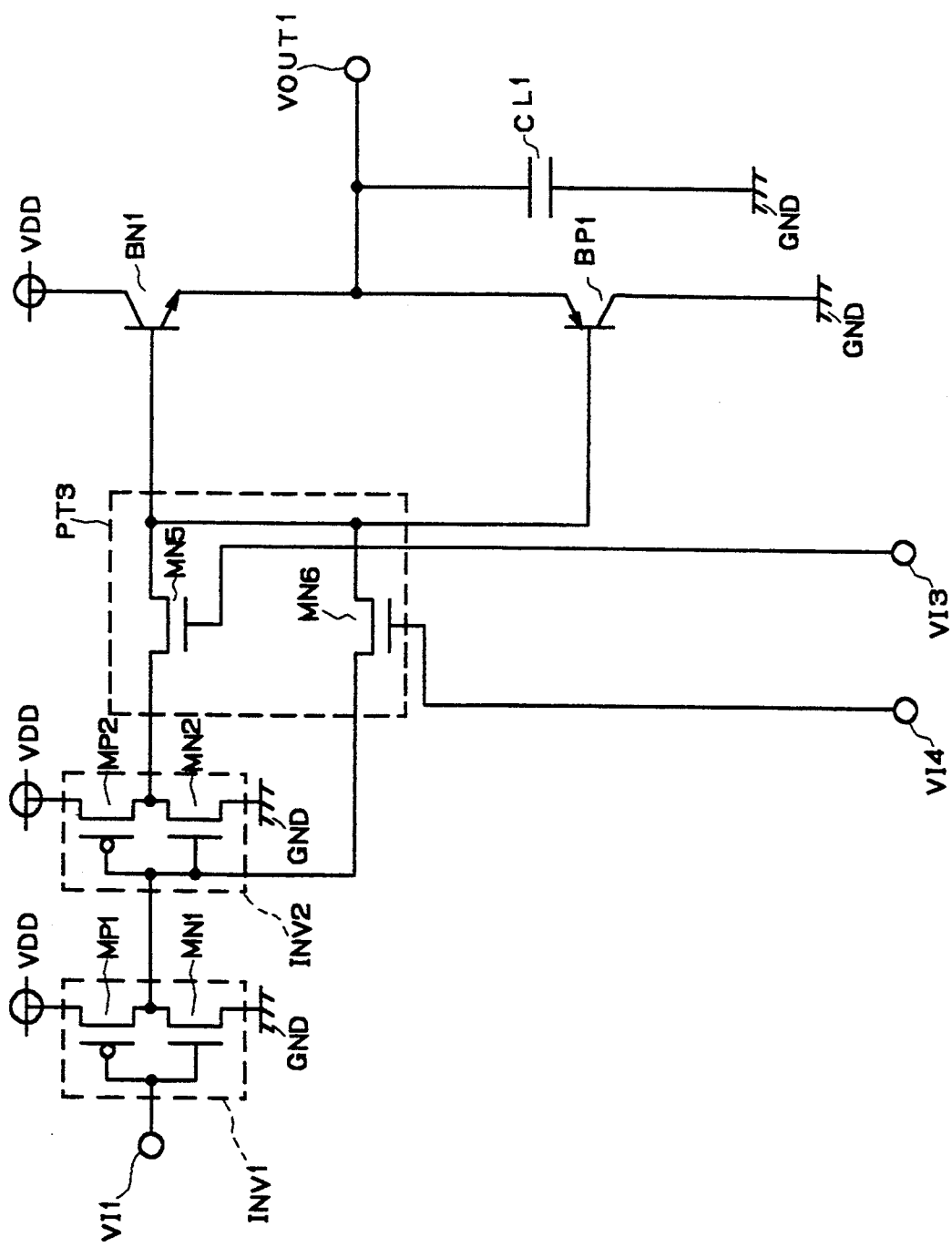
FIG. 27 is a circuit diagram of the exclusive-NOR circuit according to a twenty-seventh preferred embodiment of the present invention.

Referring to FIG. 27, the semiconductor integrated circuit according to a twenty-seventh preferred embodiment of the present invention will be described hereinafter. FIG. 27 is a circuit diagram of the exclusive-NOR circuit of the twenty-seventh preferred embodiment according to the present invention. In FIG. 27, MP1 and MP2 designate PMOS transistors; MN1 to MN6 designate NMOS transistors; BN1 designates a first NPN bipolar transistor; BP1 designates a first PNP bipolar transistor; VI1 designates a first input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. The NMOS transistors MN5 and MN6 form a pass transistor circuit PT3. The NPN bipolar transistor BN1 and the PNP bipolar transistor BP1 form a drive circuit. The drain or source electrode of the NMOS transistors MN5, MN6 is connected to the base electrode of the NPN bipolar transistor BN1 and the PNP bipolar transistor BP1.

Operations of the exclusive-NOR circuit of FIG. 27 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors that have a threshold voltage of $-0.5$ V turn on when the voltage of the gate electrode thereof is lower than that of the source electrode thereof by 0.5 V or more. The NMOS transistors that have a threshold voltage of 0.5 V turn on when the voltage of the gate electrode thereof is higher than that of the source electrode thereof by 0.5 V or more. The NPN bipolar transistor BN1 turns on when the voltage of the base electrode thereof is higher than that of the emitter electrode by 0.8 V or more. The PNP bipolar transistor BP1 turns on when the voltage of the base electrode thereof is lower than that of the emitter electrode by 0.8 V or more.

When a low level signal is applied to the third input terminal VI3, the NMOS transistor MN5 turns off, and the NMOS transistor MN6 turns on since a high level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the base electrodes of the NPN bipolar transistor BN1 and PNP bipolar transistor enter the low level through the NMOS transistor MN6. The NPN bipolar transistor BN1 whose base electrode is at the low level turns off, and the PNP bipolar transistor BP1 whose base electrode is at the low level turns on. The load capacity CL1 of the output terminal VOUT1 is discharged at high speeds to 0.8 V that is higher than the second power supply voltage GND by the amount of the base-emitter voltage (0.8 V or less) thereof. Thus the output terminal VOUT1 is at the low level.

If a low level signal is applied to the input terminal VI1, the PMOS transistor MP1 turns on and the NMOS transistor MN1 turns off, so that the inverter circuit INV1 outputs a high level signal. Then, the base electrodes of the NPN bipolar transistor BN1 and PNP bipolar transistor BP1 have a voltage of 4.5 V through the NMOS transistor MN6. The NPN bipolar transistor BN1 whose base electrode has a voltage of 4.5 V turns on, and the PNP bipolar transistor BP1 whose base electrode has a voltage of 4.5 V turns off. The load capacity CL1 of the output terminal VOUT1 is charged up to 3.7 V at high speeds.

When a high level signal is applied to the third input terminal VI3, the NMOS transistor MN5 turns on, and the NMOS transistor MN6 turns off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Since the input of the inverter circuit INV2 is at the low level, the NMOS transistor MN2 turns off and the PMOS transistor MP2 turns on, so that the base electrodes of the NPN bipolar transistor BN1 and PNP bipolar transistor BP1 have a voltage of 4.5 V that is lower than the power supply voltage VDD (5.0 V) by the amount of the threshold voltage of the NMOS transistor MN5 through the NMOS transistor MN5. The NPN bipolar transistor BN1 whose base electrode is at the high level turns on, and the PNP bipolar transistor BP1 whose base electrode is at the high level turns off. The load capacity CL1 of the output terminal VOUT1 is charged at high speeds up to 3.7 V that is lower than the potential at the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Since the input of the inverter circuit INV2 is at the high level, the NMOS transistor MN2 turns on and the PMOS transistor MP2 turns off, so that the base electrodes of the NPN bipolar transistor BN1 and PNP bipolar transistor BP1 enter the low level through the NMOS transistor MN5. The NPN bipolar transistor BN1 whose base electrode is at the low level turns off, and the PNP bipolar transistor BP1 whose base electrode is at the low level turns on. The load capacity CL1 of the output terminal VOUT1 is discharged to 0.8 V at high speeds. Thus the output terminal VOUT1 is at the low level.

The circuit of FIG. 27 is an exclusive-NOR circuit which outputs the high level signal only when both of the signals applied to the input terminals VI1 and VI3 are at the high or low level. The exclusive-NOR circuit of the twenty-seventh preferred embodiment is achieved such that the element on the pull-down side includes the PNP bipolar transistor BP1 in the logic circuit of the eleventh preferred embodiment.

Figure 28:
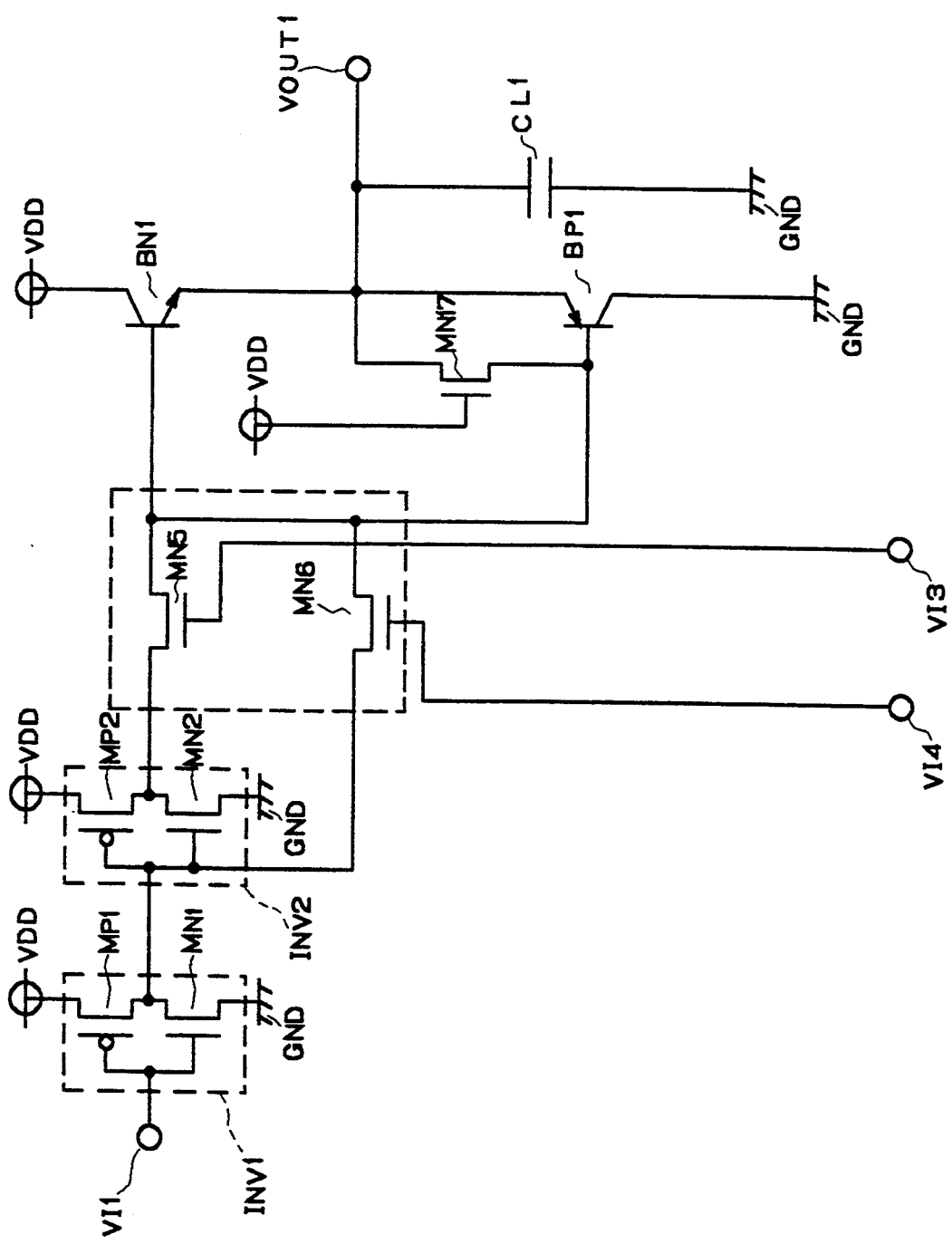
FIG. 28 is a circuit diagram of the exclusive-NOR circuit according to a twenty-eighth preferred embodiment of the present invention.

Referring to FIG. 28, the semiconductor integrated circuit according to a twenty-eighth preferred embodiment of the present invention will be described hereinafter. FIG. 28 is a circuit diagram of the exclusive-NOR circuit of the twenty-eighth preferred embodiment according to the present invention. In the circuit of FIG. 28, an NMOS transistor is connected to the PNP bipolar transistor of the exclusive-NOR circuit of the twenty-seventh preferred embodiment. The voltage of the emitter electrode is fixed to a voltage lower than that of the base electrode by 0.8 V or less when the PNP bipolar transistor BP1 is on. In the exclusive-NOR circuit of the twenty-eighth preferred embodiment, an NMOS transistor MN17 whose gate electrode is connected to the first power supply VDD is connected to the base and emitter electrodes of the PNP bipolar transistor BP1 so as to equalize the voltages of the emitter and base electrodes.

Figure 29:
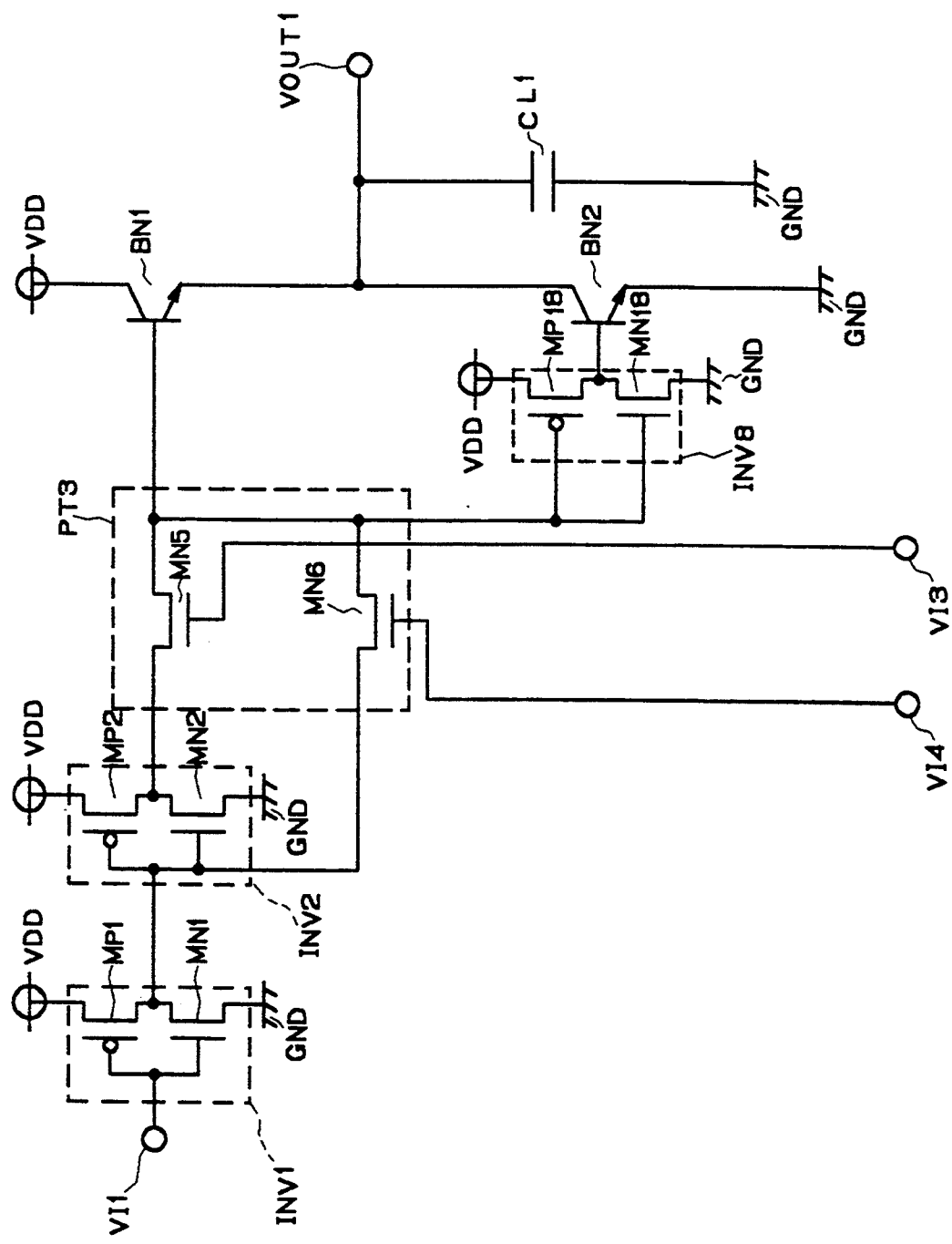
FIG. 29 is a circuit diagram of the exclusive-NOR circuit according to a twenty-ninth preferred embodiment of the present invention.

Referring to FIG. 29, the semiconductor integrated circuit according to a twenty-ninth preferred embodiment of the present invention will be described hereinafter. FIG. 29 is a circuit diagram of the exclusive-NOR circuit of the twenty-ninth preferred embodiment according to the present invention. In FIG. 29, MP1, MP2 and MP18 designate PMOS transistors; MN1, MN2, MN5, MN6 and MN18 designate NMOS transistors; BN1 designates a first NPN bipolar transistor; BN2 designates a second NPN bipolar transistor; VI1 designates a first input terminal; VI3 designates a third input terminal; VI4 designates a fourth input terminal; VOUT1 designates a first output terminal; VDD designates a first power supply of 5.0 V; GND designates a second power supply of 0 V; and CL1 designates a first load capacity. The PMOS transistor MP1 and the NMOS transistor MN1 form a first inverter circuit INV1, and the PMOS transistor MP2 and the NMOS transistor MN2 form a second inverter circuit INV2. The first and second inverter circuits INV1 and INV2 serve as a buffer circuit for a signal inputted to the input terminal VI1. The NMOS transistors MN5 and MN6 form a pass transistor circuit PT3.

Operations of the exclusive-NOR circuit of FIG. 29 will be discussed below. A high level signal provides a voltage of 5.0 V, and a low level signal provides a voltage of 0 V. A threshold between the high and low logical levels is 2.5 V. The inverted signal of a signal to be applied to the third input terminal VI3 is applied to the fourth input terminal VI4. The PMOS transistors MP1, MP2 and MP18 that have a threshold voltage of −0.5 V turn on when the voltage of the gate electrode thereof is lower than that of the source electrode thereof by 0.5 V or more. The NMOS transistors MN1, MN2, MN5, MN6 and MN18 that have a threshold voltage of 0.5 V turn on when the voltage of the gate electrode thereof is higher than that of the source electrode thereof by 0.5 V or more. The NPN bipolar transistors BN1 and BN2 turn on when the voltage of the base electrode thereof is higher than that of the emitter electrode by 0.8 V or more.

When a low level signal is applied to the third input terminal VI3, the NMOS transistor MN5 turns off, and the NMOS transistor MN6 turns on since a high level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Then, the base electrode of the NPN bipolar transistor BN1 enters the low level through the NMOS transistor MN6. The PMOS transistor MP18 turns on and the NMOS transistor MN18 turns off, so that the NPN bipolar transistor BN2 turns on. The NPN bipolar transistor BN1 whose base electrode is at the low level turns off. The load capacity CL1 of the output terminal VOUT1 is discharged to 0 V at high speeds. Thus the output terminal VOUT1 is at the low level.

If a low level signal is applied to the input terminal VI1, the PMOS transistor MP1 turns on and the NMOS transistor MN1 turns off, so that the inverter circuit INV1 outputs a high level signal. Then, the base electrode of the NPN bipolar transistor BN1 has a voltage of 4.5 V through the NMOS transistor MN6. The PMOS transistor MP18 turns off and the NMOS transistor MN18 turns on, so that the NPN bipolar transistor BN2 turns off. The NPN bipolar transistor BN1 whose base electrode has a voltage of 4.5 V turns on. The load capacity CL1 of the output terminal VOUT1 is charged up to 3.7 V at high speeds.

When a high level signal is applied to the third input terminal VI3, the NMOS transistor MN5 turns on, and the NMOS transistor MN6 turns off since a low level signal is applied to the fourth input terminal VI4. At that time, if a high level signal is applied to the input terminal VI1, the PMOS transistor MP1 turns off and the NMOS transistor MN1 turns on, so that the inverter circuit INV1 outputs a low level signal. Since the input of the inverter circuit INV2 is at the low level, the NMOS transistor MN2 turns off and the PMOS transistor MP2 turns on, so that the base electrode of the NPN bipolar transistor BN1 has a voltage of 4.5 V that is lower than the power supply voltage VDD (5.0 V) by the amount of the threshold voltage (0.5 V) of the NMOS transistor MN5 through the NMOS transistor MN5. The NMOS transistor MN18 turns on and the PMOS transistor MP18 turns off, so that the NPN bipolar transistor BN2 turns off. The NPN bipolar transistor BN1 whose base electrode is at the high level turns on. The load capacity CL1 of the output terminal VOUT1 is charged at high speeds up to 3.7 V that is lower than the potential of the base electrode of the bipolar transistor BN1 by the amount of the base-emitter voltage (0.8 V or less) thereof. Thus the output terminal VOUT1 is at the high level.

If a low level signal is applied to the input terminal VI1, the PMOS transistor MP1 turns on and the NMOS transistor MN1 turns off, so that the inverter circuit INV1 outputs a high level signal. Since the input of the inverter circuit INV2 is at the high level, the NMOS transistor MN2 turns on and the PMOS transistor MP2 turns off, so that the base electrode of the NPN bipolar transistor BN1 enters the low level through the NMOS transistor MN5. The NMOS transistor MN18 turns off and the PMOS transistor MP18 turns on, so that the NPN bipolar transistor BN2 turns on. The NPN bipolar transistor BN1 whose base electrode is at the low level turns off. The load capacity CL1 of the output terminal VOUT1 is discharged to 0 V at high speeds. Thus the output terminal VOUT1 is at the low level.

The circuit of FIG. 29 is an exclusive-NOR circuit which outputs the high level signal only when both of the signals applied to the input terminals VI1 and VI3 are at the high or low level. The NPN bipolar transistors BN1 and BN2 are used for driving the elements on both the pull-up and pull-down sides.

Figure 30:
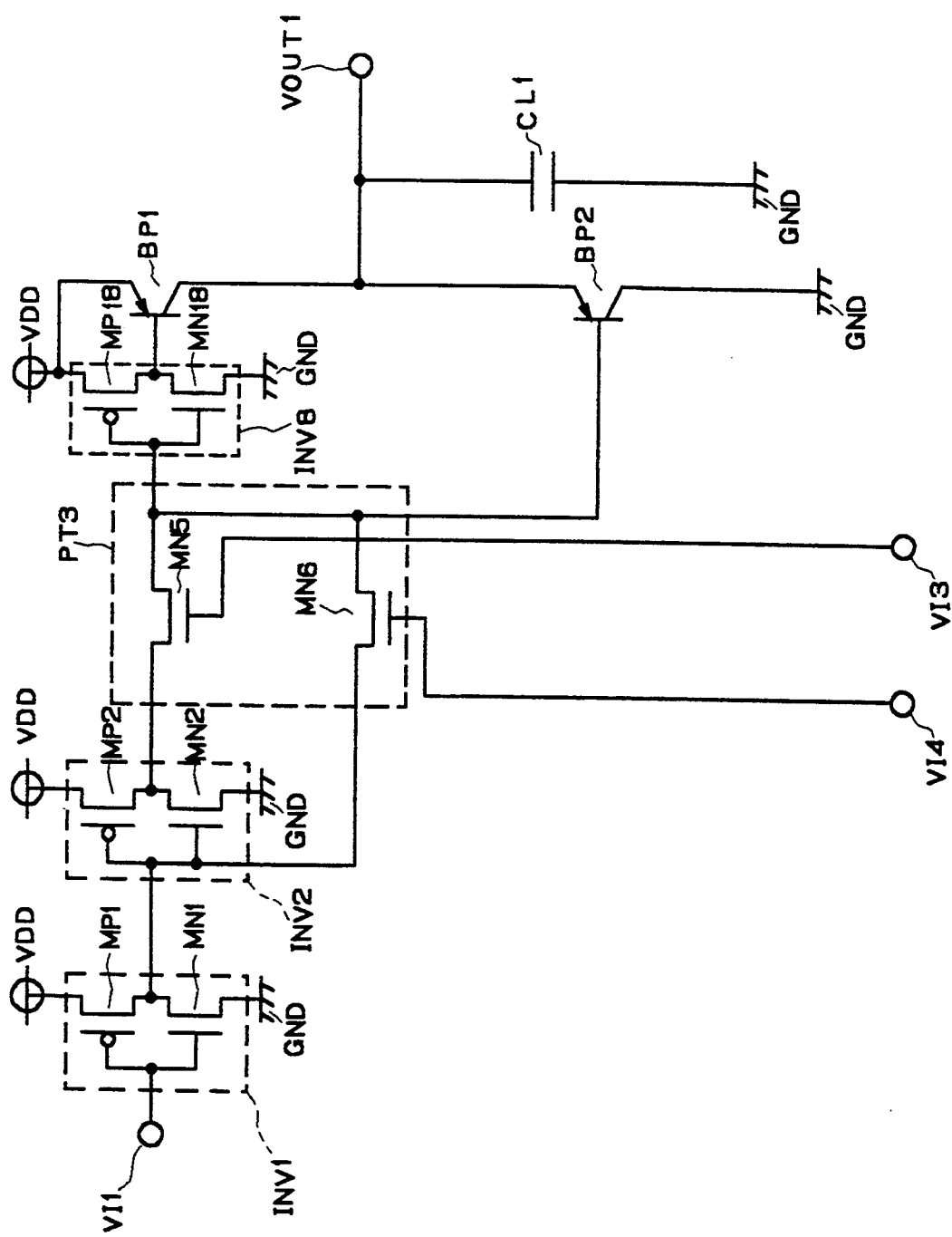
FIG. 30 is a circuit diagram of the exclusive-NOR circuit according to a thirtieth preferred embodiment of the present invention.
Figure 31:
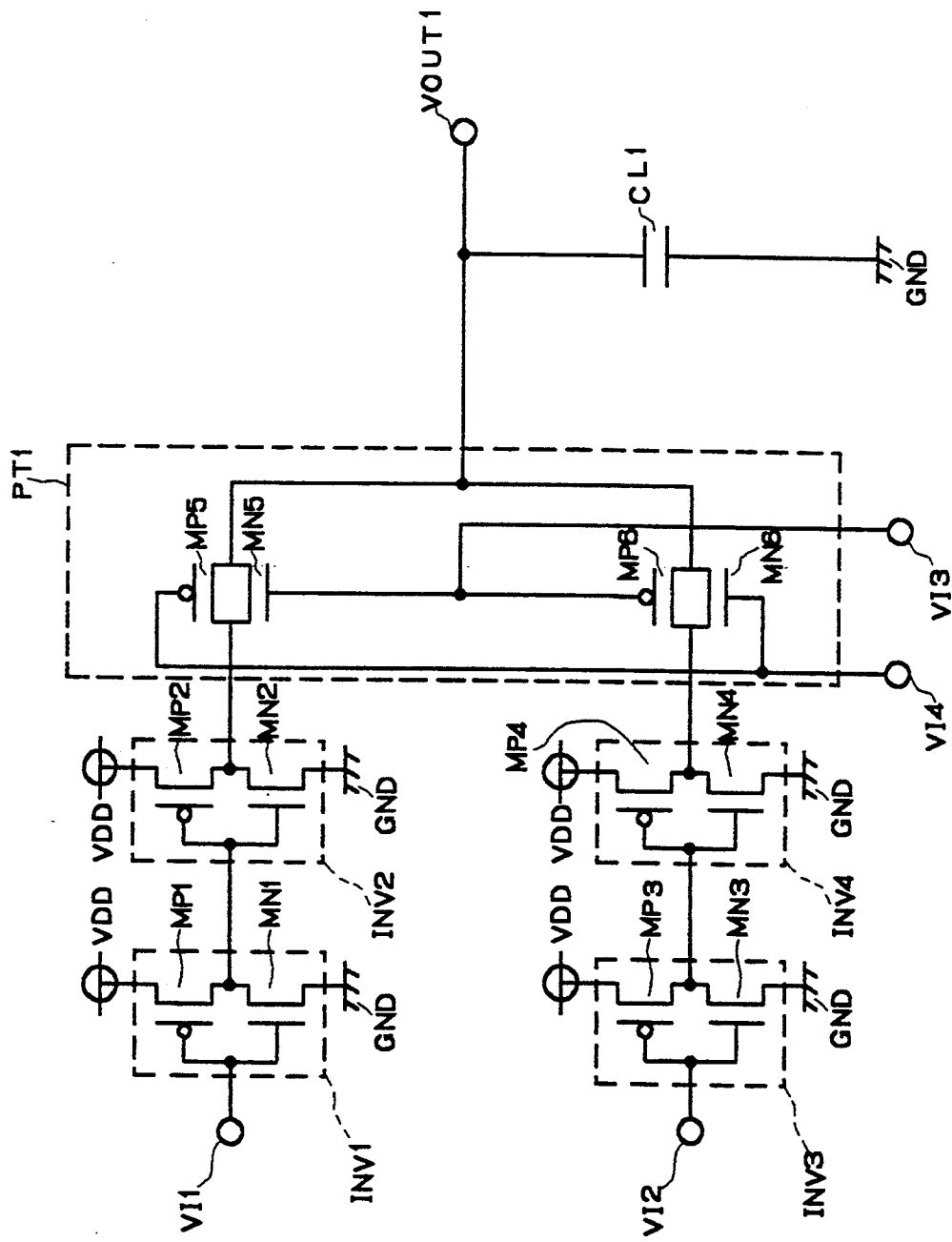
FIG. 31 is a circuit diagram of a conventional two-input selector circuit.

Referring to FIG. 30, the semiconductor integrated circuit according to a thirtieth preferred embodiment of the present invention will be described hereinafter. FIG. 30 is a circuit diagram of the exclusive-NOR circuit of the thirtieth preferred embodiment according to the present invention. In FIG. 30, MP18 designates a PMOS transistor; MN18 designates an NMOS transistor; and BP1 and BP2 designate PNP bipolar transistors. Elements of FIG. 30 identical with or corresponding to those of FIG. 29 are designated by the same reference characters. The PMOS transistor MP18 and the NMOS transistor MN18 form an inverter circuit INV8. The inverter circuit INV8 and the PNP bipolar transistors BP1 and BP2 form a drive circuit. As a high level signal is inputted to the base electrode of the PNP bipolar transistor BP2 and the input of the inverter circuit INV8 which are the input of the drive circuit, the base electrode of the PNP bipolar transistor BP1 enters the low level, so that the PNP bipolar transistor BP1 turns on. The load capacity CL1 is charged up to the power supply voltage (5.0 V) at high speeds. Thus the output terminal VOUT1 is at the high level. As a low level signal is inputted to the base electrode of the PNP bipolar transistor BP2 and the input of the inverter circuit INV8 which are the input of the drive circuit, the base voltage of the PNP bipolar transistor BP2 enters the low level, so that the PNP bipolar transistor BP2 turns on. The load capacity CL1 is discharged at high speeds to a level which is the sum of the base potential and the base-emitter voltage of the PNP bipolar transistor BP2. Thus the output terminal VOUT1 is at the low level. Other operations of the exclusive-NOR circuit of FIG. 30 are identical with those of the exclusive-NOR circuit of FIG. 29.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit comprising:
   at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;
   at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;
   said insulated gate transistors of said pass transistor circuit include MOS transistors;
   said input terminals of said pass transistor circuit include first and second input terminals;
   said at least one control terminal of said pass transistor circuit includes first and second control terminals;
   said insulated gate transistors of said pass transistor circuit include:
   a first PMOS transistor having a first electrode connected to said first input terminal, a control electrode connected to said first control terminal, and a second electrode connected directly to said control electrode of said bipolar transistor;
   a first NMOS transistor having a first electrode connected to said first input terminal, a control electrode connected to said second control terminal, and a second electrode connected directly to said control electrode of said bipolar transistor;
   a second NMOS transistor having a first electrode connected to said second input terminal, a control electrode connected to said first control terminal, and a second electrode connected directly to said control electrode of said bipolar transistor; and
   a second PMOS transistor having a first electrode connected to said second input terminal, a control electrode connected to said second control terminal, and a second electrode connected directly to said control electrode of said bipolar transistor.

2. A semiconductor integrated circuit comprising:
   at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;
   at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;
   said drive circuit further including:
   an NMOS transistor having a drain electrode connected to said output terminal, a source electrode connected to a second potential lower than said predetermined potential, and a gate electrode receiving the logically inverted signal of a signal outputted from said second electrodes of said insulated gate transistors;
   said bipolar transistor of said drive circuit includes:
   an NPN bipolar transistor having a collector electrode connected to said predetermined potential, a base electrode connected directly to said second electrodes of said insulated gate transistors, and an emitter electrode connected to said output terminal;
   a plurality of second input terminals corresponding to said plurality of input terminals of said pass transistor circuit for receiving the logically inverted signals of said input signals applied to said input terminals corresponding thereto; and
   a second pass transistor circuit including a second control terminal corresponding to said control terminal of said pass transistor circuit for receiving the same signal as said control signal applied to said control terminal corresponding thereto, and a plurality of insulated gate transistors each having a first electrode, a second electrode and a control electrode, said first electrodes of said plurality of insulated gate transistors being connected to the corresponding second input terminals, said control electrodes of said plurality of insulated gate transistors being connected to the corresponding second control terminal, said second electrodes of said plurality of insulated gate transistors being connected directly to said gate electrode of said NMOS transistor.

3. The semiconductor integrated circuit of claim 2, wherein said plurality of input terminals of said pass transistor circuit include:
   a positive input terminal receiving a first input signal; and
   a negative input terminal receiving the logically inverted signal of said first input signal.

4. A semiconductor integrated circuit comprising:
   at least one pass transistor circuit including a plurality of input terminals receiving different input signals, at least one control terminal receiving a control signal, and a plurality of insulated gate transistors each having a first electrode, a second electrode and a control electrode, and first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;
   at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;
   said drive circuit further including:
      an NMOS transistor having a drain electrode connected to said output terminal, a source electrode connected to a second potential lower than said predetermined potential, and a gate electrode receiving the logically inverted signal of a signal outputted from said second electrodes of said insulated gate transistors;
   said bipolar transistor of aid drive circuit includes:
      an NPN bipolar transistor having a collector electrode connected to said predetermined potential, a base electrode connected directly to said second electrodes of said insulated gate transistors, and an emitter electrode connected to said output terminal;
      an inverter having an input connected to said second electrodes of said insulated gate transistors of said pass transistor circuit in common, and an output connected to said gate electrode of said NMOS transistor.

5. The semiconductor integrated circuit of claim 4, wherein said plurality of input terminals of said pass transistor circuit include:
   a first input terminal receiving a first input signal; and
   a second input terminal receiving the logically inverted signal of said first input signal.

6. The semiconductor integrated circuit of claim 2, wherein said drive circuit further comprises:
   an insulated gate transistor having a first electrode connected to said predetermined potential and a second electrode connected to said control electrode of said bipolar transistor, said insulated gate transistor turning on as said bipolar transistor turns on to set said control electrode of said bipolar transistor to said predetermined potential.

7. The semiconductor integrated circuit of claim 2, wherein said drive circuit further comprises:
   an insulated gate transistor having a first electrode connected to said second potential and a second electrode connected to said control electrode of said bipolar transistor, said insulated gate transistor turning on as said bipolar transistor turns off to set said control electrode of said bipolar transistor to said second potential.

8. The semiconductor integrated circuit of claim 2, wherein said drive circuit further comprises:
   an insulated gate transistor having a first electrode connected to said control electrode of said bipolar transistor, a control electrode connected to said predetermined potential, and a second electrode connected to said second electrode of said bipolar transistor.

9. The semiconductor integrated circuit of claim 2, wherein said drive circuit further comprises:
   voltage drop means having a first end connected to said control electrode of said bipolar transistor and a second end connected to said second electrode of said bipolar transistor.

10. The semiconductor integrated circuit of claim 4, wherein said drive circuit further comprises:
    an insulated gate transistor having a first electrode connected to said predetermined potential and a second electrode connected to said control electrode of said bipolar transistor, said insulated gate transistor turning on as said bipolar transistor turns on to set said control electrode of said bipolar transistor to said predetermined potential.

11. The semiconductor integrated circuit of claim 4, wherein said drive circuit further comprises:
    an insulated gate transistor having a first electrode connected to said second potential and a second electrode connected to said control electrode of said bipolar transistor, said insulated gate transistor turning on as said bipolar transistor turns off to set said control electrode of said bipolar transistor to said second potential.

12. The semiconductor integrated circuit of claim 4, wherein said drive circuit further comprises:
    an insulated gate transistor having a first electrode connected to said control electrode of said bipolar transistor, a control electrode connected to said predetermined potential, and a second electrode connected to said second electrode of said bipolar transistor.

13. The semiconductor integrated circuit of claim 4, wherein said drive circuit further comprises:
    voltage drop means having a first end connected to said control electrode of said bipolar transistor and a second end connected to said second electrode of said bipolar transistor.

14. A semiconductor integrated circuit comprising:
    at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;

said drive circuit further including:
an NMOS transistor having a drain electrode connected to said output terminal, a source electrode connected to a second potential lower than said predetermined potential, and a gate electrode receiving the logically inverted signal of a signal outputted from said second electrodes of said insulated gate transistors;

said bipolar transistor of aid drive circuit includes:
an NPN bipolar transistor having a collector electrode connected to said predetermined potential, a base electrode connected directly to said second electrodes of said insulated gate transistors, and an emitter electrode connected to said output terminal;

wherein said at least one pass transistor circuit includes first and second pass transistor circuits;

said first pass transistor circuit including:
a first input terminal receiving a first input signal;
a second input terminal receiving a second input signal;
at least one first control terminal receiving said control signal;
a first insulated gate transistor having a first electrode connected to said first input terminal and a control electrode connected to the corresponding first control terminal;
a second insulated gate transistor having a first electrode connected to said second input terminal and a control electrode connected to the corresponding first control terminal;
said first pass transistor circuit being responsive to said control signal applied to said first control terminal for selectively outputting one of said first and second input signals inputted from said first and second input terminals;

said second pass transistor circuit including:
a third input terminal receiving the logically inverted signal of said first input signal;
a fourth input terminal receiving the logically inverted signal of said second input signal;
at least one second control terminal receiving said control signal;
a third insulated gate transistor having a first electrode connected to said third input terminal and a control electrode connected to the corresponding second control terminal;
a fourth insulated gate transistor having a first electrode connected to said fourth input terminal and a control electrode connected to the corresponding second control terminal;
said second pass transistor circuit being responsive to said control signal applied to said second control terminal for selectively outputting one of said signals inputted from said third and fourth input terminals;

wherein said at least one drive circuit includes first and second drive circuits;

said first drive circuit including:
a first output terminal for outputting a signal responsive to the output signal of said first pass transistor circuit;
a first bipolar transistor having a control electrode connected directly to second electrodes of said first and second insulated gate transistors, a first electrode connected to said predetermined potential, and a second electrode connected to said first output terminal;
a first NMOS transistor having a drain electrode connected to said first output terminal, a source electrode connected to said second potential, and a gate electrode connected to second electrodes of said third and fourth insulated gate transistors;

said second drive circuit comprising:
a second output terminal for outputting a signal responsive to the output signal of said second pass transistor circuit;
a second bipolar transistor having a control electrode connected directly to said second electrodes of said third and fourth insulated gate transistors, a first electrode connected to said predetermined potential, and a second electrode connected to said second output terminal; and
a second NMOS transistor having a drain electrode connected to said second output terminal, a source electrode connected to said second potential, and a gate electrode connected to second electrodes of said first and second insulated gate transistors.

15. The semiconductor integrated circuit of claim 14, wherein said drive circuit further comprises:
a fifth insulated gate transistor having a first electrode connected to said predetermined potential and a second electrode connected to said control electrode of said first bipolar transistor, said fifth insulated gate transistor turning on as said first bipolar transistor turns on to set said control electrode of said first bipolar transistor to said predetermined potential; and
a sixth insulated gate transistor having a first electrode connected to said predetermined potential and a second electrode connected to said control electrode of said second bipolar transistor, said sixth insulated gate transistor turning on as said second bipolar transistor turns on to set said control electrode of said second bipolar transistor to said predetermined potential.

16. The semiconductor integrated circuit of claim 14, wherein said drive circuit further comprises:
a fifth insulated gate transistor having a first electrode connected to said second potential and a second electrode connected to said control electrode of said first bipolar transistor, said fifth insulated gate transistor turning on as said first bipolar transistor turns off to set said control electrode of said first bipolar transistor to said second potential; and
a sixth insulated gate transistor having a first electrode connected to said second potential and a second electrode connected to said control electrode of said second bipolar transistor, said sixth insulated gate transistor turning on as said second bipolar transistor turns off to set said control electrode of said second bipolar transistor to said second potential.

17. The semiconductor integrated circuit of claim 14, wherein said drive circuit further comprises:
   a fifth insulated gate transistor having a first electrode connected to said control electrode of said first bipolar transistor, a control electrode connected to said predetermined potential, and a second electrode connected to said second electrode of said first bipolar transistor; and
   a sixth insulated gate transistor having a first electrode connected to said control electrode of said second bipolar transistor, a control electrode connected to said predetermined potential, and a second electrode connected to said second electrode of said second bipolar transistor.

18. The semiconductor integrated circuit of claim 14, wherein said drive circuit further comprises:
   first voltage drop means having a first end connected to said control electrode of said first bipolar transistor and a second end connected to said second electrode of said first bipolar transistor; and
   second voltage drop means having a first end connected to said control electrode of said second bipolar transistor and a second end connected to said second electrode of said second bipolar transistor.

19. A semiconductor integrated circuit comprising:
   at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;
   at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;
   said predetermined potential includes a first potential and a second potential lower than said first potential;
   said at least one bipolar transistor includes a plurality of bipolar transistors; and
   said plurality of bipolar transistors include at least one NPN bipolar transistor having a collector electrode connected to said first potential, a base electrode connected to said second electrodes of said plurality of insulated gate transistors, and an emitter electrode connected to said output terminal, and at least one PNP bipolar transistor having a collector electrode connected to said second potential, a base electrode connected to said second electrodes of said plurality of insulated gate transistors, and an emitter electrode connected to said output terminal.

20. The semiconductor integrated circuit of claim 19 wherein said at least one pass transistor circuit includes first and second pass transistor circuits, said first pass transistor circuit comprising:
   a first input terminal receiving a first input signal;
   a second input terminal receiving a second input signal;
   at least one first control terminal receiving said control signal;
   a first insulated gate transistor having a first electrode connected to said first input terminal and a control electrode connected to the corresponding first control terminal; and
   a second insulated gate transistor having a first electrode connected to said second input terminal and a control electrode connected to the corresponding first control terminal,
   said first pass transistor circuit being responsive to said control signal applied to said first control terminal for selectively outputting one of said first and second input signals inputted from said first and second input terminals,
   said second pass transistor circuit comprising:
   a third input terminal receiving the logically inverted signal of said first input signal;
   a fourth input terminal receiving the logically inverted signal of said second input signal;
   at least one second control terminal receiving said control signal;
   a third insulated gate transistor having a first electrode connected to said third input terminal and a control electrode connected to the corresponding second control terminal; and
   a fourth insulated gate transistor having a first electrode connected to said fourth input terminal and a control electrode connected to the corresponding second control terminal,
   said second pass transistor circuit being responsive to said control signal applied to said second control terminal for selectively outputting one of said signals inputted from said third and fourth input terminals, and
   wherein said at least one drive circuit includes first and second drive circuits,
   said first drive circuit comprising:
   a first output terminal for outputting a signal responsive to the output signal of said first pass transistor circuit;
   at least one first NPN bipolar transistor having a collector electrode connected to said first potential, a base electrode connected directly to second electrodes of said first and second insulated gate transistors, and an emitter electrode connected to said first output terminal; and
   at least one first PNP bipolar transistor having a collector electrode connected to said second potential, a base electrode connected directly to said second electrodes of said first and second insulated gate transistors, and an emitter electrode connected to said first output terminal,
   said second drive circuit comprising:
   a second output terminal for outputting a signal responsive to the output signal of said second pass transistor circuit;
   at least one second NPN bipolar transistor having a collector electrode connected to said first potential, a base electrode connected directly to second electrodes of said third and fourth insulated gate transistors, and an emitter electrode connected to said second output terminal, and at least one second PNP bipolar transistor having a collector electrode connected to said second potential, a base electrode connected directly to said second electrodes of said third and fourth insulated gate transistors, and an emitter electrode connected to said second output terminal.

21. The semiconductor integrated circuit of claim 20, wherein said drive circuit further comprises:

a fifth insulated gate transistor having a first electrode connected to said first potential and a second electrode connected to said base electrode of said first NPN bipolar transistor, said fifth insulated gate transistor turning on as said first NPN bipolar transistor turns on to set said base electrode of said first NPN bipolar transistor to said first potential; and a sixth insulated gate transistor having a first electrode connected to said first potential and a second electrode connected to said base electrode of said second NPN bipolar transistor, said sixth insulated gate transistor turning on as said second NPN bipolar transistor turns on to set said base electrode of said second NPN bipolar transistor to said first potential.

22. The semiconductor integrated circuit of claim 20, wherein said drive circuit further comprises:

a fifth insulated gate transistor having a first electrode connected to said second potential and a second electrode connected to said base electrode of said first NPN bipolar transistor, said fifth insulated gate transistor turning on as said first NPN bipolar transistor turns off to set said base electrode of said first NPN bipolar transistor to said second potential; and a sixth insulated gate transistor having a first electrode connected to said second potential and a second electrode connected to said base electrode of said second NPN bipolar transistor, said sixth insulated gate transistor turning on as said second NPN bipolar transistor turns off to set said base electrode of said second NPN bipolar transistor to said second potential.

23. The semiconductor integrated circuit of claim 20, wherein said drive circuit further comprises:

a fifth insulated gate transistor having a first electrode connected to said base electrode of said first NPN bipolar transistor, a control electrode connected to said first potential, and a second electrode connected to said emitter electrode of said first NPN bipolar transistor; and a sixth insulated gate transistor having a first electrode connected to said base electrode of said second NPN bipolar transistor, a control electrode connected to said first potential, and a second electrode connected to said emitter electrode of said second NPN bipolar transistor.

24. The semiconductor integrated circuit of claim 20, wherein said drive circuit further comprises:

first voltage drop means having a first end connected to said base electrode of said first NPN bipolar transistor and a second end connected to said emitter electrode of said first NPN bipolar transistor; and second voltage drop means having a first end connected to said base electrode of said second NPN bipolar transistor and a second end connected to said emitter electrode of said second NPN bipolar transistor.

25. A semiconductor integrated circuit comprising:

at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;

said drive circuit further includes:

an inverter having an input connected to said second electrodes of said insulated gate transistors; and another bipolar transistor of same conductivity type as said bipolar transistor having a control electrode connected to an output of said inverter, a first electrode connected to said output terminal, and a second electrode connected to a second potential different from said predetermined potential.

26. The semiconductor integrated circuit of claim 25, further comprising:

a plurality of second input terminals corresponding to said plurality of input terminals of said pass transistor circuit for receiving the logically inverted signals of said input signals applied to said input terminals corresponding thereto; and a second pass transistor circuit including a control terminal corresponding to said control terminal of said pass transistor circuit for receiving the same signal as said control signal applied to said control terminal corresponding thereto, and a plurality of insulated gate transistors each having a first electrode, a second electrode and a control electrode, said first electrodes of said plurality of insulated gate transistors being connected to the corresponding second input terminals, said control electrodes of said plurality of insulated gate transistors being connected to the corresponding control terminal, said second electrodes of said plurality of insulated gate transistors being connected directly to said base electrode of said another bipolar transistor.

27. The semiconductor integrated circuit of claim 26, wherein said plurality of input terminals of said pass transistor circuit include:

a first input terminal receiving a first input signal; and a second input terminal receiving the logically inverted signal of said first input signal.

28. The semiconductor integrated circuit of claim 25, further comprising:
an inverter having an input connected to said second electrodes of said plurality of insulated gate transistors of said pass transistor circuit in common and an output connected to said gate electrode of said another bipolar transistor.

29. The semiconductor integrated circuit of claim 28, wherein said plurality of input terminals of said pass transistor circuit include:
a first input terminal receiving a first input signal; and
a second input terminal receiving the logically inverted signal of said first input signal.

30. The semiconductor integrated circuit of claim 25, wherein said at least one pass transistor circuit includes first and second pass transistor circuits, said first pass transistor circuit comprising:
a first input terminal receiving a first input signal;
a second input terminal receiving a second input signal;
at least one first control terminal receiving said control signal;
a first insulated gate transistor having a first electrode connected to said first input terminal and a control electrode connected to the corresponding first control terminal; and
a second insulated gate transistor having a first electrode connected to said second input terminal and a control electrode connected to the corresponding first control terminal,
said first pass transistor circuit being responsive to said control signal applied to said control terminal for selectively outputting one of said first and second input signals inputted from said first and second input terminals,
said second pass transistor circuit comprising:
a third input terminal receiving the logically inverted signal of said first input signal;
a fourth input terminal receiving the logically inverted signal of said second input signal;
at least one second control terminal receiving said control signal;
a third insulated gate transistor having a first electrode connected to said third input terminal and a control electrode connected to the corresponding second control terminal; and
a fourth insulated gate transistor having a first electrode connected to said fourth input terminal and a control electrode connected to the corresponding second control terminal,
said second pass transistor circuit being responsive to said control signal applied to said control terminal for selectively outputting one of said signals inputted from said third and fourth input terminals, and
wherein said at least one drive circuit includes first and second drive circuits,
said first drive circuit comprising:
a first output terminal for outputting a signal responsive to the output signal of said first pass transistor circuit;
a first bipolar transistor having a control electrode connected directly to second electrodes of said first and second insulated gate transistors, a first electrode connected to said predetermined potential, and a second electrode connected to said first output terminal;
a first inverter having an input connected to said second electrodes of said first and second insulated gate transistors; and
a second bipolar transistor of the same conductivity type as said first bipolar transistor having a control electrode connected to an output of said first inverter, a first electrode connected to said first output terminal, and a second electrode connected to said second potential,
said second drive circuit comprising:
a second output terminal for outputting a signal responsive to the output signal of said second pass transistor circuit;
a third bipolar transistor having a control electrode connected directly to said second electrodes of said third and fourth insulated gate transistors, a first electrode connected to said predetermined potential, and a second electrode connected to said second output terminal;
a second inverter having an input connected to said second electrodes of said first and second insulated gate transistors; and
a fourth bipolar transistor of the same conductivity type as said second bipolar transistor having a control electrode connected to an output of said second inverter, a first electrode connected to said second output terminal, and a second electrode connected to said second potential.

31. The semiconductor integrated circuit of claim 26, wherein said drive circuit further comprises:
an insulated gate transistor having a first electrode connected to said predetermined potential and a second electrode connected to said control electrode of said bipolar transistor, said insulated gate transistor turning on as said bipolar transistor turns on to set said control electrode of said bipolar transistor to said predetermined potential.

32. The semiconductor integrated circuit of claim 26, wherein said drive circuit further comprises:
an insulated gate transistor having a first electrode connected to said second potential and a second electrode connected to said control electrode of said bipolar transistor, said insulated gate transistor turning on as said bipolar transistor turns off to set said control electrode of said bipolar transistor to said second potential.

33. The semiconductor integrated circuit of claim 26, wherein said drive circuit further comprises:
an insulated gate transistor having a first electrode connected to said control electrode of said bipolar transistor, a control electrode connected to said predetermined potential, and a second electrode connected to said second electrode of said bipolar transistor.

34. The semiconductor integrated circuit of claim 26, wherein said drive circuit further comprises:
voltage drop means having a first end connected to said control electrode of said bipolar transistor and a second end connected to said second electrode of said bipolar transistor.

35. The semiconductor integrated circuit of claim 28, wherein said drive circuit further comprises:
an insulated gate transistor having a first electrode connected to said predetermined potential and a second electrode connected to said control electrode of said bipolar transistor, said insulated gate transistor turning on as said bipolar transistor turns on to set said control electrode of said bipolar transistor to said predetermined potential.

36. The semiconductor integrated circuit of claim 28, wherein said drive circuit further comprises:
an insulated gate transistor having a first electrode connected to said second potential and a second electrode connected to said control electrode of said bipolar transistor, said insulated gate transistor turning on as said bipolar transistor turns off to set said control electrode of said bipolar transistor to said second potential.

37. The semiconductor integrated circuit of claim 28, wherein said drive circuit further comprises:
an insulated gate transistor having a first electrode connected to said control electrode of said bipolar transistor, a control electrode connected to said predetermined potential, and a second electrode connected to said second electrode of said bipolar transistor.

38. The semiconductor integrated circuit of claim 28, wherein said drive circuit further comprises:
voltage drop means having a first end connected to said control electrode of said bipolar transistor and a second end connected to said second electrode of said bipolar transistor.

39. The semiconductor integrated circuit of claim 30, wherein said drive circuit further comprises:
a fifth insulated gate transistor having a first electrode connected to said predetermined potential and a second electrode connected to said control electrode of said first bipolar transistor, said fifth insulated gate transistor turning on as said first bipolar transistor turns on to set said control electrode of said first bipolar transistor to said predetermined potential; and
a sixth insulated gate transistor having a first electrode connected to said predetermined potential and a second electrode connected to said control electrode of said third bipolar transistor, said sixth insulated gate transistor turning on as said third bipolar transistor turns on to set said control electrode of said third bipolar transistor to said predetermined potential.

40. The semiconductor integrated circuit of claim 30, wherein said drive circuit further comprises:
a fifth insulated gate transistor having a first electrode connected to said second potential and a second electrode connected to said control electrode of said first bipolar transistor, said fifth insulated gate transistor turning on as said first bipolar transistor turns off to set said control electrode of said first bipolar transistor to said second potential; and
a sixth insulated gate transistor having a first electrode connected to said second potential and a second electrode connected to said control electrode of said third bipolar transistor, said sixth insulated gate transistor turning on as said third bipolar transistor turns off to set said control electrode of said third bipolar transistor to said second potential.

41. The semiconductor integrated circuit of claim 30, wherein said drive circuit further comprises:
a fifth insulated gate transistor having a first electrode connected to said control electrode of said first bipolar transistor, a control electrode connected to said predetermined potential, and a second electrode connected to said second electrode of said first bipolar transistor; and
a sixth insulated gate transistor having a first electrode connected to said control electrode of said second bipolar transistor, a control electrode connected to said predetermined potential, and a second electrode connected to said second electrode of said second bipolar transistor.

42. The semiconductor integrated circuit of claim 30, wherein said drive circuit further comprises:
first voltage drop means having a first end connected to said control electrode of said first bipolar transistor and a second end connected to said second electrode of said first bipolar transistor; and
second voltage drop means having a first end connected to said control electrode of said third bipolar transistor and a second end connected to said second electrode of said third bipolar transistor.

43. A semiconductor integrated circuit comprising:
at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;
at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal; and
a second drive circuit including a second output terminal, and a bipolar transistor having a control electrode receiving a signal logically different from the output signal of said pass transistor circuit, a first electrode connected to said predetermined potential, and a second electrode connected to said second output terminal, said second drive circuit being responsive to the inputted signal for outputting an output signal logically different from the output signal of said drive circuit.

44. A semiconductor integrated circuit comprising:
at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal; and said drive circuit further includes:
  a second insulated gate transistor having a first electrode connected to said predetermined potential and a second electrode connected to said control electrode of said bipolar transistor, said second insulated gate transistor turning on as said bipolar transistor turns on to set said control electrode of said bipolar transistor to said predetermined potential.

45. The semiconductor integrated circuit of claim 44, wherein said drive circuit further comprises:
  an NMOS transistor having a drain electrode connected to said output terminal, a source electrode connected to a second potential lower than said predetermined potential, and a gate electrode receiving the logically inverted signal of a signal outputted from said second electrodes of said insulated gate transistors, and
  said bipolar transistor of said drive circuit includes:
    an NPN bipolar transistor having a collector electrode connected to said predetermined potential, a base electrode connected directly to said second electrodes of said insulated gate transistors, and an emitter electrode connected to said output terminal.

46. The semiconductor integrated circuit of claim 44, wherein
  said at least one bipolar transistor includes a plurality of bipolar transistors, and
  said plurality of bipolar transistors include at least one NPN bipolar transistor having a collector electrode connected to said predetermined potential, a base electrode connected to said second electrodes of said insulated gate transistors, and an emitter electrode connected to said output terminal, and at least one PNP bipolar transistor having a collector electrode connected to a second potential lower than said predetermined potential, a base electrode connected to said second electrodes of said insulated gate transistors, and an emitter electrode connected to said output terminal.

47. The semiconductor integrated circuit of claim 44, wherein said drive circuit further comprises:
  an inverter having an input connected to said second electrodes of said insulated gate transistors; and
  a second bipolar transistor of the same conductivity type as said bipolar transistor having a control electrode connected to an output of said inverter, a first electrode connected to said output terminal, and a second electrode connected to a second potential different from said predetermined potential.

48. A semiconductor integrated circuit comprising:
  at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal; and said drive circuit further includes:
  a second insulated gate transistor having a first electrode connected to a second potential different from said predetermined potential and a second electrode connected to said control electrode of said bipolar transistor, said second insulated gate transistor turning on as said bipolar transistor turns off to set said control electrode of said bipolar transistor to said second potential.

49. The semiconductor integrated circuit of claim 48, wherein said drive circuit further comprises:
  an NMOS transistor having a drain electrode connected to said output terminal, a source electrode connected to said second potential, and a gate electrode receiving the logically inverted signal of a signal outputted from said second electrodes of said insulated gate transistors, and
  said bipolar transistor of said drive circuit includes:
    an NPN bipolar transistor having a collector electrode connected to said predetermined potential, a base electrode connected directly to said second electrodes of said insulated gate transistors, and an emitter electrode connected to said output terminal.

50. The semiconductor integrated circuit of claim 48, wherein
  said at least one bipolar transistor includes a plurality of bipolar transistors, and
  said plurality of bipolar transistors include at least one NPN bipolar transistor having a collector electrode connected to said predetermined potential, a base electrode connected to said second electrodes of said insulated gate transistors, and an emitter electrode connected to said output terminal, and at least one PNP bipolar transistor having a collector electrode connected to said second potential, a base electrode connected to said second electrodes of said insulated gate transistors, and an emitter electrode connected to said output terminal.

51. The semiconductor integrated circuit of claim 48, wherein said drive circuit further comprises:
  an inverter having an input connected to said second electrodes of said insulated gate transistors; and
  a second bipolar transistor of the same conductivity type as said bipolar transistor having a control electrode connected to an output of said inverter, a first electrode connected to said output terminal, and a second electrode connected to said second potential.

52. A semiconductor integrated circuit comprising:

at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal; and said drive circuit further includes:
 a second insulated gate transistor having a first electrode connected to said control electrode of said bipolar transistor, a control electrode connected to said predetermined potential, and a second electrode connected to said second electrode of said bipolar transistor.

53. The semiconductor integrated circuit of claim 52, wherein said drive circuit further comprises:
an NMOS transistor having a drain electrode connected to said output terminal, a source electrode connected to a second potential lower than said predetermined potential, and a base electrode receiving the logically inverted signal of a signal outputted from said second electrodes of said insulated gate transistors, and said bipolar transistor of said drive circuit includes:
an NPN bipolar transistor having a collector electrode connected to said predetermined potential, a base electrode connected directly to said second electrodes of said insulated gate transistors, and an emitter electrode connected to said output terminal.

54. The semiconductor integrated circuit of claim 52, wherein
said at least one bipolar transistor includes a plurality of bipolar transistors, and
said plurality of bipolar transistors include at least one NPN bipolar transistor having a collector electrode connected to said first potential, a base electrode connected to said second electrodes of said insulated gate transistors, and an emitter electrode connected to said output terminal, and at least one PNP bipolar transistor having a collector electrode connected to a second potential lower than said predetermined potential, a base electrode connected to said second electrodes of said insulated gate transistors, and an emitter electrode connected to said output terminal.

55. The semiconductor integrated circuit of claim 52, wherein said drive circuit further comprises:
an inverter having an input connected to said second electrodes of said insulated gate transistors; and a second bipolar transistor of the same conductivity type as said bipolar transistor having a control electrode connected to an output of said inverter, a first electrode connected to said output terminal, and a second electrode connected to a second potential different from said predetermined potential.

56. A semiconductor integrated circuit comprising:
at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminal;

said drive circuit further including:
voltage drop means having a first end connected to said control electrode of said bipolar transistor and a second end connected to said second electrode of said bipolar transistor;
said at least one bipolar transistor includes a plurality of bipolar transistors; and
said plurality of bipolar transistors include at least one NPN bipolar transistor having a collector electrode connected to said predetermined potential, a base electrode connected to said second electrodes of said insulated gate transistors, and an emitter electrode connected to said output terminal, and at least one PNP bipolar transistor having a collector electrode connected to a second potential lower than said predetermined potential, a base electrode connected to said second electrodes of said insulated gate transistors, and an emitter electrode connected to said output terminal.

57. A semiconductor integrated circuit comprising:
at least one pass transistor circuit including a plurality of input terminals receiving different input signals, at least one control terminal receiving a control signal, and a plurality of insulated gate transistors each having a first electrode, a second electrode and a control electrode, said first electrodes of said plurality of insulated gate transistors being connected to the corresponding input terminals, said control electrodes of said plurality of insulated gate transistors being connected to the corresponding control terminal, said pass transistor circuit being responsive to said control signal applied to said control terminal for selectively outputting one of said input signals given from said plurality of input terminals;

at least one drive circuit including an output terminal for outputting an output signal in response to the output of said pass transistor circuit, and at least one bipolar transistor having a control electrode connected directly to all said second electrodes of said plurality of insulated gate transistors, a first electrode connected to a predetermined potential, and a second electrode connected to said output terminals;

said drive circuit further including:

voltage drop means having a first end connected to said control electrode of said bipolar transistor and a second end connected to said second electrode of said bipolar transistor;

said drive circuit further includes:

an inverter having an input connected to said second electrodes of said insulated gate transistors; and a second bipolar transistor of the same conductivity type as said bipolar transistor having a control electrode connected to an output of said inverter, a first electrode connected to said output terminal, and a second electrode connected to a second potential different from said predetermined potential.

* * * * *